(12) United States Patent
Miskin et al.

(10) Patent No.: US 10,499,466 B1
(45) Date of Patent: Dec. 3, 2019

(54) AC LIGHT EMITTING DIODE AND AC LED DRIVE METHODS AND APPARATUS

(71) Applicant: Lynk Labs, Inc., Elgin, IL (US)

(72) Inventors: Michael Miskin, Sleepy Hollow, IL (US); James N. Andersen, Elmwood Park, IL (US); Robert L. Kottritsch, Shefford (GB)

(73) Assignee: Lynk Labs, Inc., Elgin, IL (US)

( * ) Notice: Subject to any disclaimer, the term of this patent is extended or adjusted under 35 U.S.C. 154(b) by 0 days.

(21) Appl. No.: 16/523,542

(22) Filed: Jul. 26, 2019

Related U.S. Application Data

(60) Continuation of application No. 16/523,388, filed on Jul. 26, 2019, which is a continuation of application No. 16/449,273, filed on Jun. 21, 2019, which is a continuation of application No. 16/443,759, filed on Jun. 17, 2019, which is a continuation of application No. 16/407,076, filed on May 8, 2019, which is a continuation of application No. 16/148,945, filed on Oct. 1, 2018, which is a continuation of application No. 15/334,029, filed on Oct. 25, 2016, now Pat. No. 10,091,842, which is a continuation-in-part of application No. 14/948,635, filed on Nov. 23, 2015, now Pat. No. 9,615,420, which is a division of application No. 13/697,646, said application No. PCT/US2011/036359 is a continuation of application (Continued)

(51) Int. Cl.
*H05B 33/00* (2006.01)
*H05B 33/08* (2006.01)

(52) U.S. Cl.
CPC ....... *H05B 33/0809* (2013.01); *H05B 33/089* (2013.01); *H05B 33/0821* (2013.01); *H05B 33/0845* (2013.01); *H05B 33/0815* (2013.01)

(58) Field of Classification Search
CPC .......... H01Q 1/243; H01Q 1/36; H01Q 5/371; H01Q 5/40; H01Q 9/0407; H01Q 9/0421; H01Q 3/08; G06K 7/10079
See application file for complete search history.

(56) References Cited

U.S. PATENT DOCUMENTS 3,869,641 A 3/1975 Goldberg
4,218,627 A 8/1980 Kiesel
(Continued)

FOREIGN PATENT DOCUMENTS

EP 1 215 944 6/2002
JP 08-137429 5/1996
(Continued)

OTHER PUBLICATIONS

Office Action, U.S. Appl. No. 16/460,790, dated Aug. 5, 2019, 17 pages.

(Continued)

*Primary Examiner* — Monica C King
(74) *Attorney, Agent, or Firm* — Haynes and Boone, LLP

(57) ABSTRACT

An LED device for use with an AC voltage power source configured such that at least one LED emits light during a positive phase of power provided from an AC power supply and at least one LED emits light during the negative phase of power provided from an AC power supply. The LED device includes a first power connection lead and a second power connection lead, both leads capable of being connected to and receiving power from an AC power supply.

16 Claims, 52 Drawing Sheets

Related U.S. Application Data

No. 12/287,267, filed on Oct. 6, 2008, now Pat. No. 8,179,055, and a continuation-in-part of application No. 12/364,890, filed on Feb. 3, 2009, now Pat. No. 8,148,905, which is a continuation of application No. 11/066,414, filed on Feb. 25, 2005, now Pat. No. 7,489,086, and a continuation of application No. PCT/US2010/001597, filed on May 28, 2010, which is a continuation-in-part of application No. 12/287,267, filed on Oct. 6, 2008, said application No. PCT/US2010/062235 is a continuation-in-part of application No. PCT/US2010/001269, filed on Apr. 30, 2010, which is a continuation-in-part of application No. 12/287,267, filed on Oct. 6, 2008.

(60) Provisional application No. 61/333,963, filed on May 12, 2010, provisional application No. 61/284,927, filed on Dec. 28, 2009, provisional application No. 61/335,069, filed on Dec. 31, 2009, provisional application No. 60/997,771, filed on Oct. 6, 2007, provisional application No. 60/547,653, filed on Feb. 25, 2004, provisional application No. 60/559,867, filed on Apr. 6, 2004, provisional application No. 61/217,215, filed on May 28, 2009, provisional application No. 61/215,144, filed on May 1, 2009.

(56) References Cited

U.S. PATENT DOCUMENTS

| | | |
|---|---|---|
| 4,271,408 A | 6/1981 | Teshima et al. |
| 4,298,869 A | 11/1981 | Okuno |
| 4,380,721 A | 4/1983 | Bullock et al. |
| 4,506,318 A | 3/1985 | Nilssen |
| 4,535,203 A | 8/1985 | Jenkins et al. |
| 4,751,398 A | 6/1988 | Ertz, III |
| 5,180,952 A | 1/1993 | Nilssen |
| 5,309,062 A | 5/1994 | Perkins et al. |
| 5,442,258 A | 8/1995 | Shibata |
| 5,559,681 A | 9/1996 | Duarte |
| 5,575,459 A | 11/1996 | Anderson |
| 5,640,061 A | 6/1997 | Bornhorst et al. |
| 5,675,485 A | 10/1997 | Seong |
| 5,699,218 A | 12/1997 | Kadah |
| 5,739,639 A | 4/1998 | Johnson |
| 5,790,013 A | 8/1998 | Hauck |
| 5,821,699 A | 10/1998 | Moisin |
| 6,040,663 A | 3/2000 | Bucks et al. |
| 6,107,744 A | 8/2000 | Bavaro et al. |
| 6,113,248 A | 9/2000 | Mistopoulos et al. |
| 6,157,551 A | 12/2000 | Barak et al. |
| 6,183,104 B1 | 2/2001 | Ferrara |
| 6,380,693 B1 | 4/2002 | Kastl |
| 6,412,971 B1 | 7/2002 | Wojnarowski et al. |
| 6,430,064 B1 | 8/2002 | Tsuchimoto et al. |
| 6,541,919 B1 | 4/2003 | Roach et al. |
| 6,577,072 B2 | 6/2003 | Saito et al. |
| 6,580,228 B1 | 6/2003 | Chen et al. |
| 6,614,103 B1 | 9/2003 | Durocher et al. |
| 6,697,130 B2 | 2/2004 | Weindorf et al. |
| 6,762,562 B2 | 7/2004 | Leong |
| 6,781,570 B1 | 8/2004 | Arrigo et al. |
| 6,936,968 B2 | 8/2005 | Cross et al. |
| 6,949,772 B2 | 9/2005 | Shimizu et al. |
| 6,961,190 B1 | 11/2005 | Tamaoki et al. |
| 7,019,662 B2 | 3/2006 | Shackle |
| 7,038,400 B2 | 5/2006 | Rimmer et al. |
| 7,053,560 B1 | 5/2006 | Ng |
| 7,061,188 B1 | 6/2006 | Katyl et al. |
| 7,067,992 B2 | 6/2006 | Leong et al. |
| 7,144,131 B2 | 12/2006 | Rains |
| 7,204,607 B2 | 4/2007 | Yano et al. |
| 7,288,902 B1 | 10/2007 | Melanson |
| 7,350,936 B2 | 4/2008 | Ducharme et al. |
| 7,365,718 B2 | 4/2008 | Tsuchida et al. |
| 7,489,086 B2 | 2/2009 | Miskin et al. |
| 7,521,872 B2 | 4/2009 | Bruning |
| 7,646,029 B2 | 1/2010 | Mueller et al. |
| 7,808,189 B2 | 10/2010 | Hollnberger et al. |
| 7,859,196 B2 | 12/2010 | Lee et al. |
| 7,936,132 B2 | 5/2011 | Quek et al. |
| 8,033,686 B2 | 10/2011 | Recker et al. |
| 8,148,905 B2 | 4/2012 | Miskin et al. |
| 8,179,055 B2 | 5/2012 | Miskin et al. |
| 8,237,581 B2 | 8/2012 | Ries, II |
| 8,531,118 B2 | 9/2013 | Miskin et al. |
| 8,613,997 B2 | 12/2013 | Day |
| 8,648,539 B2 | 2/2014 | Miskin et al. |
| 8,841,855 B2 | 9/2014 | Miskin |
| 9,198,237 B2 | 11/2015 | Miskin et al. |
| 9,247,597 B2 | 1/2016 | Miskin et al. |
| 9,249,953 B2 | 2/2016 | Miskin |
| 9,516,716 B2 | 12/2016 | Miskin et al. |
| 9,615,420 B2 | 4/2017 | Miskin |
| 9,693,405 B2 | 6/2017 | Miskin |
| 9,750,098 B2 | 8/2017 | Miskin et al. |
| 9,807,827 B2 | 10/2017 | Miskin et al. |
| 2002/0030455 A1 | 3/2002 | Ghanem |
| 2002/0047646 A1 | 4/2002 | Lys et al. |
| 2002/0060526 A1 | 5/2002 | Timmermans et al. |
| 2002/0113246 A1 | 8/2002 | Nagai et al. |
| 2002/0114155 A1 | 8/2002 | Katogi et al. |
| 2003/0001657 A1 | 1/2003 | Worley, Sr. et al. |
| 2003/0043611 A1 | 3/2003 | Bockle et al. |
| 2003/0057886 A1 | 3/2003 | Lys et al. |
| 2003/0122502 A1 | 7/2003 | Clauberg et al. |
| 2003/0169014 A1 | 9/2003 | Kadah |
| 2003/0175004 A1 | 9/2003 | Garito et al. |
| 2003/0179585 A1 | 9/2003 | Lefebvre |
| 2004/0070520 A1 | 4/2004 | Sharp et al. |
| 2004/0079953 A1 | 4/2004 | Mednik et al. |
| 2004/0080941 A1 | 4/2004 | Jiang et al. |
| 2004/0105264 A1 | 6/2004 | Spero |
| 2004/0140771 A1 | 7/2004 | Kim et al. |
| 2004/0183380 A1 | 9/2004 | Otake |
| 2004/0189218 A1 | 9/2004 | Leong et al. |
| 2004/0196636 A1 | 10/2004 | Kim |
| 2004/0201988 A1 | 10/2004 | Allen |
| 2004/0206970 A1 | 10/2004 | Martin |
| 2005/0040773 A1 | 2/2005 | Lebens et al. |
| 2005/0110426 A1 | 5/2005 | Shao |
| 2005/0122062 A1 | 6/2005 | Hsu |
| 2005/0151511 A1 | 7/2005 | Chary |
| 2005/0162096 A1 | 7/2005 | Bertrand |
| 2005/0168156 A1 | 8/2005 | Li et al. |
| 2005/0173990 A1 | 8/2005 | Anderson et al. |
| 2005/0218838 A1 | 10/2005 | Lys |
| 2005/0230600 A1 | 10/2005 | Olson et al. |
| 2006/0038542 A1 | 2/2006 | Park et al. |
| 2006/0087843 A1 | 4/2006 | Setomoto et al. |
| 2006/0103913 A1 | 5/2006 | Handschy et al. |
| 2006/0138971 A1 | 6/2006 | Uang et al. |
| 2006/0158130 A1 | 7/2006 | Furukawa |
| 2007/0069663 A1 | 3/2007 | Burdalski et al. |
| 2007/0228999 A1 | 10/2007 | Kit |
| 2007/0273299 A1 | 11/2007 | Miskin et al. |
| 2008/0116816 A1 | 5/2008 | Neuman et al. |
| 2008/0136347 A1 | 6/2008 | Lin et al. |
| 2008/0158915 A1 | 7/2008 | Williams |
| 2008/0198613 A1 | 8/2008 | Cruickshank |
| 2008/0203405 A1 | 8/2008 | Rooymans |
| 2008/0203936 A1 | 8/2008 | Mariyama et al. |
| 2008/0211421 A1 | 9/2008 | Lee et al. |
| 2008/0218098 A1 | 9/2008 | Lee et al. |
| 2009/0221185 A1 | 1/2009 | Ng |
| 2009/0295300 A1 | 12/2009 | King |
| 2010/0039794 A1 | 2/2010 | Ghanem et al. |
| 2010/0163890 A1 | 7/2010 | Miskin |
| 2010/0207536 A1 | 8/2010 | Burdalski et al. |
| 2011/0210670 A1 | 9/2011 | Sauerlander et al. |
| 2011/0234114 A1 | 9/2011 | Miskin et al. |
| 2012/0043897 A1 | 2/2012 | Miskin et al. |

(56) References Cited

U.S. PATENT DOCUMENTS

| | | |
|---|---|---|
| 2012/0268008 A1 | 10/2012 | Miskin et al. |
| 2012/0293083 A1 | 11/2012 | Miskin et al. |
| 2014/0239809 A1 | 8/2014 | Miskin |
| 2014/0301073 A1 | 10/2014 | Miskin |
| 2014/0301074 A1 | 10/2014 | Miskin |
| 2016/0095180 A1 | 3/2016 | Miskin |
| 2017/0105256 A1 | 4/2017 | Miskin |
| 2017/0188426 A1 | 6/2017 | Miskin et al. |
| 2017/0208656 A1 | 7/2017 | Miskin et al. |
| 2017/0273154 A1 | 9/2017 | Miskin |
| 2017/0295616 A1 | 10/2017 | Miskin |
| 2017/0354005 A1 | 12/2017 | Miskin et al. |

FOREIGN PATENT DOCUMENTS

| | | |
|---|---|---|
| JP | 11-016683 | 1/1999 |
| JP | 11-330561 | 11/1999 |
| JP | 2003132708 | 5/2003 |
| WO | WO 99/20085 | 4/1999 |
| WO | WO 2005048658 | 5/2005 |
| WO | WO 2008124701 | 10/2008 |
| WO | WO 2010/106375 | 9/2010 |
| WO | WO 2016164928 | 10/2016 |

OTHER PUBLICATIONS

U.S. Appl. No. 15/797,806, filed Oct. 30, 2017, inventors: Michael Miskin and James N. Andersen, 59 pages.

Master Thesis of Srinivasa M. Baddela titled "High Frequency AC Operation of LEDs to Resolve the Current Sharing Problem When Connected in Parallel".

Srinivasa M. Baddela and Donald S. Zinger, "Parallel Connected LEDs Operated at High Frequency to Improve Current Sharing," IAS 2004, pp. 1677-1681.

M. Rico-Secades, et al., "Driver for high efficiency LED based on flyback stage with current mode control for emergency lighting system," Industry Applications Conference, Oct. 2004, pp. 1655-1659.

Patent Owners Preliminary Response under 37 CFR 42.107 for Case IPR2016-01116 for Inter Partes Review of U.S. Pat. No. 8,531,118, 66 pages.

Lynk Labs, Inc.'s Initial Response to Invalidity Contentions, Northern District of Illinois Civil Action No. 15-cv-04833, 88 pages.

Decision on Institution of Inter Partes Review under 37 CFR 42.108 for U.S. Pat. No. 8,531,118, 47 pages.

Written Opinion and International Search Report for International App. No. PCT/US2005/006146, 12 pages.

Robert W. Erickson & Dragen Maksimovic, "Fundamentals of Power Electronics" (Kluwer Academic Publishers, $2^{nd}$ ed.), p. 576.

Office Action, U.S. Appl. No. 16/460,790, dated Sep. 26, 2019, 22 pages.

AC VOLTAGE REGULATOR WITH VOLTAGE MEASUREMENT

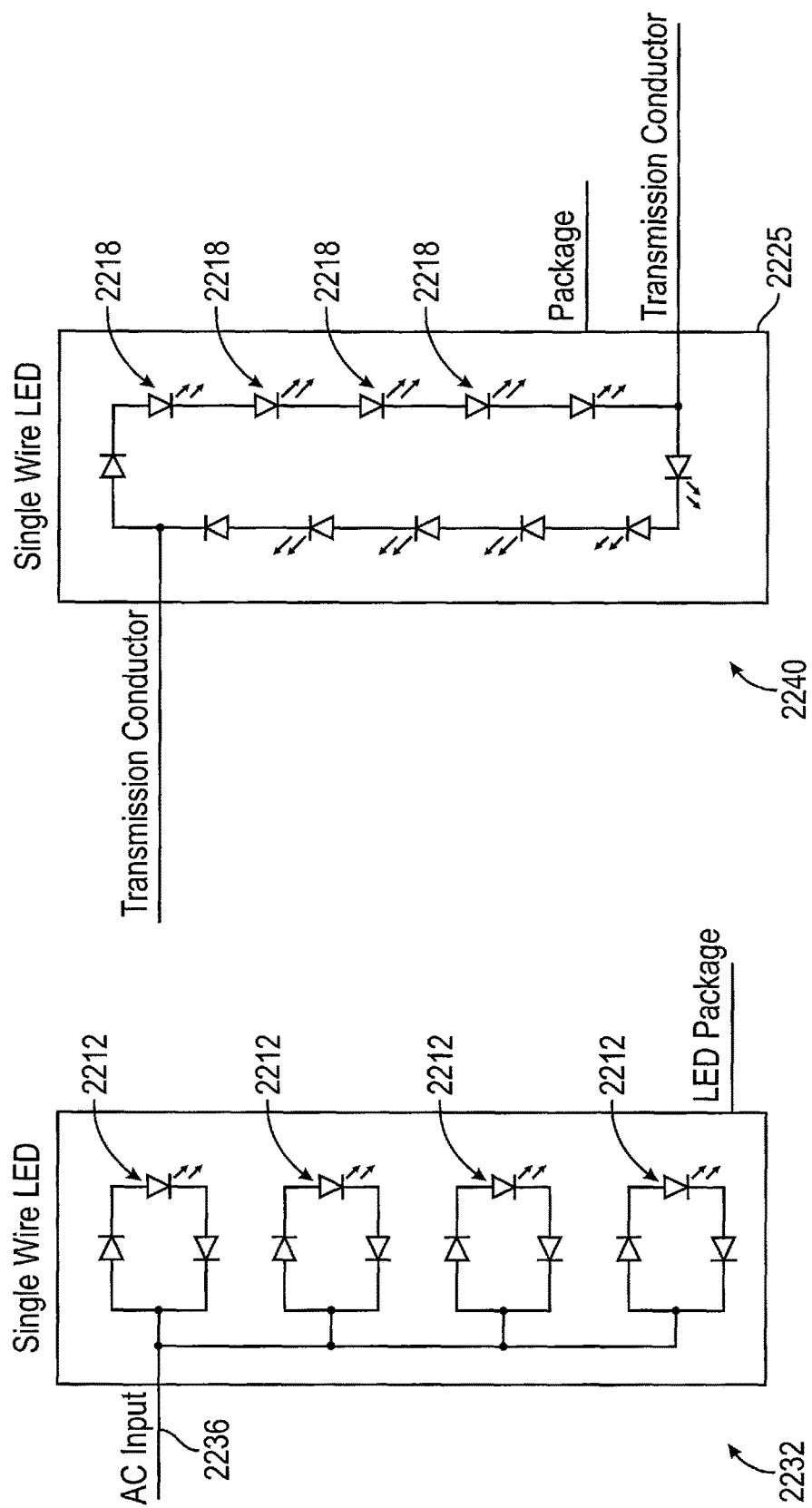

AC LIGHT EMITTING DIODE AND AC LED DRIVE METHODS AND APPARATUS

RELATED APPLICATIONS

The present application is a continuation of U.S. patent application Ser. No. 16/523,388 filed Jul. 26, 2019, which is a continuation of U.S. patent application Ser. No. 16/449,273 filed Jun. 17, 2019, which is a continuation of U.S. patent application Ser. No. 16/443,759 filed Jun. 17, 2019, which is a continuation of U.S. patent application Ser. No. 16/407,076 filed May 8, 2019, which is a continuation of U.S. patent application Ser. No. 16/148,945 filed Oct. 1, 2018, which is a continuation of U.S. patent application Ser. No. 15/334,029 filed Oct. 25, 2016, which is continuation-in-part of U.S. patent application Ser. No. 14/948,635 filed Nov. 23, 2015, which is a divisional application of U.S. patent application Ser. No. 13/697,646 filed Nov. 13, 2012 which is a 371 National Phase Application of International Application No. PCT/US2011/0363359 filed May 12, 2011 which claims priority to U.S. Provisional Application No. 61/333,963 filed May 12, 2010 and is a continuation-in-part of International Application No. PCT/US2010/062235 filed Dec. 28, 2010 which claims priority to U.S. Provisional Application No. 61/284,927 filed Dec. 28, 2009 and U.S. Provisional Application No. 61/335,069 filed Dec. 31, 2009 and is a continuation-in-part of U.S. patent application Ser. No. 12/287,267, filed Oct. 6, 2008, which claims priority to U.S. Provisional Application No. 60/997,771, filed Oct. 6, 2007; U.S. patent application Ser. No. 12/364,890 filed Feb. 3, 2009 which is a continuation of U.S. application Ser. No. 11/066,414 (now U.S. Pat. No. 7,489,086) filed Feb. 25, 2005 which claims priority to U.S. Provisional Application No. 60/547,653 filed Feb. 25, 2004 and U.S. Provisional Application No. 60/559,867 filed Apr. 6, 2004; International Application No. PCT/US2010/001597 filed May 28, 2010 which is a continuation-in-part of U.S. application Ser. No. 12/287,267, and claims priority to U.S. Provisional Application No. 61/217,215, filed May 28, 2009; International Application No. PCT/US2010/001269 filed Apr. 30, 2010 which is a continuation-in-part of U.S. application Ser. No. 12/287,267, and claims priority to U.S. Provisional Application No. 61/215,144, filed May 1, 2009; the contents of each of these applications are expressly incorporated herein by reference.

TECHNICAL FIELD

The present invention generally relates to light emitting diodes ("LEDs") and LED drivers. The present invention specifically relates to alternating current ("AC") driven LEDs, LED circuits and AC drive circuits and methods.

FEDERALLY SPONSORED RESEARCH OR DEVELOPMENT

None.

BACKGROUND OF THE INVENTION

1. Field of the Invention

The present invention generally relates to light emitting diodes ("LEDs") and LED drivers. The present invention specifically relates to alternating current ("AC") driven LEDs, LED circuits and AC drive circuits and methods.

2. Description of the Related Art

LEDs are semiconductor devices that produce light when a current is supplied to them. LEDs are intrinsically DC devices that only pass current in one polarity and historically have been driven by DC voltage sources using resistors, current regulators and voltage regulators to limit the voltage and current delivered to the LED. Some LEDs have resistors built into the LED package providing a higher voltage LED typically driven with 5V DC or 12V DC.

With proper design considerations LEDs may be driven more efficiently with AC than with DC drive schemes. LED based lighting may be used for general lighting, specialty lighting, signs and decoration such as for Christmas tree lighting. For example, U.S. Pat. No. 5,495,147 entitled LED LIGHT STRING SYSTEM to Lanzisera (hereinafter "Lanzisera") and U.S. Pat. No. 4,984,999 entitled STRING OF LIGHTS SPECIFICATION to Leake (hereinafter "Leake") describes different forms of LED based light strings. In both Lanzisera and Leake, exemplary light strings are described employing purely parallel wiring of discrete LED lamps using a step-down transformer and rectifier power conversion scheme. This type of LED light string converts input electrical power, usually assumed to be the common U.S. household power of 110 VAC, to a low voltage, rectified to nearly DC input.

Pat. Pending Application No. 0015968A1 entitled PREFERRED EMBODIMENT TO LED LIGHT STRING to Allen (hereinafter "Allen") discloses AC powered LED-based light strings. Allen describes LED light strings employing series parallel blocks with a voltage matching requirement for direct AC drive placing fundamental restrictions on the number of diodes (LEDs) on each diode series block, depending on the types of diodes used. Allen discloses that for the forward voltage to be "matched," in each series block, the peak input voltage must be less than or equal to the sum of the maximum forward voltages for each series block in order to prevent over-driving.

LEDs can be operated from an AC source more efficiently if they are connected in an "opposing parallel" configuration as shown by WO98/02020 and JP11/330561. More efficient LED lighting systems can be designed using high frequency AC drivers as shown by Patent Publication Number 20030122502 entitled Light Emitting Diode Driver ("Clauberg et. al.") Clauberg et. al. discloses that higher frequency inverters may be used to drive an opposing parallel LED pair, an opposing parallel LED string and/or an opposing parallel LED matrix by coupling the LEDs to a high frequency inverter through a resonant impedance circuit that includes a first capacitor coupled in series to one or more inductors with the impedance circuit coupled in series to opposing parallel LEDs with each set of LEDs having a second series capacitor in series to the impedance circuit. In this system additional opposing parallel configurations of LEDs with capacitors may not be added to or removed from the output of the driver without effecting the lumens output of the previously connected LED circuits unless the driver or components at the driver and/or the opposing parallel LED capacitors were replaced with proper values. By adding or removing the opposing parallel LED circuits the voltage would increase or drop at the inductor and the current would increase or drop through the first series capacitor as the load changed therefore the inductor and all capacitors or entire driver would need to be replaced or adjusted each time additional LEDs were added to or removed from the system.

High frequency AC voltage power supplies and/or transformers can be used to drive LEDs by interfacing a bridge between the power supply and a DC driven LED circuit(s) or having no bridge between the high frequency transformer and an AC driven LED circuit(s).

High frequency AC transformers can be made smaller and more cost effectively than constant current or constant voltage DC drivers or power supplies currently being used to power LEDs.

The higher the frequency, the smaller the transformer can be made. With proper design consideration and based on the wattage and the frequency of the AC voltage output, a high frequency AC voltage transformer can be made small enough to be mounted directly onto a LED lighting PCB assembly.

Patent application number US2004/0080941 entitled Light Emitting Diodes For High AC Voltage Operation And General Lighting discloses that a plurality of opposing parallel series strings of LEDs can be integrated into a single chip and driven with high voltage low frequency mains AC power sources as long as there are enough LEDs in each opposing parallel series string of LEDs to drop the total source voltage across the series LEDs within the chip. Patent numbers WO2004023568 and JP2004006582 disclose that a plurality of opposing parallel series strings or opposing parallel series matrix of LEDs can be integrated into a single chip and mounted on an insulating substrate and driven with a high drive voltage and low drive current as long as there are enough LEDs in each opposing parallel series string of LEDs to drop the total source voltage across the series LEDs within the chip. These patents and application disclose that for single chip or packaged LED circuits a plurality of opposing parallel series strings are required with the total number of LEDs in each series string needing to be equal to or greater than the AC voltage source in order to drop the total forward voltage and provide the required drive current when driven direct with low frequency AC mains power sources.

The present invention addresses the above-noted shortcomings of the prior art while providing additional benefits and advantages This invention continues the line of inventions of Nikola Tesla, and Stanislav and Konstantin Avramenko. It is possible to transfer power through one wire, even to operate an electric motor. It is also possible to transfer power without any wires.

The self reference method and device goes one step ahead. For power and signal applications there are benefits in using self referencing circuits and devices without the need to bring extra objects to dissipate the energy already in place or provide a DC return path to ground or an AC power source. With precautions to protect integrated circuits and low power electronic devices, it is possible to design efficient systems when the heat, energy and the error budgets are important. It is also possible to design solid state electric power transformers that can be used in place of magnetic transformers. By reducing the number of connections inside these systems, more efficient designs are possible. It is even conceivable to design portable systems without batteries. DC powered electronic devices require a magnetic transformer and rectification when powered with 120 volt or 240 volt AC power. Additionally, they typically require a drop in supply voltage. A transformer typically reduces the high voltage and rectifies it to DC current. Solid state LED lighting can be powered with AC or DC depending on the design on the device. If rectification is not required, resistors can be used in place of a transformer to drop higher voltages. The resistors generate heat and transformers can be cumbersome as well as generate heat.

One wire electric transmission is due to displacement currents. The dipoles in matter and in the electromagnetic vacuum can move back and forth in the presence of a longitudinal alternating electric field. A positive charge moving in the direction of the electric field contributes equally to the current as a negative charge moving in the opposite direction. There does not have to be a net displacement of charge, from left to right say, to have an electric current. There is no need for a return path.

There is no fundamental need to return all charges to a common dump either. One has to be careful not to produce intense electric fields that break the stability of the material circuits, but beyond that, there is no need to return all charges to a big reservoir like the earth. For portable devices this is a good thing, otherwise they would be impossible to construct. To perform all the tasks required, it is enough to have either real dipoles in material substances, or virtual dipoles in the electromagnetic vacuum. Once the function has been satisfied, the device goes back to the state it had when the process started. Circuits according to the invention have one or more of the following attributes: circulation/symmetry breaking/dipoles; difference of time constant between charge and discharge; AC to DC rectification; tunable load to resonant frequency; frequency/voltage dependence; series inductance; series capacitance; and, an open system harnessing electromagnetic field energy.

SUMMARY OF THE INVENTION

According to one broad aspect of the invention a lighting system is provided having one or more LED circuits. Each LED circuit has at least two diodes connected to each other in opposing parallel relation, wherein at least one of which such diodes is an LED. As used throughout the application, the term diode may mean any type of diode capable of allowing current to pass in a single direction, including but not limited to, a standard diode, a schottky diode, a zener diode, and a current limiting diode. A driver is connected to the one or more LED circuits, the driver providing an AC voltage and current to the one or more LED circuits. The driver and the LED circuits form a driven circuit. The driver and the LED circuits are also configured such that LED circuits may be added to or subtracted (intentionally or by component failure) from the driven circuit:

(a) without significantly affecting the pre-determined desired output range of light from any individual LED; and, (b) without the need to: (i) change the value of any discrete component; or, (ii) to add or subtract any discrete components, of any of the pre-existing driven circuit components which remain after the change.

In another embodiment of the invention at least one capacitor is connected to and part of each LED circuit. In yet another embodiment, at least one resistor is connected to and is part of each opposing parallel LED circuit noted above. The resistor is connected in series with the at least one capacitor.

According to another aspect of the invention an LED circuit (sometimes referred to as an "AC LED") can comprise two opposing parallel LEDs, an opposing parallel LED string or an opposing parallel LED matrix. These opposing parallel LEDs may have a capacitor in series connected to at least one junction of the connected opposing parallel configurations within a single chip, a single package, an assembly or a module.

When a real capacitor is connected in series in one or more lines between an LED and an AC power source, there is a displacement current through that capacity of magnitude: $I=2\Pi fCV$. The capacitor in the LED circuits of the invention regulates the amount of current and forward voltage delivered to the one or more opposing parallel LEDs based on the voltage and frequency provided by the AC driver. Based on the number of LEDs in the LED circuit the opposing parallel connections provide two or more junctions to which at least one series capacitor may be connected in series of at least one power connection lead. In some embodiments, LED circuits may also use a series resistor in addition to the capacitor providing an "RC" resistor capacitor network for certain LED circuit driver coupling that does not provide protection against surge currents to the LED circuits.

According to another aspect of the invention an LED circuit may comprise a single LED or a series string of diodes and/or LEDs connected to a full bridge rectifier capable of rectifying a provided AC voltage and current for use by the series string of diodes and/or LEDs. The rectifier may be formed as part of the LED circuit, or may be formed separately, having leads provided on both the output of the driver and the input of the LED circuit to allow the LED circuit to connect directly to the driver. In order to protect the LED circuit from voltage spikes a capacitor may be connected across the inputs of the bridge rectifier. The capacitor may also be used for smoothing the AC waveform to reduce ripple. A capacitor may likewise be connected between one rectifier input and the AC voltage and current source in order to limit the DC current flow to protect the LEDs. The bridge diode and LED circuit may be packaged separate or together, and may be configured within a single chip or two chips, a single package or two packages, an assembly, or a module.

According to another aspect of the invention, a single bridge rectifier may be used to drive parallel LEDs or series strings of diodes and/or LEDs. Alternatively, it is contemplated by the invention that each LED circuit requiring a bridge rectifier to utilize both the high and low phases of an AC power wave may include its own full bridge rectifier integrated or otherwise connected thereto. In embodiments where each LED circuit includes its own rectifier, additional LED circuits may be added in parallel across an AC voltage and current source to any existing LED circuits without concern of connecting to any existing bridge rectifiers or, where used, capacitors. Providing each LED circuit with its own bridge rectifier has the further advantage of scaling capacitors included in the circuit for voltage protection and/or current limiting to be matched to a particular LED or string of diodes and/or LEDs.

It should be noted that "package" or "packaged" is defined herein as an integrated unit meant to be used as a discrete component in either of the manufacture, assembly, installation, or modification of an LED lighting device or system. Such a package includes LED's of desired characteristics with capacitors and or resistors (when used) sized relative to the specifications of the chosen LED's to which they will be connected in series and with respect to a predetermined AC voltage and frequency.

Preferred embodiments of a package may include an insulating substrate whereon the LEDs, capacitors and/or resistors are formed or mounted. In such preferred embodiments of a package, the substrate will include electrodes or leads for uniform connection of the package to a device or system associated with an AC driver or power source or any individually packaged rectifiers used to rectify AC voltage and current. The electrodes, leads, and uniform connection may include any currently known means including mechanical fit, and/or soldering. The substrate may be such as sapphire, silicon carbide, galium nitride, ceramics, printed circuit board material, or other materials for hosting circuit components.

A package in certain applications may preferably also include a heat sink, a reflective material, a lens for directing light, phosphor, nano-chrystals or other light changing or enhancing substances. In sum, according to one aspect of the invention, the LED circuits and AC drivers of the present invention permit pre-packaging of the LED portion of a lighting system to be used with standardized drivers (and when necessary full wave rectifiers) of known specified voltage and frequency output. Such packages can be of varied make up and can be combined with each other to create desired systems given the scalable and compatible arrangements possible with, and resulting from, the invention.

According to one aspect of the invention, AC driven LED circuits (or "driven circuits") permit or enable lighting systems where LED circuits may be added to or subtracted (either by choice or by way of a failure of a diode) from the driven circuit without significantly affecting the pre-determined desired output range of light from any individual LED and, without the need to: (i) change the value of any discrete component; or, (ii) to add or subtract any discrete components, of any of the pre-existing driven circuit components which remain after the change. During design of a lighting system, one attribute of the LEDs chosen will be the amount of light provided during operation. In this context, it should be understood that depending on the operating parameters of the driver chosen, the stability or range of the voltage and frequency of the driver will vary from the nominal specification based upon various factors including but not limited to, the addition or subtraction of the LED circuits to which it becomes connected or disconnected. Accordingly, as sometimes referred to herein, drivers according to the invention are described as providing "relatively constant" or "fixed" voltage and frequency. The extent of this relative range may be considered in light of the acceptable range of light output desired from the resulting circuit at the before, during, or after a change has been made to the lighting system as a whole. Thus it will be expected that a pre-determined range of desired light output will be determined within which the driven LED circuits of the invention will perform whether or not additional or different LED circuits have been added or taken out of the driven circuit as a whole or whether additional or different LED circuits have been added proximate any existing LED circuits or positioned remotely.

According to another aspect of the invention an LED circuit may be at least one pre-packaged LED and one pre-packaged diode connected together opposing parallel of each other, two opposing parallel pre-packaged LEDs, an opposing parallel LED string of pre-packaged LEDs, an opposing parallel LED matrix of pre-packaged LEDs optionally having a capacitor in series of at least one junction of the connected LED circuits. It is contemplated that the LED circuit may also be at least one of a single LED or series string of diodes and/or LEDs having a bridge rectifier connected across the the single LED or string of diodes. In embodiments where a series string of diodes and/or LEDs and a rectifier is utilized, each LED may likewise be pre-packaged. The rectifier may optionally having a capacitor connected across the rectifier inputs and/or a capacitor connected between to an input of the rectifier for connection between the rectifier and a AC voltage and current source. In either embodiment, utilizing an LED circuit capacitor may allow for direct coupling of at least one LED circuit to the LED driver without additional series components such as capacitors and/or inductors between the LED circuit driver and the LED circuits. The LED circuit driver provides a relatively fixed voltage and relatively fixed frequency AC output even with changes to the load using feedback AC voltage regulator circuitry. The LED circuit's may be directly coupled and scaled in quantity to the LED circuit driver without affecting the other LED circuit's lumen output as long as the LED circuit driver maintains a relatively fixed voltage and relatively fixed frequency AC output.

According to an aspect of the invention, an LED circuit driver provides a relatively fixed voltage and relatively fixed frequency AC output such as mains power sources. The LED circuit driver output voltage and frequency delivered to the LED circuit may be higher than, lower than, or equal to mains power voltage and frequencies by using an LED circuit inverter driver. The LED circuit inverter driver providing higher frequencies is preferable for LED circuits that are integrated into small form LED packages that include integrated capacitors or resistor capacitor "RC" networks. The LED circuit inverter driver has feedback circuitry such as a resistor divider network or other means allowing it to sense changes to the load and re-adjust the frequency and/or voltage output of the LED circuit driver to a desired relatively fixed value. The LED circuit driver may also provide a soft-start feature that reduces or eliminates any surge current from being delivered to the LED circuit when the LED circuit driver is turned on. Higher frequency and lower voltage LED circuit inverter drivers are preferred enabling smaller package designs of LED circuits as the capacitor at higher frequencies would be reduced in size making it easier to integrate into a single LED circuit chip, package, assembly or module.

According to the invention LED circuits may have a resistor capacitor ("RC") network connected together in series or separate from the the LED circuits. The maximum resistor value needed is only that value of resistance needed to protect the one or more LEDs within the LED circuit from surge currents that may be delivered by LED circuit drivers that do not provide soft start or other anti surge current features. Direct mains power coupling would require RC network type LED circuits as the mains power source delivers surge currents when directly coupled to an LED circuit.

The higher frequency LED circuit inverter driver may be a halogen or high intensity discharge (HID) lamp type driver with design modifications for providing a relatively fixed voltage and relatively fixed frequency output as the LED circuit load changes. Meaning if the LED circuit inverter driver is designed to have an output voltage of 12V at a frequency of 50 Khz the LED circuit driver would provide this output as a relatively constant output to a load having one or more than one LED circuits up to the wattage limit of the LED circuit driver even if LED circuits were added to or removed from the output of the LED circuit driver.

The higher frequency inverter having a relatively fixed voltage and relatively fixed frequency output allows for smaller components to be used and provides a known output providing a standard reference High Frequency LED circuit driver enabling LED circuits to be manufactured in volume in existing or reasonably similar LED package sizes with integrated capacitors or RC networks based on the number of LEDs desired in the LED circuit package.

Patent publication number 20030122502 entitled Light Emitting Diode driver (Clauberg and Erhardt) does not disclose the use of a high frequency inverter driver having a means or keeping a relatively fixed voltage and relatively frequency in response to changes in the load. According to the present invention described herein, by not having additional components such as an inductor or capacitor in series between the LED circuit and the LED circuit driver one LED circuit at a time may be added to or removed from the LED circuit driver output without having to change any components, the LED circuit driver or make adjustments to the LED circuit driver. Additionally, according to this invention the lumen output of the existing LED circuits stays relatively constant due to the self-regulating nature of each individual LED circuit when driven with the relatively fixed frequency and voltage of the LED circuit driver. This level of scalability, single chip LED circuit packaging and standardization is not possible with the prior art using an inductor in series between the LEDs or other components due to the voltage or current increase or drop across the inductors and capacitors in response to changes in the load.

Prior art for single chip LED circuits, for example those disclosed in WO2004023568 and JP2004006582 do not provide a way to reduce the number of LEDs within the chip below the total forward voltage drop requirements of the source. The present invention however, enables an LED circuit to be made with any number of LEDs within a single chip, package or module by using, where desired, transformers, capacitors, or RC networks to reduce the number of LEDs needed to as few as one single LED. Improved reliability, integration, product and system scalability and solid state lighting design simplicity may be realized with LED circuits and the LED circuit drivers. Individual LED circuits being the same or different colors, each requiring different forward voltages and currents may be driven from a single source LED circuit driver. Each individual LED circuit can self-regulate current by matching the capacitor or RC network value of the LED circuit to the known relatively fixed voltage and frequency of the LED circuit driver whether the LED circuit driver is a mains power source, a high frequency LED circuit driver or other LED circuit driver capable of providing a relatively fixed voltage and relatively fixed frequency output.

When a real capacitor is connected in series in one or more lines between an LED and an AC power source, there is a displacement current through that capacity of magnitude: $I=2\Pi fCV$. This means that one can predetermine the amount of current to be delivered through a capacitance based upon a known voltage and frequency of an AC source, allowing for each LED circuit containing a series capacitor to have the specific or ideal current required to provide the desired amount of light from the LED circuit.

According to other aspects of the invention, the LED circuit driver may be coupled to a dimmer switch that regulates voltage or frequency or may have integrated circuitry that allows for adjustability of the otherwise relatively fixed voltage and/or relatively fixed frequency output of the LED circuit driver. The LED circuits get brighter as the voltage and/or frequency of the LED circuit driver output is increased to the LED circuits.

One form of the invention is at least one LED and one diode connected together opposing parallel of each other, two opposing parallel LEDs, an opposing parallel LED string and/or opposing parallel LED matrix having a capacitor in series of at least one connected junction of the connected opposing parallel LED configurations within a single chip, a single package, an assembly or a module. When desired, the LED circuit with capacitor may be placed on an insulating substrates such as but not necessarily ceramic or sapphire and/or within various LED package sizes; materials and designs based of product specifications or assembled on printed circuit board material. Any integrated LED circuit capacitors should be scaled to a predetermined value enabling the LED circuit to self-regulate a reasonably constant and specific current when coupled to an LED circuit driver that provides a relatively fixed voltage and frequency output. Utilized LED circuit capacitors may be of a value needed to provide the typical operating voltage and current of the LED circuit when designed for coupling to a specific LED circuit driver.

Another form of the invention is an LED circuit comprising at least one LED and one diode connected together opposing parallel of each other, two opposing parallel LEDs, an opposing parallel LED string and/or opposing parallel LED matrix having a series resistor capacitor ("RC") network connected together in series or independently in series between at least one connected junction of the opposing parallel LEDs and the respective power connection of the LED circuit. When desired, the opposing parallel LEDs and RC network may be placed on an insulating substrate such as but not necessarily ceramic or sapphire and/or within various LED package sizes; materials and designs based of product specifications or assembled on printed circuit board material. The LED circuit RC network may be of a value needed to provide the typical operating voltage and current of the LED circuit when designed for coupling to a specific LED circuit driver.

Another form of the invention is an LED circuit comprising a matrix of two opposing parallel LEDs connected together in parallel with every two opposing parallel LEDs having an individual capacitor in series to the power source connection if desired. The entire parallel array of opposing parallel LED circuits, including capacitors when used, may be may be placed on an insulating substrate such as but not necessarily ceramic or sapphire and/or within various LED package sizes; materials and designs based of product specifications or assembled on printed circuit board material. The opposing parallel matrix of LED circuits integrated in the LED circuit package may be RC network type LED circuits.

Another form of the invention is an LED circuit comprising a matrix of opposing parallel LEDs connected together in parallel with every set of opposing parallel LEDs having an individual RC network in series to the power connection lead if desired.

Another form of the invention is an LED circuit comprising a matrix of opposing parallel LEDs connected together in parallel, a capacitor connected in series to at least one side of the line going to the matrix of opposing parallel LEDs with every set of opposing parallel LEDs having an individual resistor in series to the power connection if desired.

Yet another form of the invention is an LED circuit comprising opposing parallel series strings of LEDs connected together and driven direct with a high frequency AC voltage equal to or less than to total series voltage drop of the opposing parallel series strings of LEDs within the LED circuit.

Yet another form of the invention is a LED circuit comprising a single LED or a series string of diodes and/or LEDs and a bridge rectifier connected across the LED or string of diodes and/or LEDs. The rectifier may optionally include a capacitor connected across the inputs of the rectifier. The rectifier may additionally, or alternatively, optionally include a capacitor connected in series with one input, the capacitor being capable of connecting the rectifier input to an AC voltage and current source.

Yet another form of the invention is a LED circuit comprising a single LEDs or a series strings of diodes and/or LEDs connected in parallel across the output of a bridge rectifier. The rectifier may optionally include a capacitor connected across the inputs of the rectifier. The rectifier may additionally, or alternatively, optionally include a capacitor connected in series with one input, the capacitor being capable of connecting the rectifier input to an AC voltage and current source.

Another form of the invention comprises a method of driving LED circuits direct from an AC power source ("LED circuit driver") having a relatively fixed voltage and relatively fixed frequency. The LED circuit driver may be a mains power source, the output of a transformer, a generator or an inverter driver that provides a relatively fixed voltage and relatively fixed frequency as the load changes and may be a higher or lower frequency than the frequencies of mains power sources. The LED circuit driver provides a relatively fixed voltage and relatively fixed frequency output even when one or more LED circuits are added to or removed from the output of the LED circuit driver. Higher frequency inverters with lower output voltages are used as one LED circuit driver in order to reduce component size and simplify manufacturing and standardization of LED circuits through the availability of higher frequency LED circuit drivers. The LED circuit driver may also include circuitry that reduces or eliminates surge current offering a soft-start feature by using MOSFET transistors, IGBT transistors or other electronic means. The LED circuit driver may also be pulsed outputs at a higher or lower frequency than the primary frequency.

Another form of the invention is an LED lighting system comprising an LED circuit array having a plurality of different LED circuits each drawing the same or different currents, each having the same or different forward operating voltages, and each delivering the same or different lumen outputs that may be the same or different colors and an LED circuit driver coupled to the LED circuit array. The LED circuit driver delivering a relatively fixed t frequency and voltage output allows for mixing and matching of LED circuits requiring different forward voltages and drive currents. The LED circuits may be connected to the output of an LED circuit driver in parallel one LED circuit at a time within the limit of the wattage rating of the LED circuit driver with no need to change or adjust the LED circuit driver as would typically be required with DC drivers and LEDs when increasing or reducing the load with LEDs and other components. Never having to go back to the power source allows for more efficient integration and scalability of lighting systems designed with LED circuits and allows for a single driver to independently provide power to multiple independently controlled LED circuits in the system. Introducing an inductor and/or an additional capacitor such as the impedance circuit described in prior art between the LED circuit drive source and the LED circuits would require changes to the driver or components and prohibit scalability, standardization and mass production of AC-LEDs with integrated capacitors or RC networks.

With the LED circuit driver providing a known relatively constant AC voltage and frequency, mass production of various LED circuits with specific capacitor or RC network values would deliver 20 mA, 150 mA or 350 mA or any other desired current to the LED circuit based on the output of the specified LED circuit driver. The relatively fixed voltage and frequency allows for standardization of LED circuits through the standardization of LED circuit drivers.

In another aspect, a transistor is coupled to at least one power connection of the LED circuit or built into the LED circuit package in series between the power connection lead and the LED circuit with the transistor being operable to control (e.g., varying or diverting) the flow of the alternating current through the LED circuit through a capacitance within the transistor.

The foregoing forms as well as other forms, features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

BRIEF DESCRIPTION OF THE DRAWINGS

FIG. 69 shows a schematic view of a preferred embodiment of the invention.

FIG. 70 shows a schematic view of a preferred embodiment of the invention.

DETAILED DESCRIPTION OF PREFERRED EMBODIMENTS

While this invention is susceptible to embodiments in many different forms, there is described in detail herein, preferred embodiments of the invention with the understanding that the present disclosures are to be considered as exemplifications of the principles of the invention and are not intended to limit the broad aspects of the invention to the embodiments illustrated.

The present invention is directed to an LED light emitting device and LED light system capable of operating during both the positive and negative phase of an AC power supply. In order to operate during both phases provided by an AC power, as is shown herein, the circuit must allow current to flow during both the positive and negative phases and LED light emitting devices may be configured such that at least one LED is capable of emitting light during one or both of the positive or negative phases. In order to accomplish this, the LED circuit itself may be configured so as to allow current to pass during both phases, or the device may include a bridge rectifier to rectify AC power for use by single LEDs, series strings of LEDs, and parallel series strings of LEDs. Rectification may be accomplished within the light emitting device, or prior to any power being provided to the same. Once integrated into a light system, the present invention further contemplates a driver having the ability to provide a substantially constant voltage at a substantially constant frequency, and that the driver be configured in a manner which will allow LED light emitting devices to be added to or subtracted from the system, regardless of configuration, without having to add, subtract, or change the values of discrete circuit components and without affecting the light output of any individual LED.

Figure 1:
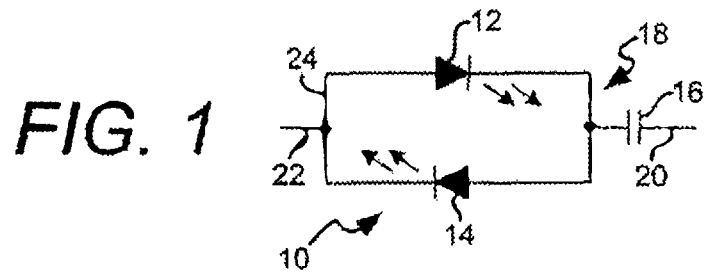
FIG. 1 shows a schematic view of a preferred embodiment of the invention.

FIG. 1 discloses a schematic diagram of a light emitting device 10 for an AC driver according to one embodiment of the invention. The device 10 includes a first LED 12 connected to a second LED 14 in opposing parallel configuration, a capacitor 16 connected in series between a first junction 18 of the two opposing parallel LEDs, a first power connection 20 connected to the two opposing parallel LEDs, and a second power connection 22 connected to a second junction 24 of the two opposing parallel connected LEDs. A diode may be used in place of LED 12 or LED 14.

Figure 2:
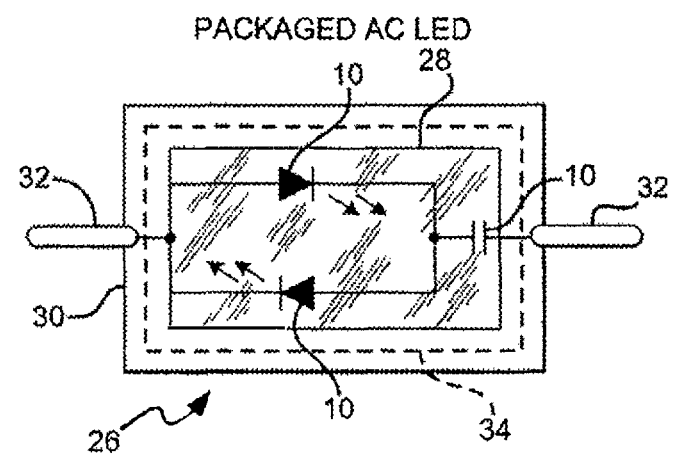
FIG. 2 shows a schematic view of a preferred embodiment of the invention.

FIG. 2 discloses a schematic diagram of a light emitting device 26 for an LED circuit driver according to an embodiment of the invention. The device 26 includes the device 10 as disclosed in FIG. 1 mounted on an insulating substrate 28 such as, but not necessarily, ceramic or sapphire, and integrated into an LED package 30 that may be various LED package sizes; materials and designs based of product specifications or on printed circuit board material. The device 26 provides power connection leads 32 and may have a first or additional lens 34 that may be made of a plastic, polymer or other material used for light dispersion and the lens may be coated or doped with a phosphor or nano-particle that would produce a change in the color or quality of light emitted from the device 10 through the lens 34.

Figure 3:
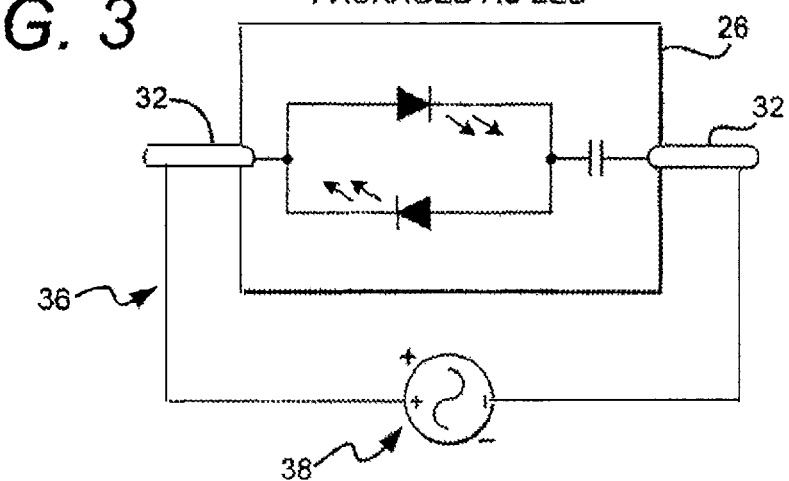
FIG. 3 shows a schematic view of a preferred embodiment of the invention.

FIG. 3 discloses a schematic diagram of a device 36 having a schematic diagram of the embodiment shown as light emitting device 26 driven directly by an AC driver 38 that is connected to the power connections 32 of the device 26 without any additional components in series between the AC driver 38 and the device 26 such as a capacitor, inductor or resistor. The AC driver 38 provides a relatively constant AC voltage and frequency output to the device 26 no matter what the total load of the device 26 may be, or the number of devices 26 added or subtracted as long as the load does not exceed the wattage limitation of the AC driver 38. The AC driver 38 may be a generator, a mains power source, or an inverter capable of providing a relatively fixed voltage and relatively fixed frequency output to different size loads. The AC driver may provide a low or high voltage and a low or high frequency to the device 26 according to the invention as long as the capacitor 16 is the proper value for the desired operation of the device 26.

Figure 4:
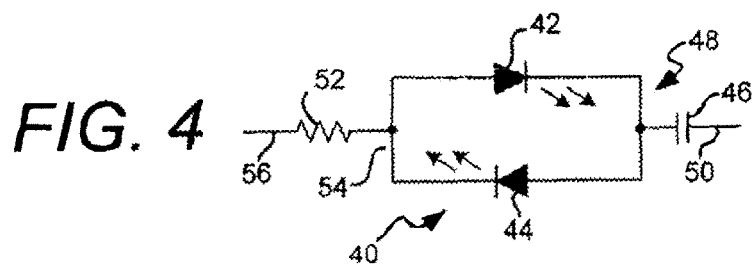
FIG. 4 shows a schematic view of a preferred embodiment of the invention.

FIG. 4 discloses a schematic diagram of a light emitting device 40 for coupling to an LED circuit driver according to an embodiment of the invention. The device 40 includes a first LED 42 connected to a second LED 44 in opposing parallel configuration. A capacitor 46 is connected in series between a first junction 48 of the two opposing parallel LEDs and a first power connection 50. A resistor 52 is connected in series between a second junction 54 of the two opposing parallel LEDs and a second power connection 56. A diode may be used in place of LED 42 or LED 44 and the resistor 52 may be put in series on either end of the capacitor 46 as an alternate location.

Figure 5:
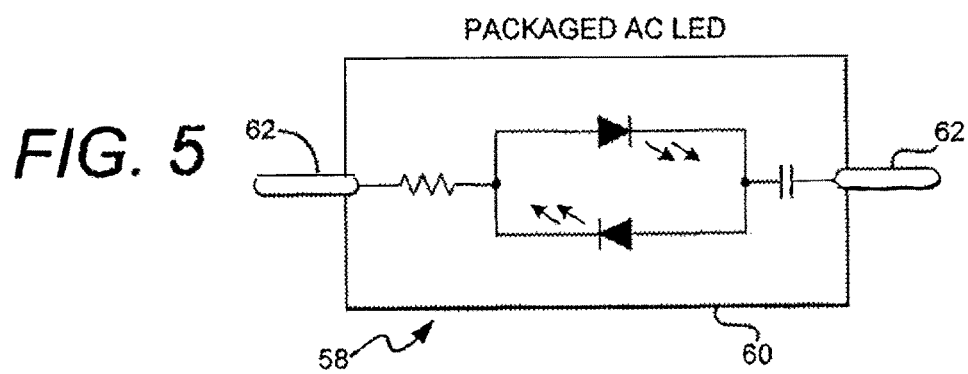
FIG. 5 shows a schematic view of a preferred embodiment of the invention.

FIG. 5 discloses a schematic diagram of a light emitting device 58 for LED circuit drivers according to an embodiment of the invention. The device 58 includes the device 40 as disclosed in FIG. 4 integrated into a package as disclosed in the device 26 in FIG. 2. The device 58 provides power connection leads for connecting to an AC driver 38 as disclosed in FIG. 3.

Figure 6:
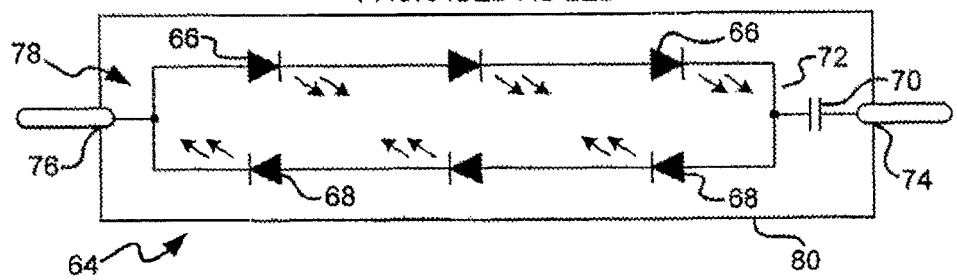
FIG. 6 shows a schematic view of a preferred embodiment of the invention.

FIG. 6 discloses a diagram of a light emitting device 64 for coupling to an LED circuit driver according to an embodiment of the invention. The device 64 includes a first series string of LEDs 66 connected to a second series string of LEDs 68 in opposing parallel configuration, a capacitor 70 connected in series between a first junction 72 of the opposing parallel series string of LEDs and a first power connection 74, and a second power connection 76 connected to a second junction 78 of the opposing parallel series string of LEDs. A diode may be used in place of one or more LEDs 66 and one or more of LEDs 68 and the LEDs 66 and 68 are integrated into a package 80 as described in the package 30 disclosed in FIG. 2 along with capacitor 70.

Figure 7:
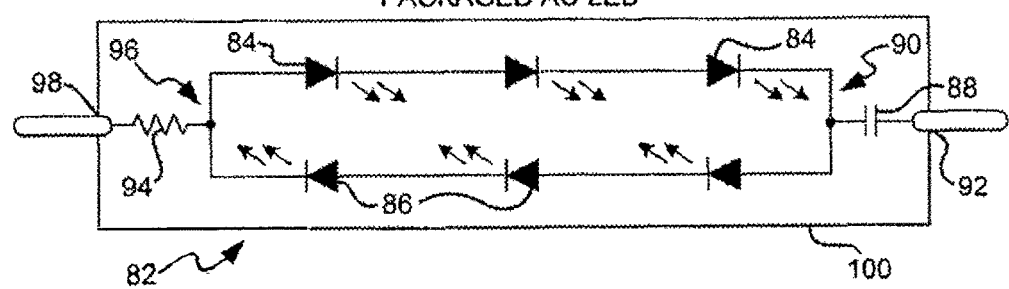
FIG. 7 shows a schematic view of a preferred embodiment of the invention.

FIG. 7 discloses a diagram of a light emitting device 82 for AC drive according to an embodiment of the invention. The device 82 includes a first series string of LEDs 84 connected to a second series string of LEDs 86 in opposing parallel configuration, a capacitor 88 connected in series between a first junction 90 of the opposing parallel series string of LEDs and a first power connection 92, and a resistor 94 connected in series between a second junction 96 of the opposing parallel series string of LEDs and a second power connection 98. A diode may be used in place of one or more LEDs 84 and one or more of LEDs 86 and the LEDs 84 and 86 are integrated into a package 100 as described in the package 30 disclosed in FIG. 2 along with capacitor 88 and resistor 94. The resistor 94 may be put in series on either end of the capacitor 88 as an alternate location.

Figure 8:
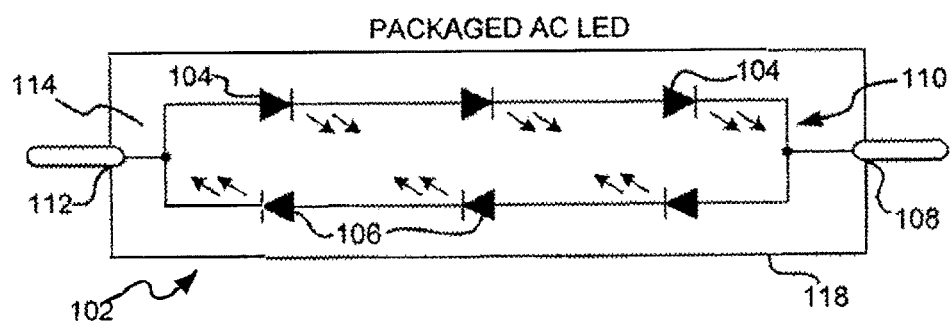
FIG. 8 shows a schematic view of a preferred embodiment of the invention.

FIG. 8 discloses a diagram of a light emitting device 102 according to an embodiment of the invention. The device 102 includes a first series string of LEDs 104 connected to a second series string of LEDs 106 in opposing parallel configuration. A first power connection 108 is connected to a first junction 110 of the opposing parallel series string of LEDs and a second power connection 112 is connected to a second junction 114 of the opposing parallel series string of LEDs. A diode may be used in place of one or more LEDs 104 and one or more of LEDs 106 and the LEDs 104 and 106 are integrated into a package 118 as described in the package 30 disclosed in FIG. 2.

Figure 9:
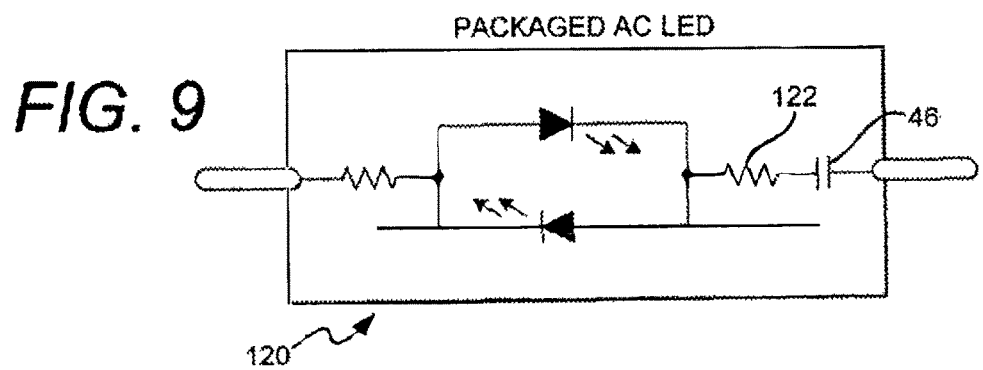
FIG. 9 shows a schematic view of a preferred embodiment of the invention.

FIG. 9 discloses a circuit diagram of a light emitting device 120 according to an embodiment of the invention. The device 120 is similar to the device disclosed in FIG. 5 and includes a second series resistor 122 that can be placed in series on either side of the first capacitor 46.

Figure 10:
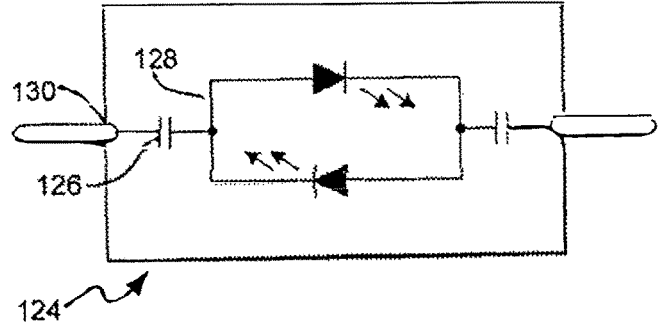
FIG. 10 shows a schematic view of a preferred embodiment of the invention.

FIG. 10 discloses a diagram of a light emitting device 124 according to an embodiment of the invention. The device 124 is similar to the device disclosed in FIG. 2 and includes a second series capacitor 126 connected in series between the junction 128 of the opposing parallel LEDs and a power connection 130.

Figure 11:
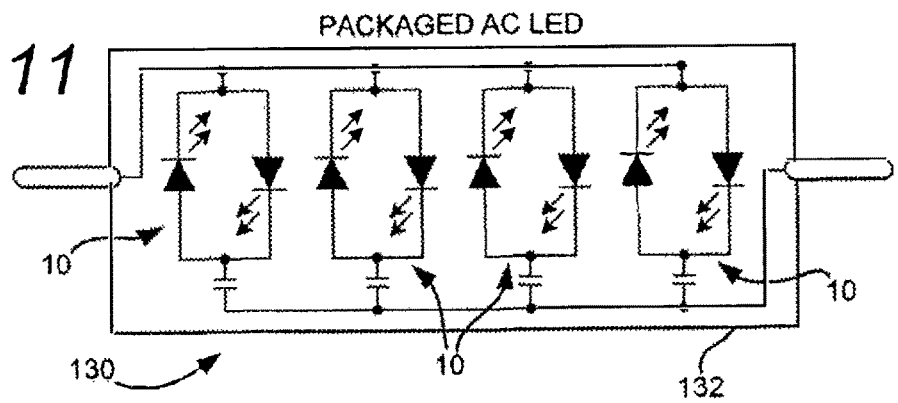
FIG. 11 shows a schematic view of a preferred embodiment of the invention.

FIG. 11 discloses a diagram of a light emitting device 130 according to an embodiment of the invention. The device 130 has a matrix of individual light emitting devices 10 as described in FIG. 1 integrated into a package 132 similar to package 30 as described in FIG. 2.

Figure 12:
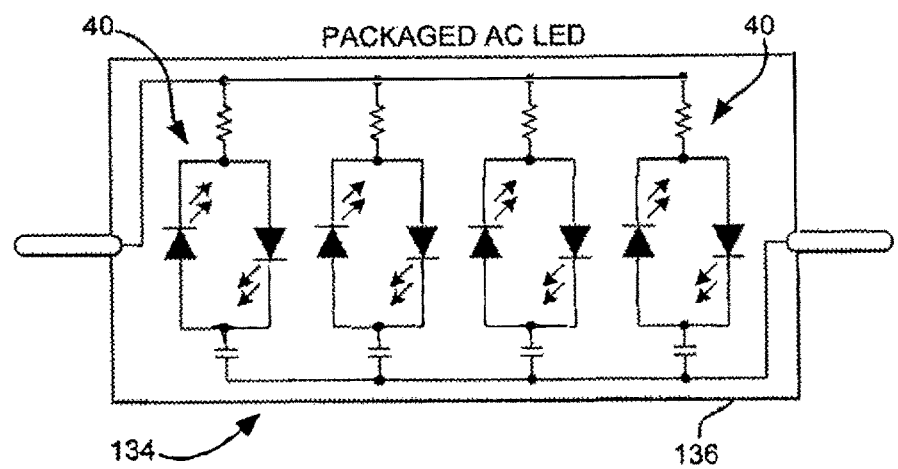
FIG. 12 shows a schematic view of a preferred embodiment of the invention.

FIG. 12 discloses a diagram of a light emitting device 134 according to an embodiment of the invention. The device 134 has a matrix of individual light emitting devices 40 as described in FIG. 4 integrated into a package 136 similar to package 30 as described in FIG. 2.

Figure 13:
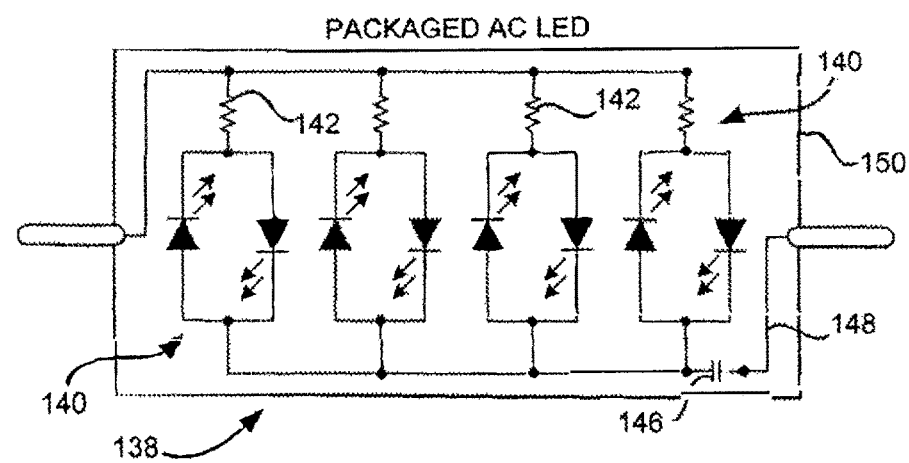
FIG. 13 shows a schematic view of a preferred embodiment of the invention.

FIG. 13 discloses a diagram of a light emitting device 138 according to an embodiment of the invention. The device 138 has a matrix of individual sets of 2 opposing parallel light emitting devices 140 with each set having an individual series resistor to connect to a first power connection 140 and a capacitor 146 connected in series between a second power connection and the matrix of devices 140. The capacitor 146 may alternately be in series between the first power connection 144 and all resistors 142. The matrix of devices 140, resistors 142 and capacitor 146 are integrated into a package 150 similar to package 30 as described in FIG. 2.

Figure 14:
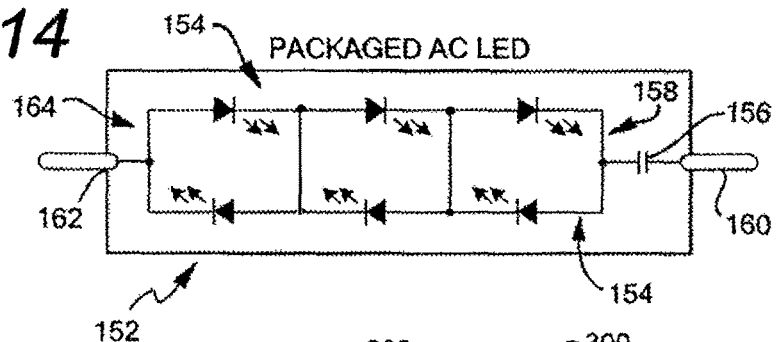
FIG. 14 shows a schematic view of a preferred embodiment of the invention.

FIG. 14 discloses a diagram of a light emitting device 152 according to an embodiment of the invention. The device 152 includes another version of a series opposing parallel LED matrix 154 and a capacitor 156 connected in series between a first junction 158 of the opposing parallel LED matrix 154 and a first power connection, and a second power connection 162 connected to a second junction 164 of the opposing parallel LED matrix. A first power connection 108 is connected to a first junction 110 of the opposing parallel series string of LEDs and a second power connection 112 is connected to a second junction 114 of the opposing parallel series string of LEDs. A diode may be used in place of one or more LEDs 104 and one or more of LEDs 106 and the LEDs 104 and 106 are integrated into a package 118 as described in the package 30 disclosed in FIG. 2.

Figure 15:
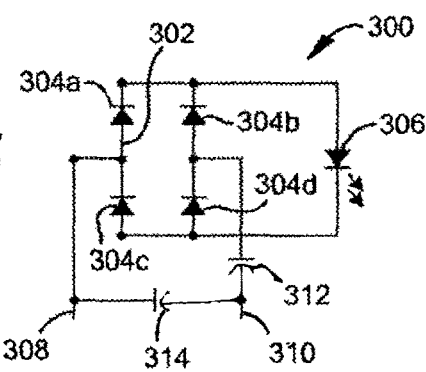
FIG. 15 shows a schematic view of a preferred embodiment of the present invention.

FIG. 15 discloses a schematic diagram of a light emitting device 300 according to an embodiment of the invention. Device 300 includes bridge rectifier circuit 302 having diodes 304a-304d with at least one LED connected across the output of the rectifier circuit, shown as LED 306. While inputs 308 and 310 of the bridge rectifier may be provided for direct connection to an AC power supply, it is contemplated by the invention that one input, shown as input 310, may have a capacitor (shown as capacitor 312) or a resistor (shown in FIG. 18 as resistor 313) connected in series in order to control and limit the current passing through the at least one LED. Additionally, capacitor 314 may be connected across the rectifier inputs to protect against voltage spikes.

Figure 16:
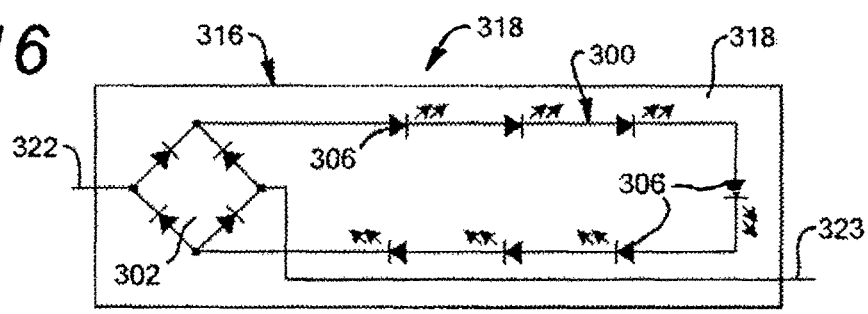
FIG. 16 shows a schematic view of a preferred embodiment of the present invention.
Figure 18:
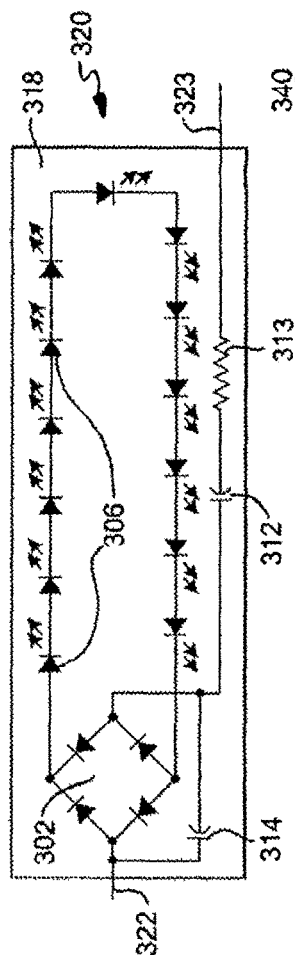
FIG. 18 shows a schematic view of a preferred embodiment of the present invention.

FIGS. 16 and 18 each disclose a schematic diagram of a light emitting device 316 and 332 for an LED circuit driver according to an embodiment of the invention. The device 316 includes the device 300 as disclosed in FIG. 15 (with additional LEDs 306 added in series) mounted on an insulating substrate 318 such as, but not necessarily, ceramic or sapphire, and forming an LED package 320 that may be various sizes; materials and designs based of product specifications or on printed circuit board material. As shown in FIG. 16, The device 316, 332 provides power connection leads 322 and 323 and may have a first or additional lens that may be made of a plastic, polymer or other material used for light dispersion and the lens may be coated or doped with a phosphor or nano-particle that would produce a change in the color or quality of light emitted from device 300 through the lens. LED package 320 may include rectifier 302 to drive LEDs 306. Rectifier 306 may be mounted on insulating substrate 318 along with any LEDs. As should be appreciated by those having ordinary skill in the art, it is contemplated by the invention that any diode or LED may be swapped for the other within the package so long as the package includes at least one LED to emit light when in operation. Any capacitors 312, 314 or resistors 313 included in the light emitting devices may like wise be mounted on substrate 318 and included in LED package 320.

Figure 17:
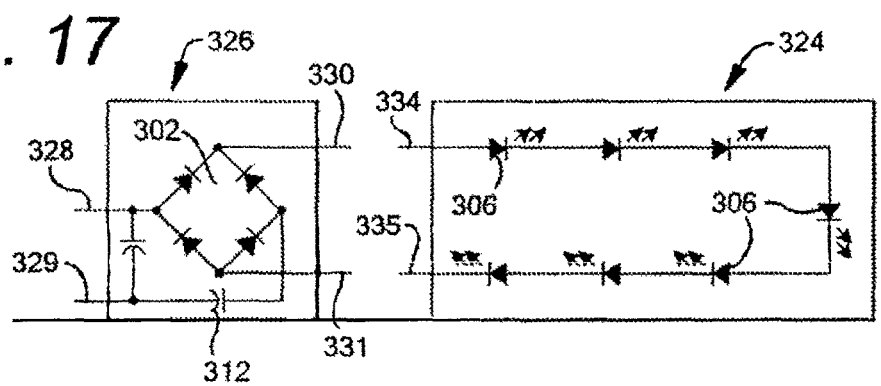
FIG. 17 shows a schematic view of a preferred embodiment of the present invention.

Rather than be packaged together and mounted on a single substrate, and no matter whether the LEDs and diodes are integrated into a single package or are discrete individual LEDs and/or diodes wire-bonded together, as disclosed in FIG. 17 rectifier 302 may be discretely packaged separate from any discrete LED packages 324 where discrete LED package 324 includes one LED 306 or multiple LEDs connected in series or parallel. Rectifier 302 may be packaged into rectifier package 326 for plug and use into a light system, or alternatively may be included as part of a driver used to drive the series LEDs. When packaged separate, package 326 may be provided with input power connections 328 and 329 which to connect the inputs of the rectifier to an AC power supply. In order to connect to one (or more) single or series LEDs and provide power thereto, package 326 may also be provided with output power connections 330 and 331 which may connect to LED package inputs 334 and 335. Any capacitors 312, 314 or resistors 313 included in the light emitting devices may like wise be mounted on substrate 316 and included in rectifier package 326.

Regardless of whether rectifier 302 and LEDs 306 are integrated or mounted in a single package or are discretely packaged and connected, in order to drop higher voltages any number of LEDs may be connected in series or parallel in a device to match a desired voltage and light output. For example, in a lighting device that is run off of a 120 V source and contains LEDs having a forward operating voltage of 3V each connected to a bridge rectifier having diodes also having a forward operating voltage of 3V each, approximately 38 LEDs may be placed in series to drop the required voltage.

Figure 19:
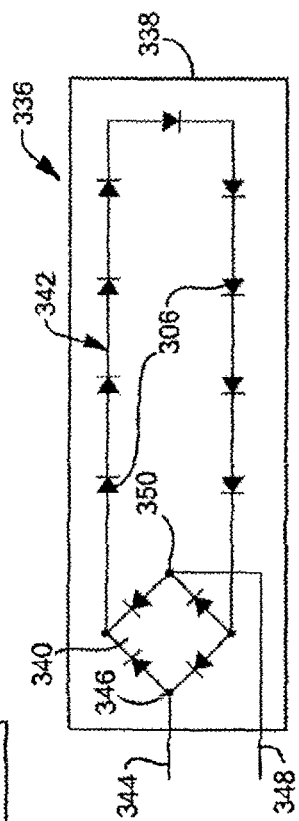
FIG. 19 shows a schematic view of a preferred embodiment of the invention.

FIG. 19 discloses an embodiment of an LED lighting device encapsulated in a housing. As shown in FIG. 19, LED device 336 may include a housing 338 encapsulating at least one bridge rectifier 340, at least one LED circuit 342 connected across the output of the bridge rectifier. Device 334 includes first power connection lead connected 344 to a first input of the rectifier 346 and a second power connection lead 348 connected to a second input of the rectifier 350. At least a portion of each power connection is contained within the housing while at least a portion of each power connection extends beyond the housing to allow device 336 to connect to an AC power source. Rectifier 340 and LED circuit 342 may be connected, assembled, and/or packaged within housing 336 using any of the methods described in conjunction with FIGS. 15-18 or any other means known in the art. It should be appreciated by those having ordinary skill in the art that the devices and packages described in FIGS. 2, 3, and 5-14 may likewise incorporate a housing to encapsulate any device and/or package therein.

Figure 20:
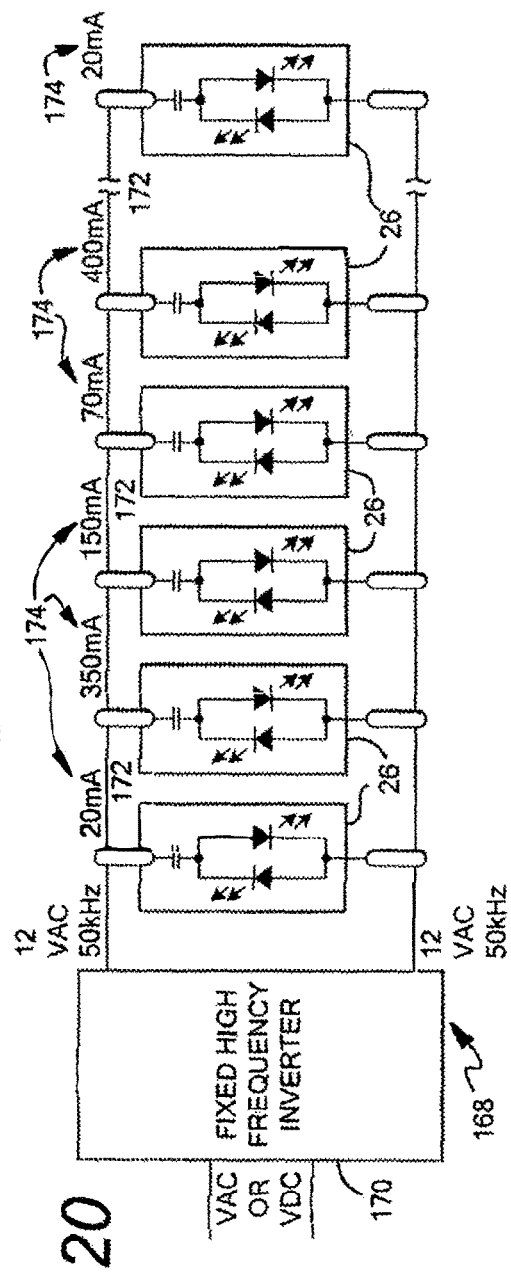
FIG. 20 shows a schematic view of a preferred embodiment of the invention.

FIG. 20 discloses a schematic diagram of a lighting system 168 according to an embodiment of the invention. The device 168 includes a plurality of devices 26 as described in FIG. 2 connected to a high frequency inverter AC drive Method 170 as described in FIG. 3 which in this example provides a relatively constant 12V AC source at a relatively constant frequency of 50 Khz to the devices 26. Each or some of the devices 26 may have integrated capacitors 172 of equal or different values enabling the devices 26 to operate at different drive currents 174 from a single source AC drive Method.

Figure 21:
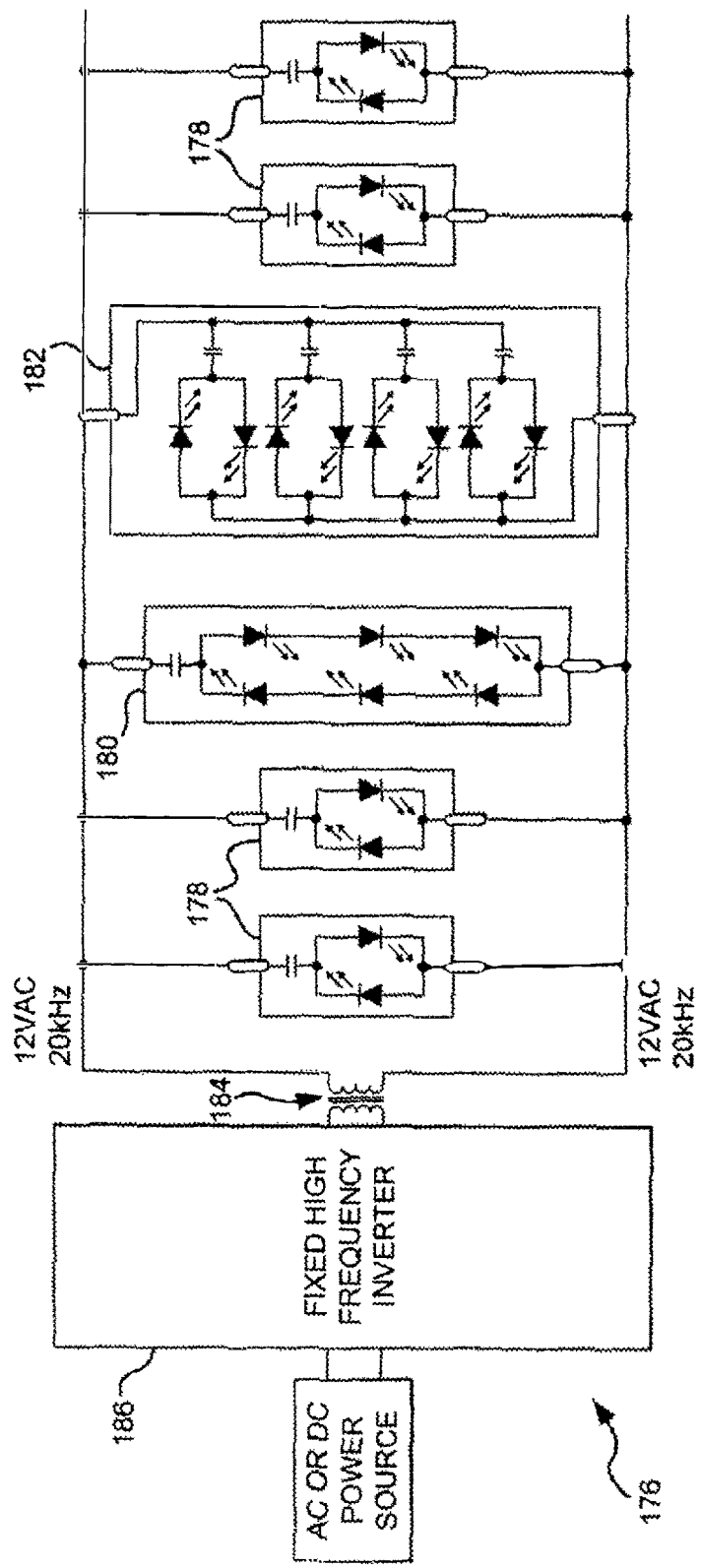
FIG. 21 shows a schematic view of a preferred embodiment of the invention.

FIG. 21 discloses a schematic diagram of a lighting system 176 according to an embodiment of the invention. The lighting system 176 includes a plurality of devices 178, 180 and 182 each able to have operate at different currents and lumens output while connected directly to the transformer 184 output of a fixed high frequency AC drive Method 186.

Any of the aforementioned AC drive methods may likewise be used with the devices embodied in FIGS. 15-19.

Figure 22:
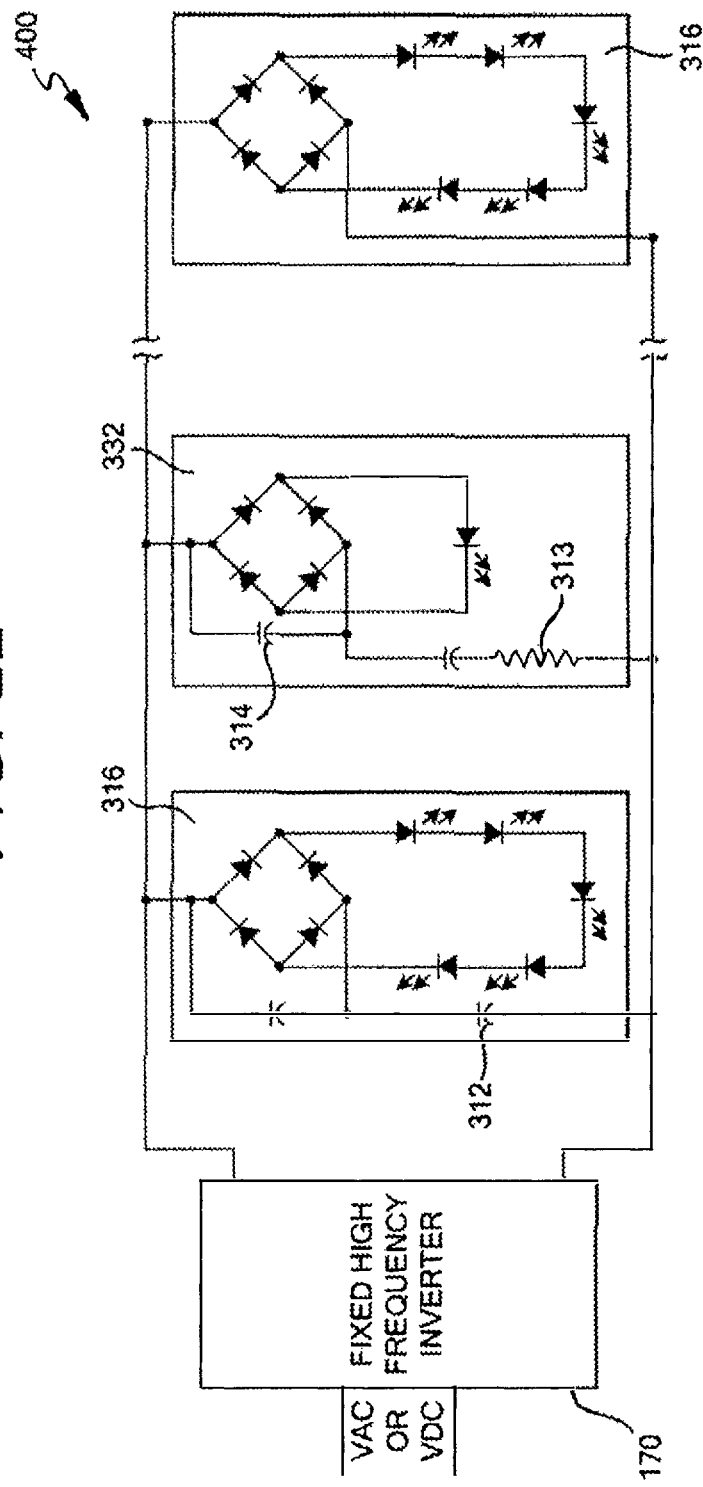
FIG. 22 shows a schematic view of a preferred embodiment of the invention.

For example, FIG. 22 discloses a schematic diagram of a lighting system 400 according to an embodiment of the invention. System 400 includes a plurality of devices 316, 332 as described in FIGS. 16 and 18 connected to a high frequency inverter AC drive Method 170 similar to that described in FIGS. 3 and 20 which provides a relatively constant 12V AC source at a relatively constant frequency of 50 Khz to the devices 316, 332. Each or some of the devices 316, 332 may have integrated capacitors 312, 314 and resistors 313 of equal or different values enabling the devices 300 to operate at different drive currents from a single source AC drive Method. As should be appreciated by those having ordinary skill in the art, while the example of 12V AC at 50 Khz is given herein, it is contemplated by the invention that any voltage at substantially any frequency may be provided by the driver by utilizing a proper transformer and/or inverter circuit.

Figure 23:
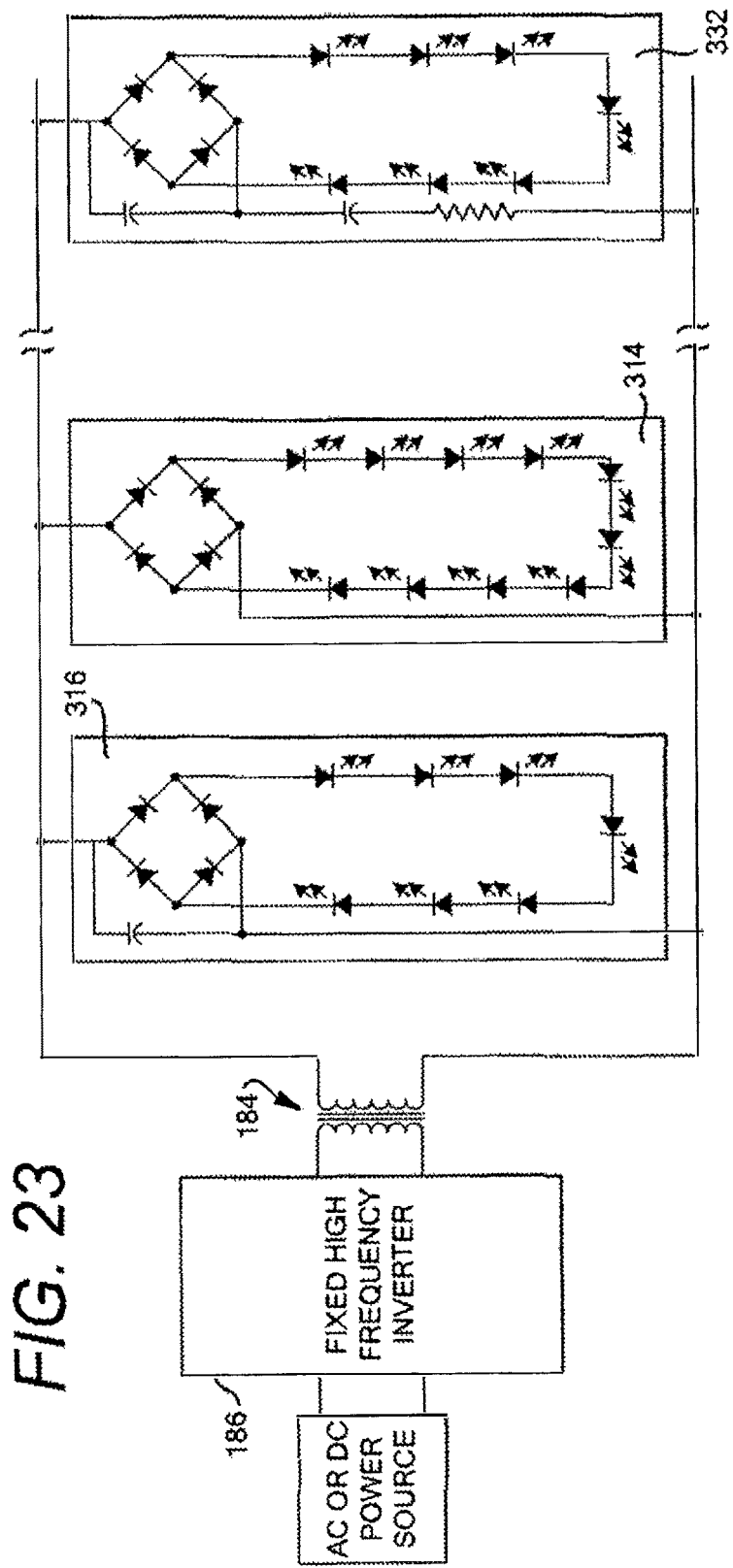
FIG. 23 shows a schematic view of a preferred embodiment of the invention.

Similarly, AC drive Method 186 may be utilized may be used with a single or plurality of devices 214 as disclosed in FIG. 23. As with the embodiment shown in FIG. 21, each device 316, 332 may be connected directly to transformer 184 output to receive a substantially fixed frequency voltage.

Figure 24:
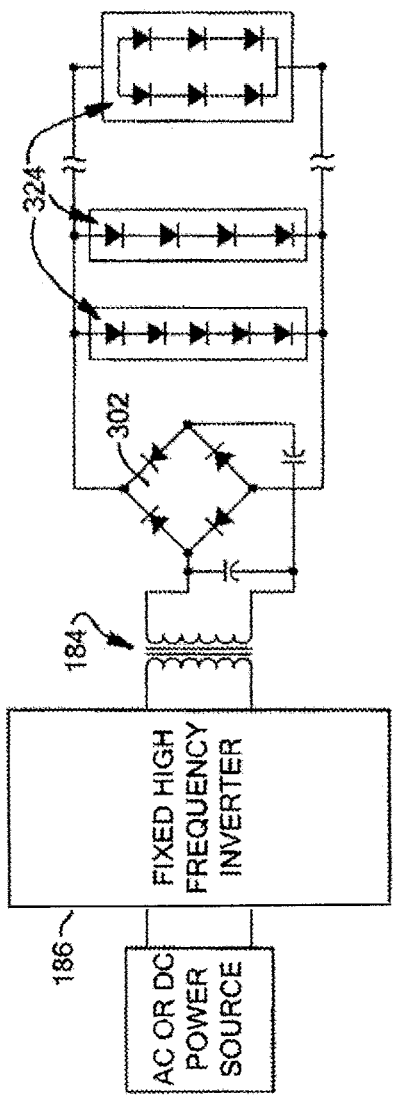
FIG. 24 shows a schematic view of a preferred embodiment of the present invention.

FIG. 24 discloses an embodiment of the invention where AC drive Method 186 is provided to a rectifier and LED series strings are discretely packaged. As previously disclosed, rectifier 302 may be discretely packaged in a rectifier package 326, separate from both AC drive Method 186 (or alternatively AC drive Method 170) and discrete LED packages 324, or alternatively may be included in AC drive Method 186.

Figure 25:
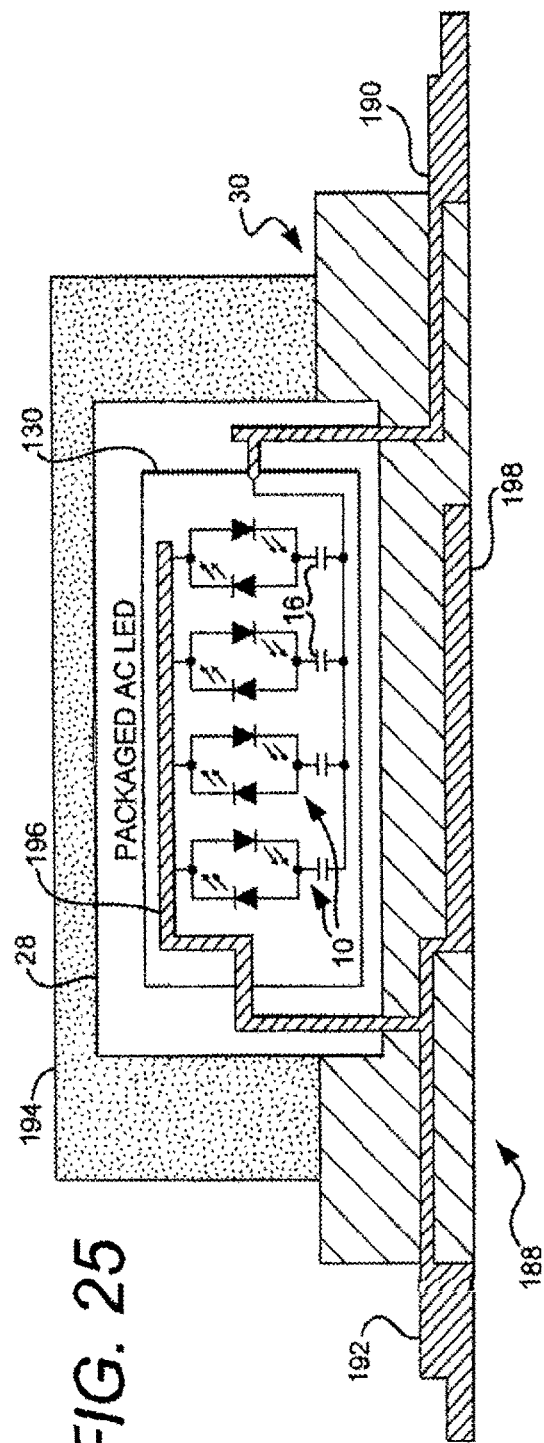
FIG. 25 shows a schematic view of a preferred embodiment of the present invention.

FIG. 25 discloses another schematic view diagram of a light emitting device 188 identical to the device 130 disclosed in FIG. 11 and integrated into a package 30 as described in FIG. 2 for an AC drive Method according to an embodiment of the invention. The device 188 includes the device 130 as disclosed in FIG. 11 mounted on an insulating substrate 28 such as but not necessarily ceramic or sapphire and integrated into an LED package 30 that may be various LED package sizes; materials and designs based of product specifications or on printed circuit board material. The device 188 provides power connection leads 190 and 192 and may have a first or additional lens 194 that may be made of a plastic, polymer or other material used for light dispersion and the lens may be coated or doped with a phosphor or nano-crystals that would produce a change in the color or quality of light emitted from the device 130 through the lens 194. The device 130 has a matrix of devices 10. The power connection opposite the capacitors 16 within the device 130 and part of each device 10 is connected to a power connection 196 that is connected to a solderable heat sinking material 198 and integrated into the package 30. The power connection 196 connected to the heat sink 198 may be of a heavier gauge within the device 130 or 188 than other conductors. The schematic view of the device 188 provides a side view of the package 30 and an overhead view of the device 130 in this FIG. 25.

Figure 26:
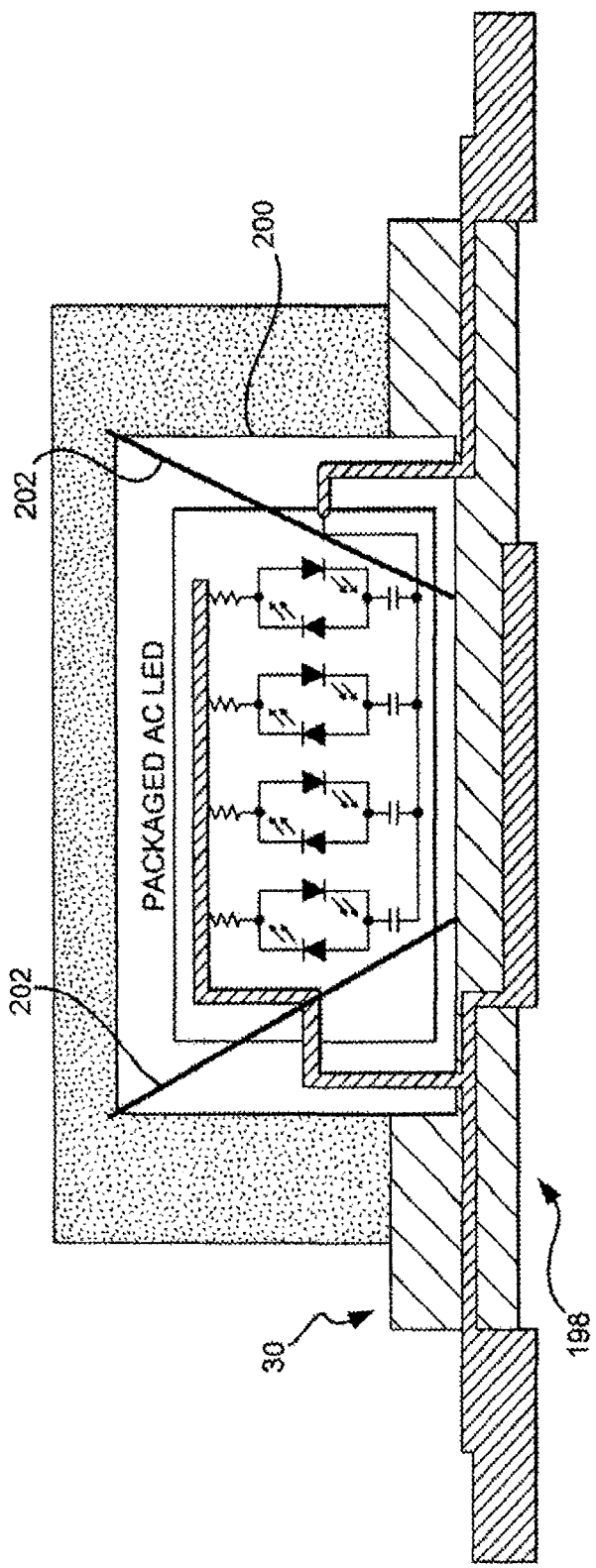
FIG. 26 shows a schematic view of a preferred embodiment of the present invention.

FIG. 26 discloses another schematic view diagram of a light emitting device 198 similar to the device 188 described in FIG. 25 with a different light emitting device 200 identical to the device 136 disclosed in FIG. 12 and integrated into a package 30 as described in FIG. 2 for an AC drive Method according to an embodiment of the invention. The device 198 includes a reflective device integrated into the package 30 for optimized light dispersion. The light emitting device 200 may be facing down towards the reflector 202 and opposite direction of light output from the lens 194 if the reflector 202 is integrated into the package 30 properly for such a design.

Figure 27:
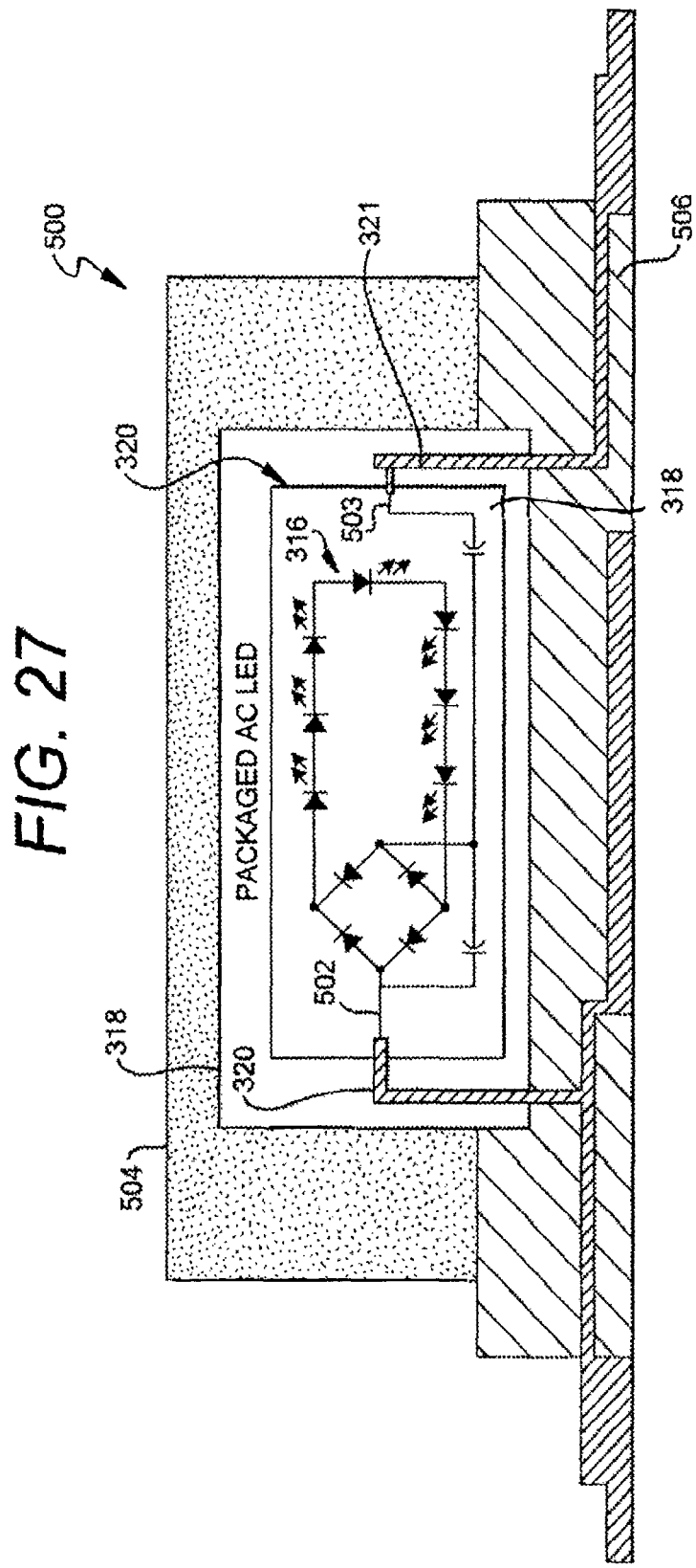
FIG. 27 shows a schematic view of a preferred embodiment of the present invention.

FIG. 27 discloses another schematic view diagram of a light emitting device 500 similar to that shown in FIG. 24 according to an embodiment of the invention. The device 500 includes the devices 316, 332 similar to those disclosed in FIGS. 16 and 18, mounted on an insulating substrate 318 such as but not necessarily ceramic or sapphire and integrated into an LED package 320 that may be various LED package sizes; materials and designs based of product specifications or on printed circuit board material. The device 500 provides power connection leads 502 and 503 which connect to package power connect leads 322 and 323 and may have a first or additional lens 504 that may be made of a plastic, polymer or other material used for light dispersion and the lens may be coated or doped with a phosphor or nanocrystals that would produce a change in the color or quality of light emitted from the device through the lens 504. Power connection 322 may be connected to heat sink 506 and may be of a heavier gauge within the device than other conductors.

Figure 28:
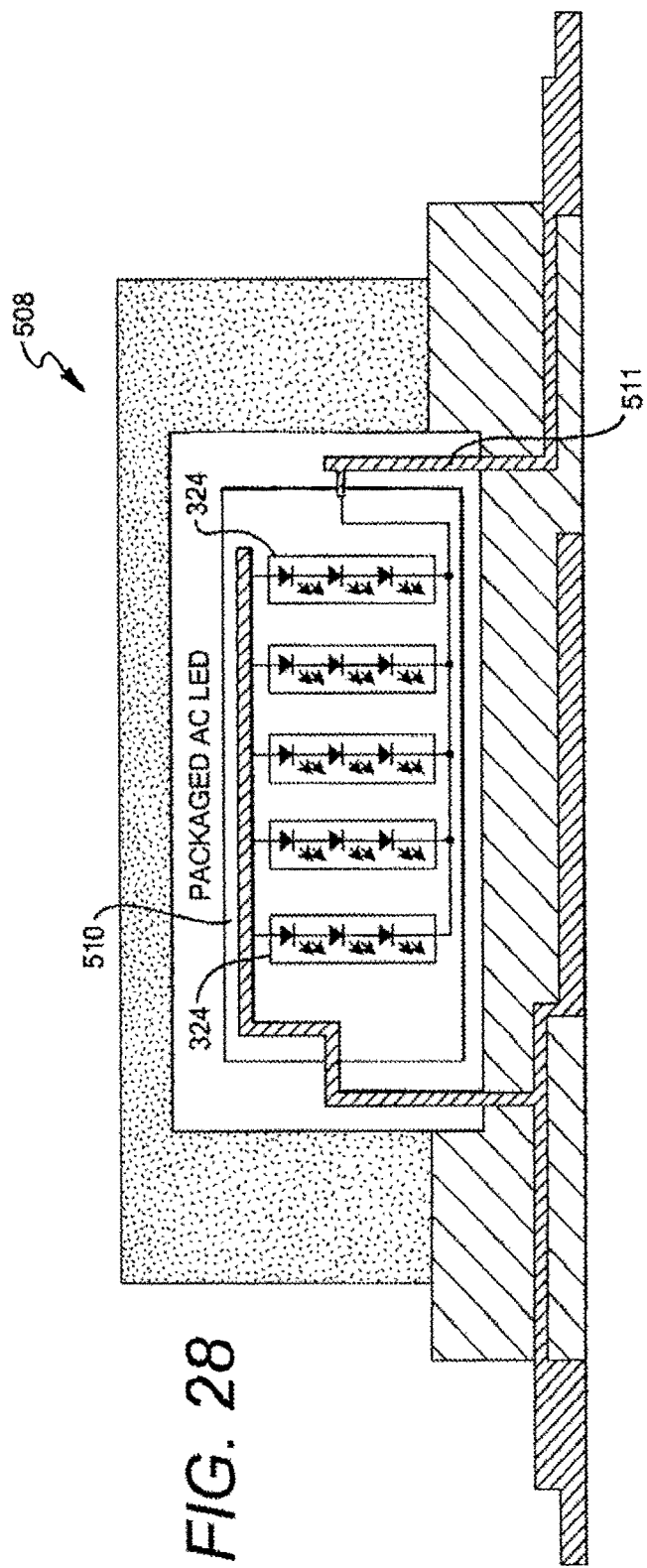
FIG. 28 shows a schematic view of a preferred embodiment of the present invention.

FIG. 28 discloses another schematic view diagram of a light emitting device 508 similar to that shown in FIG. 26. Device 508 is contemplated for use in embodiments where the rectifier is discretely packaged or included as part of AC drive Method 170 or 186. In device 508, power connection leads 510 and 511 connect to the outputs of rectifier 302 (not shown) to provide power to LED packages 324.

Figure 29:
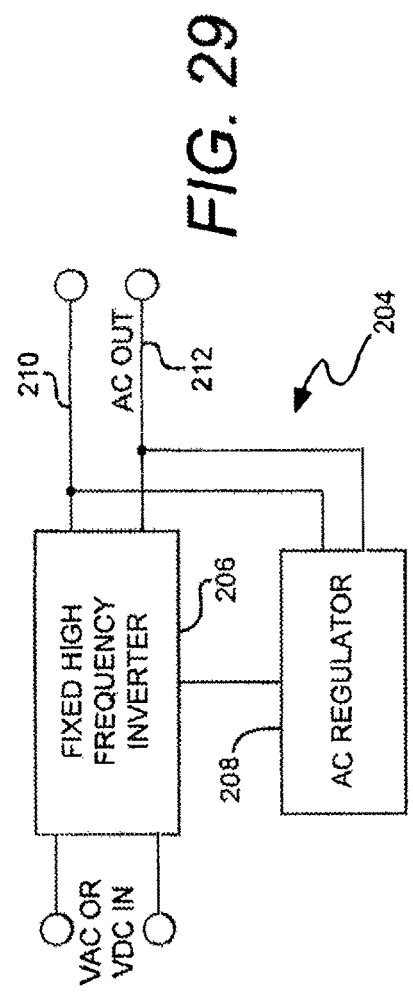
FIG. 29 shows a schematic view of a preferred embodiment of the invention.
Figure 30A:
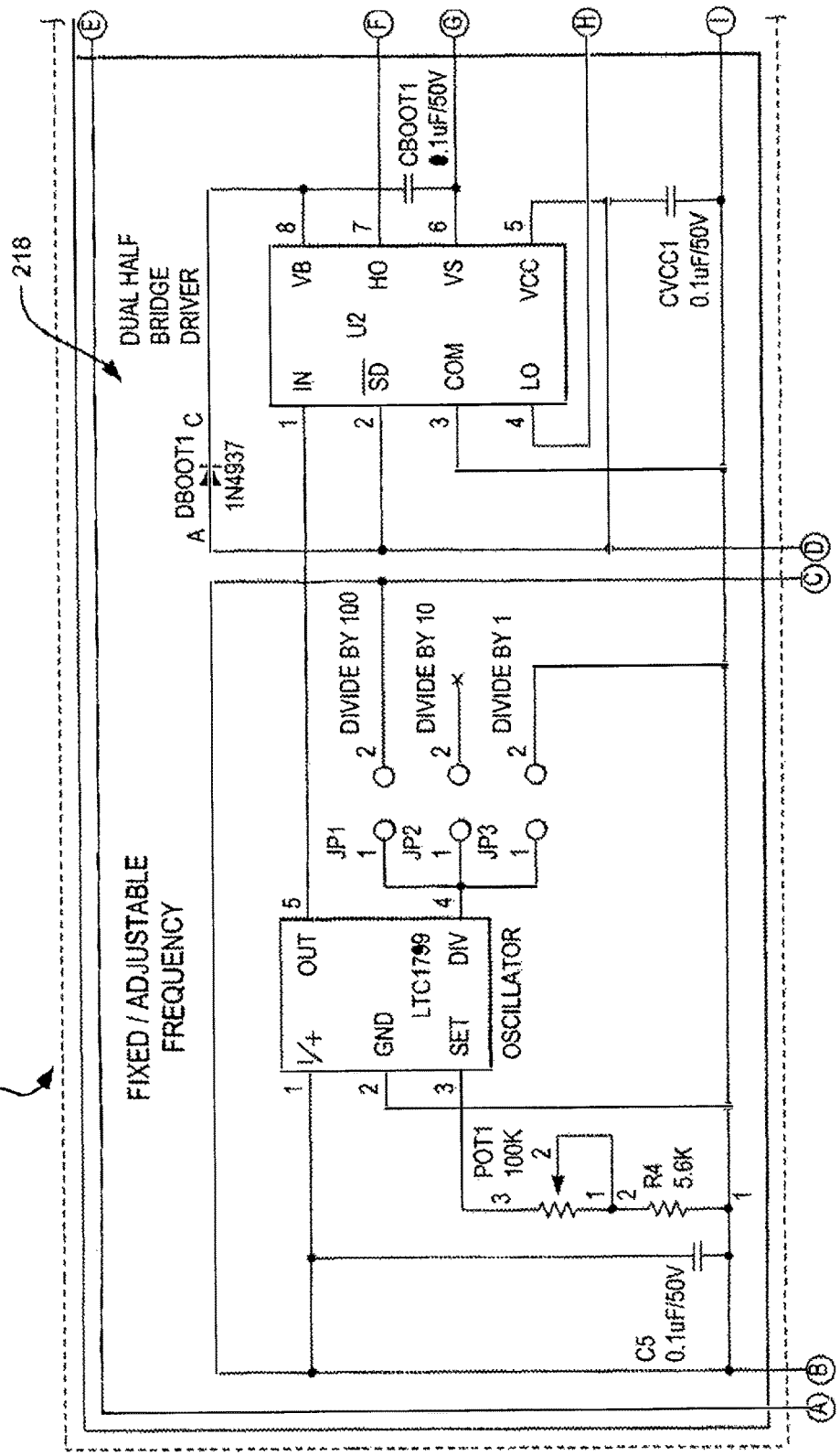
FIG. 30A shows a schematic view of a preferred embodiment of the invention.
Figure 30B:
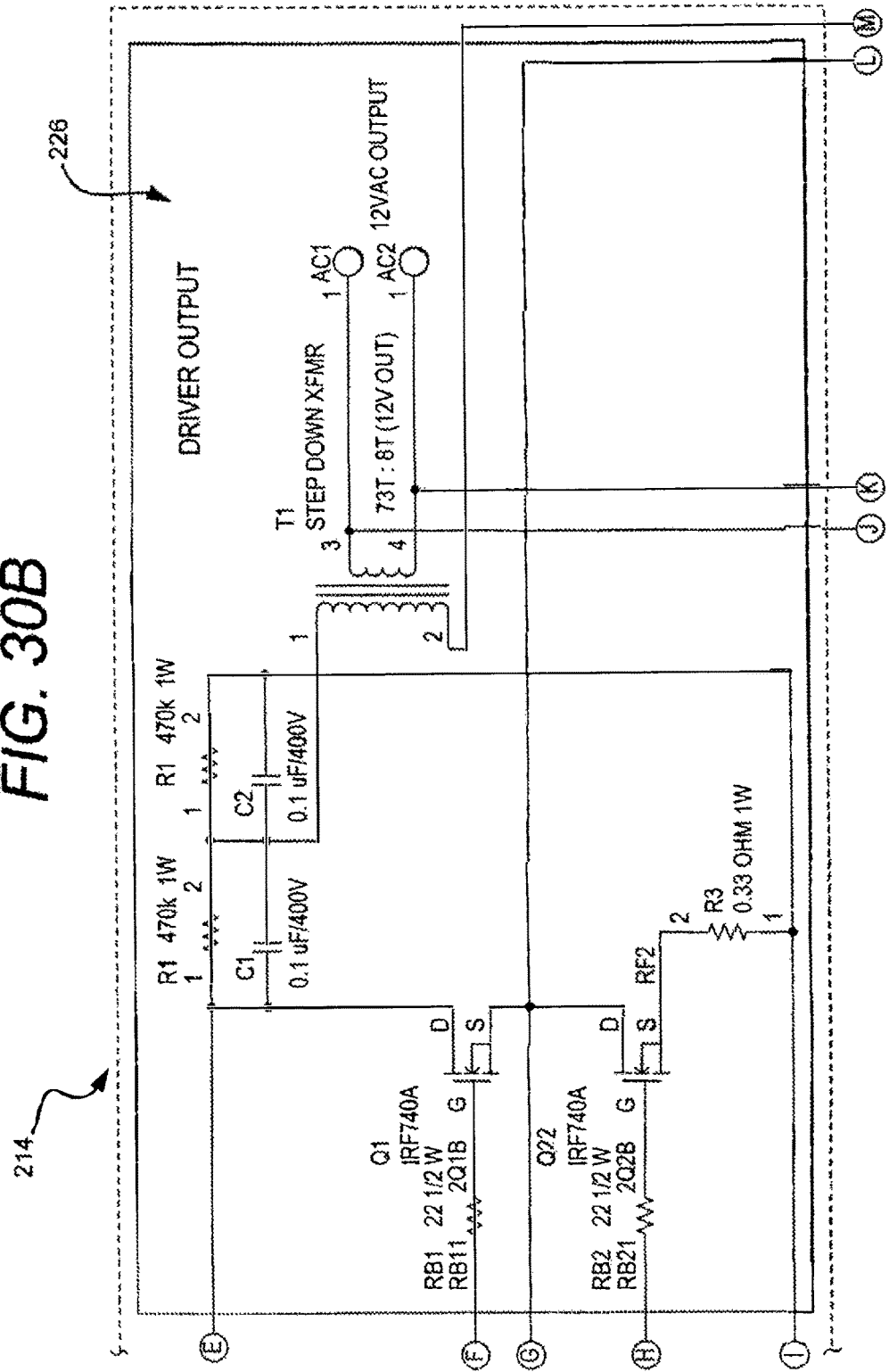
FIG. 30B shows a schematic view of a preferred embodiment of the invention.
Figure 30C:
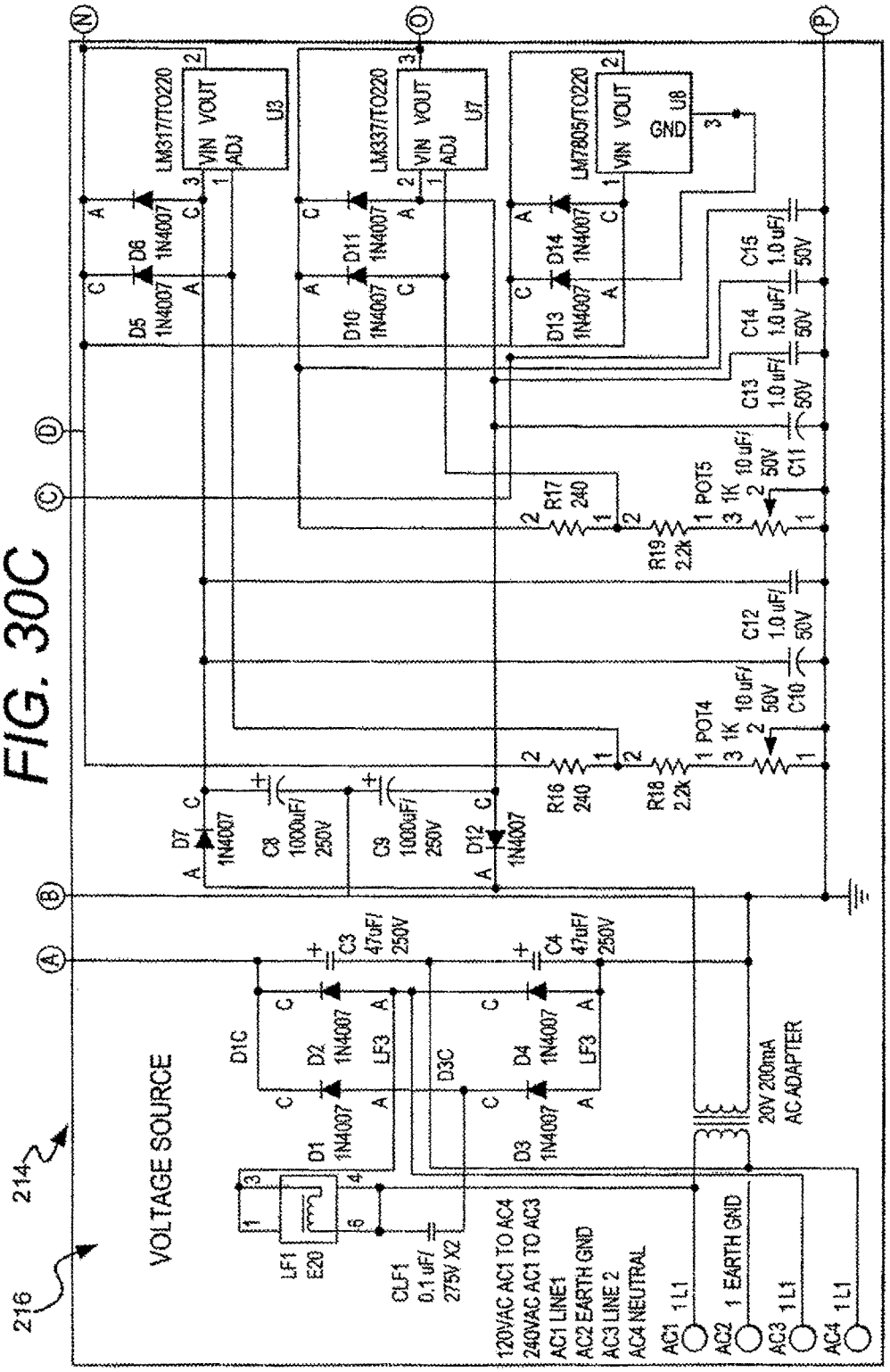
FIG. 30C shows a schematic view of a preferred embodiment of the invention.
Figure 30D:
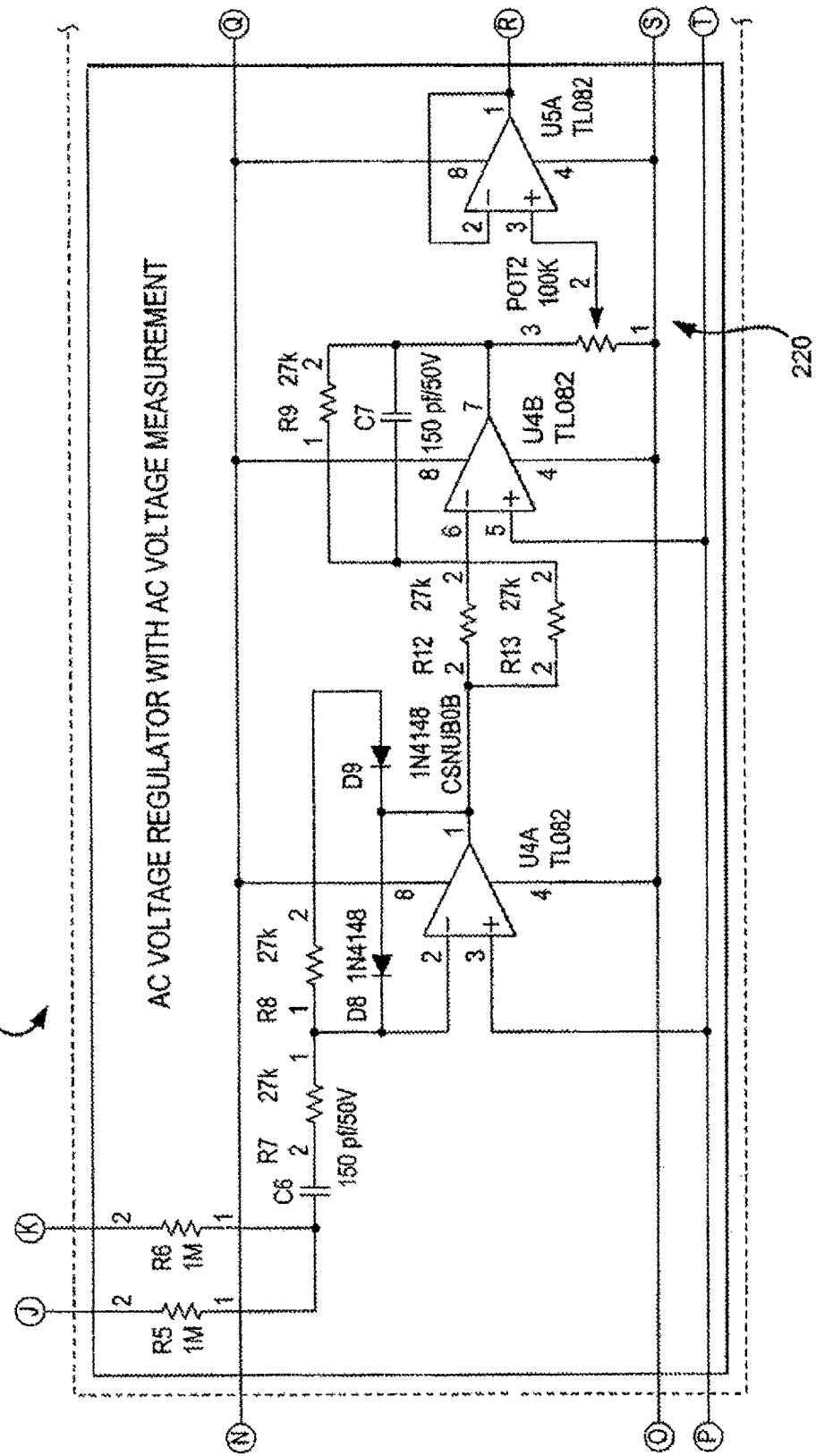
FIG. 30D shows a schematic view of a preferred embodiment of the invention.
Figure 30E:
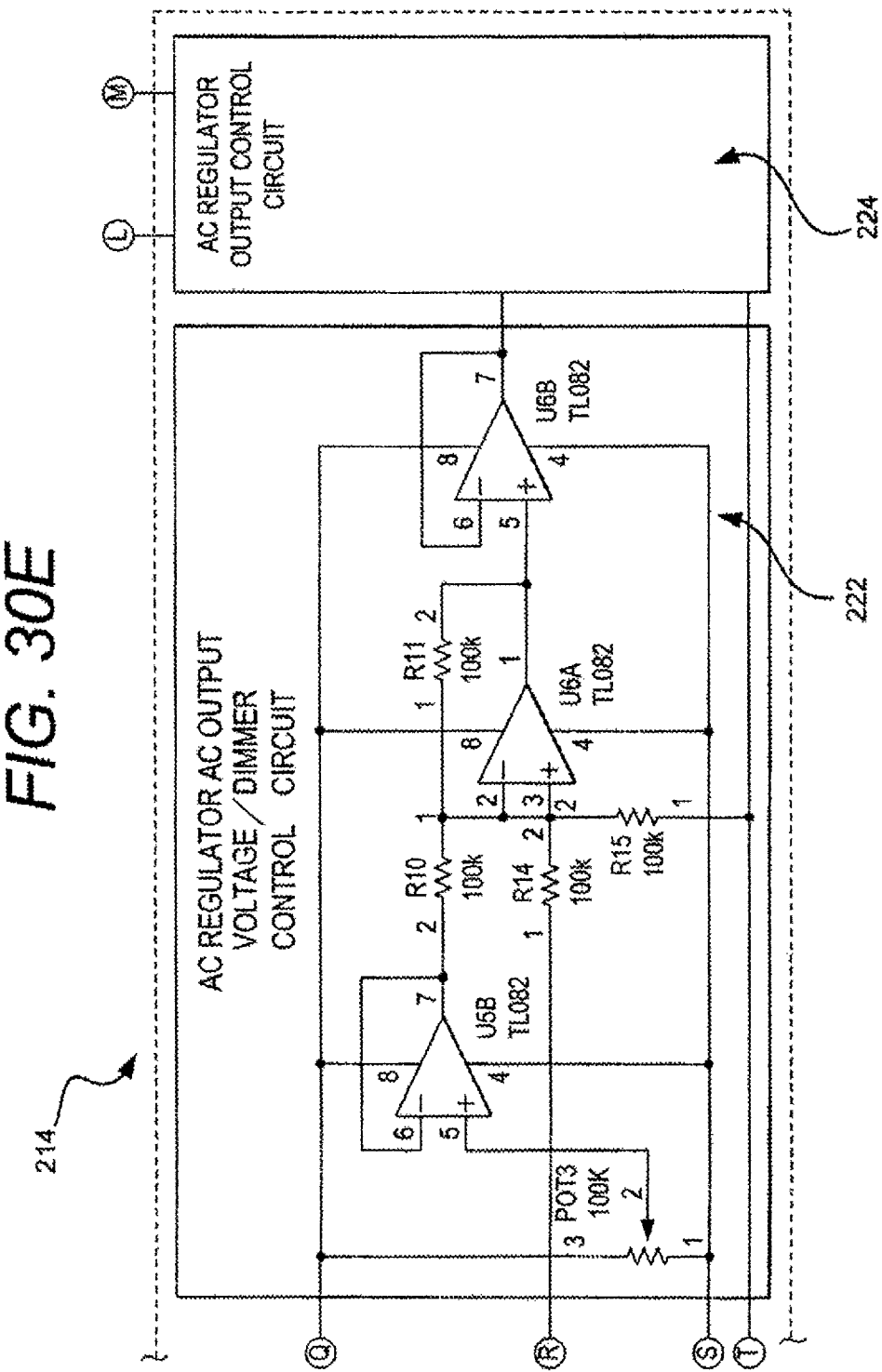
FIG. 30E shows a schematic view of a preferred embodiment of the invention.

FIG. 29 shows a block diagram of an LED circuit driver 204 having a high frequency inverter 206 stage that provides a relatively constant voltage and relatively constant frequency output. The high frequency inverter 206 stage has an internal dual half bridge driver with an internal or external voltage controlled oscillator that can be set to a voltage that fixes the frequency. A resistor or center tapped series resistor diode network within the high frequency inverter 206 stage feeds back a voltage signal to the set terminal input of the oscillator. An AC regulator 208 senses changes to the load at the output lines 210 and 212 of the inverter 206 and feeds back a voltage signal to the inverter 208 in response changes in the load which makes adjustments accordingly to maintain a relatively constant voltage output with the relatively constant frequency output.

FIG. 30 shows a schematic diagram of an LED circuit driver 214 having a voltage source stage 216, a fixed/adjustable frequency stage 218, an AC voltage regulator and measurement stage 220, an AC level response control stage 222, an AC regulator output control stage 224 and a driver output stage 226.

Figure 31:
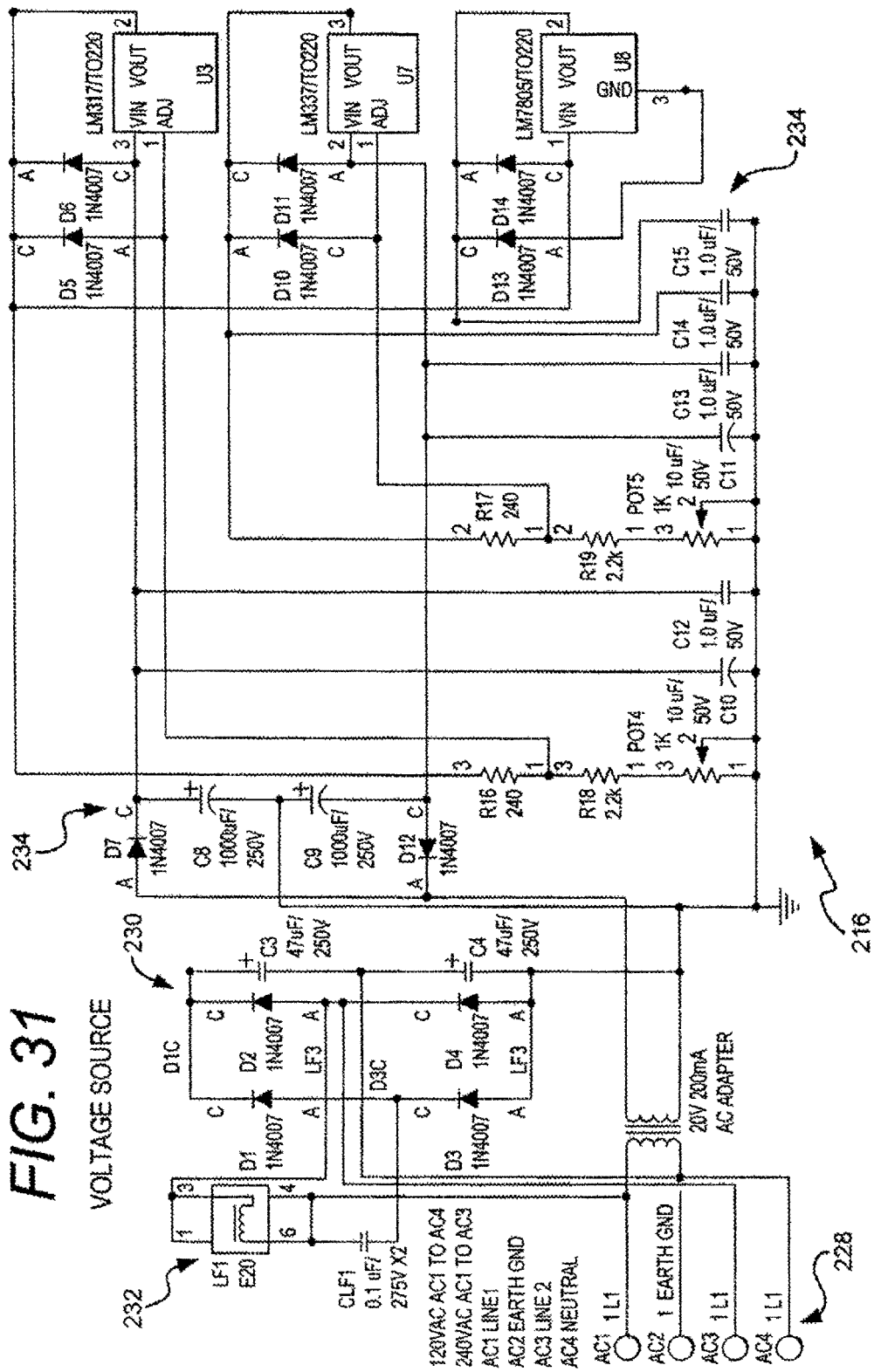
FIG. 31 shows a schematic view of a preferred embodiment of the invention.

FIG. 31 shows a schematic diagram of the voltage source stage 216 described in FIG. 20. The voltage source stage 216 provides universal AC mains inputs 228 that drive a diode bridge 230 used to deliver DC to the LED circuit driver system 214. Direct DC could eliminate the need for the universal AC input 228. Power factor correction means 232 may be integrated into the LED circuit driver 216 as part of the circuit. The voltage source stage 216 includes a low voltage source circuit 234 that may include more than one voltage and polarity.

Figure 32:
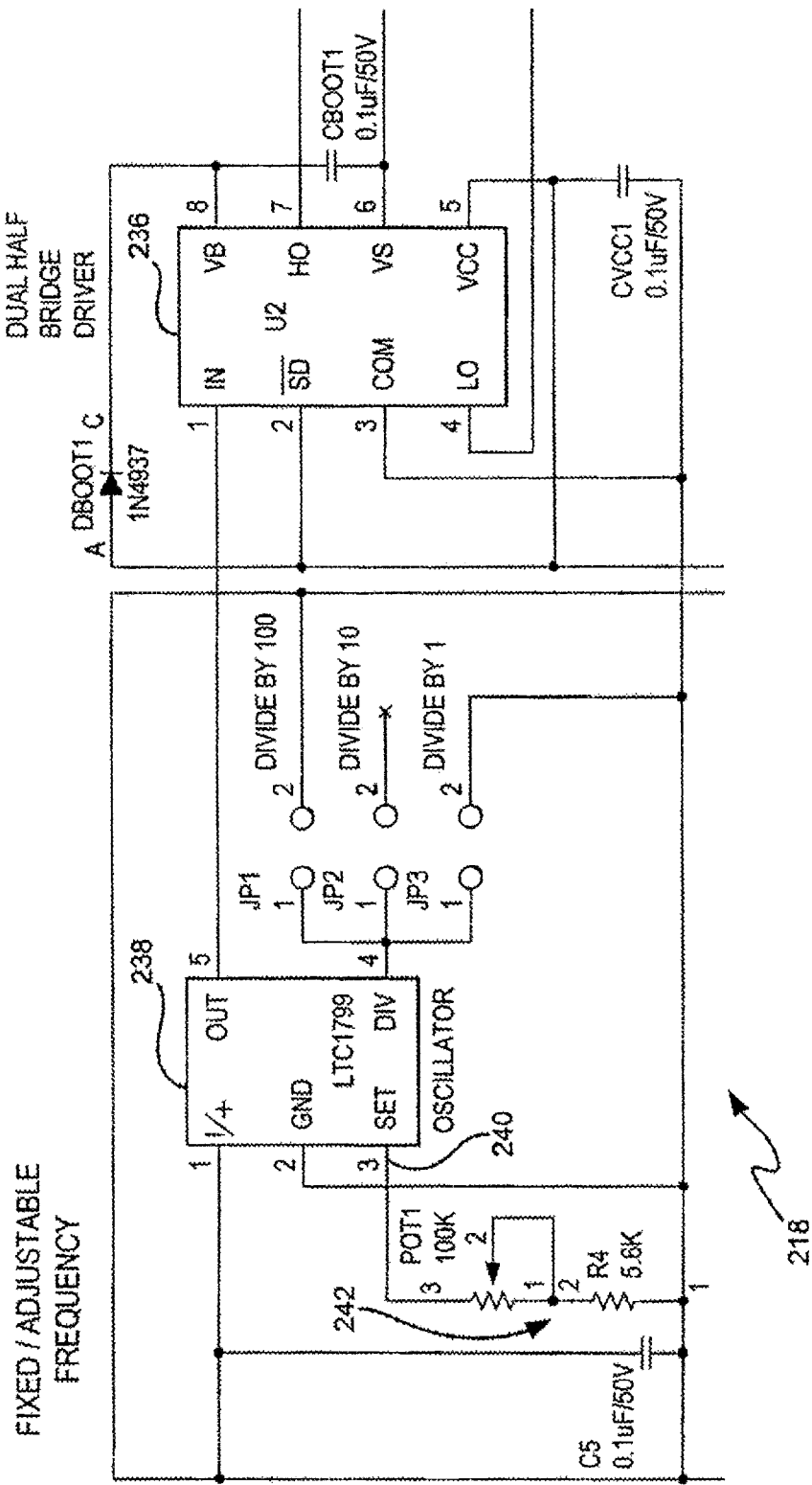
FIG. 32 shows a schematic view of a preferred embodiment of the invention.

FIG. 32 shows a schematic diagram of the fixed/adjustable frequency stage 218 as described in FIG. 20. The fixed/adjustable frequency stage 218 includes a bridge driver 236 that may include an integrated or external voltage controlled oscillator 238. The oscillator 238 has a set input pin 240 that sets the frequency of the oscillator to a fixed frequency through the use of a resistor or adjustable resistor 242 to ground. The adjustable resistor 242 allows for adjusting the fixed frequency to a different desired value through manual or digital control but keeps the frequency relatively constant based on the voltage at the set terminal 240.

Figure 33:
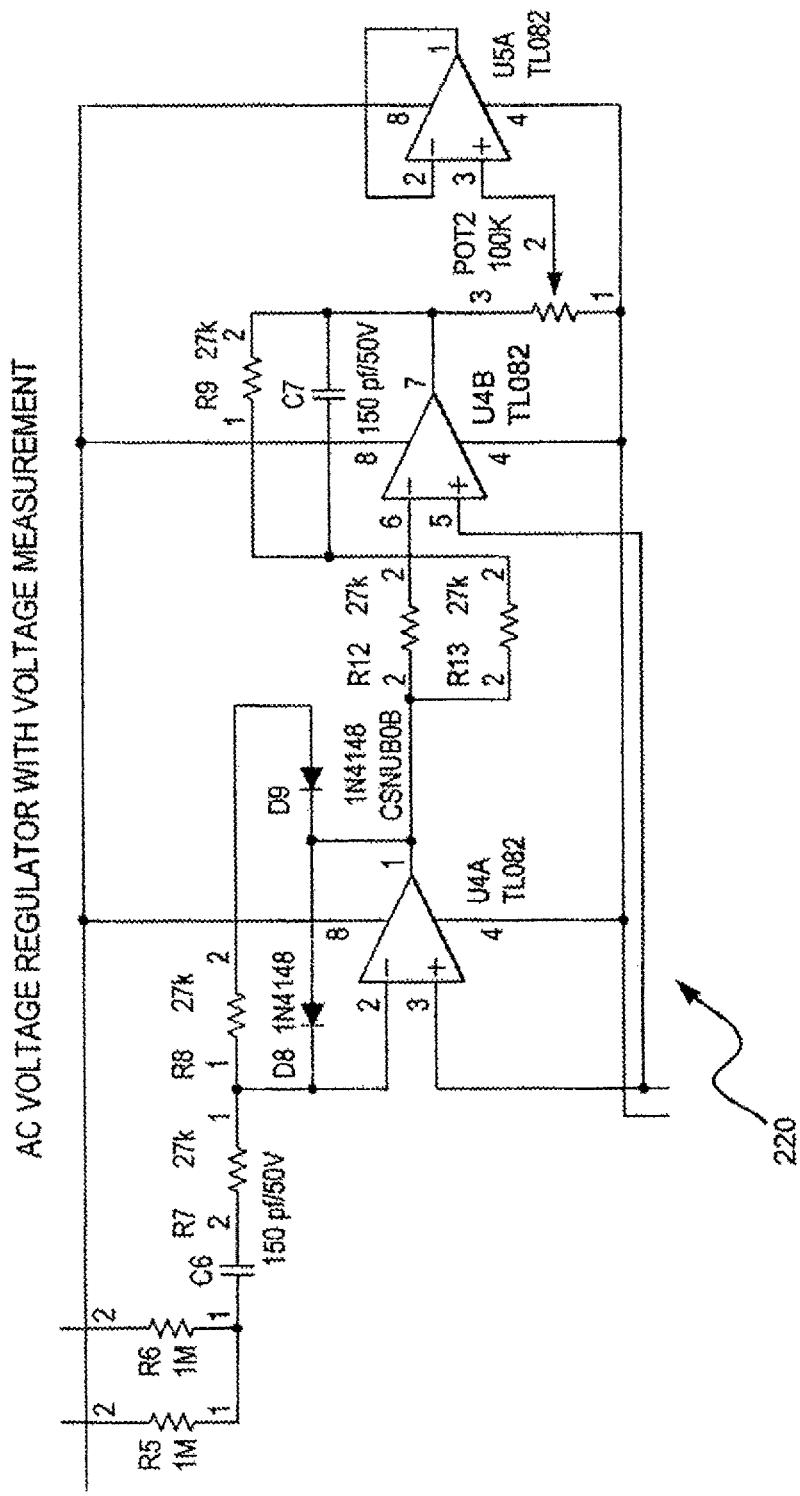
FIG. 33 shows a schematic view of a preferred embodiment of the invention.

FIG. 33 is a schematic diagram of the AC voltage regulator with voltage measurement stage 220 as described in FIG. 20. The AC voltage regulator with voltage measurement circuit 220 monitors the voltage at the driver output 226 as shown in FIG. 20 and sends a voltage level signal to the AC level response control stage 222 as shown in FIG. 20.

Figure 34:
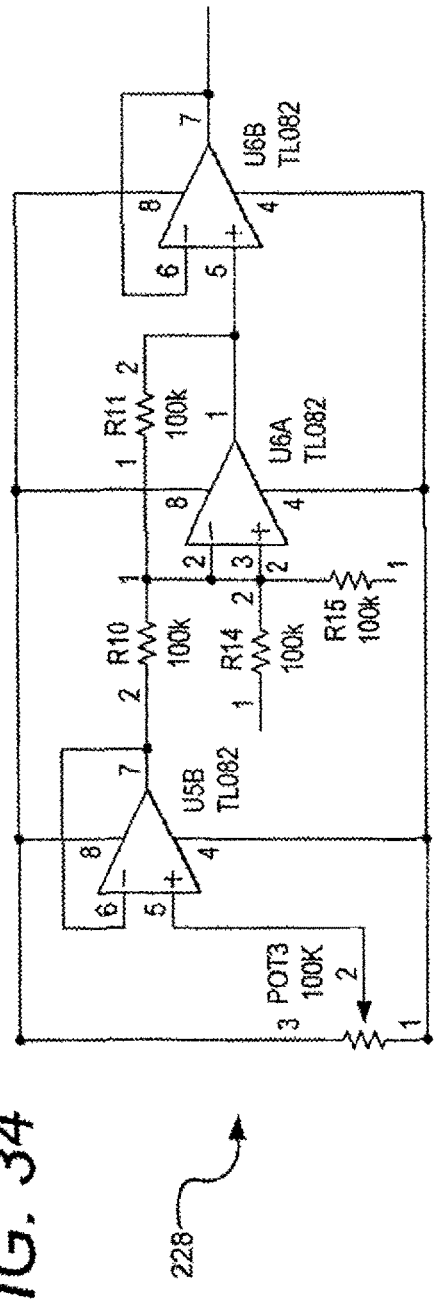
FIG. 34 shows a schematic view of a preferred embodiment of the invention.

FIG. 34 is a schematic diagram of the AC level response control 228 stage. The AC level response control stage 228 receives a voltage level signal from the AC voltage regulator with voltage measurement circuit 220 as shown in FIG. 23 and drives the AC regulator output control stage 224 as shown in FIG. 20.

Figure 35:
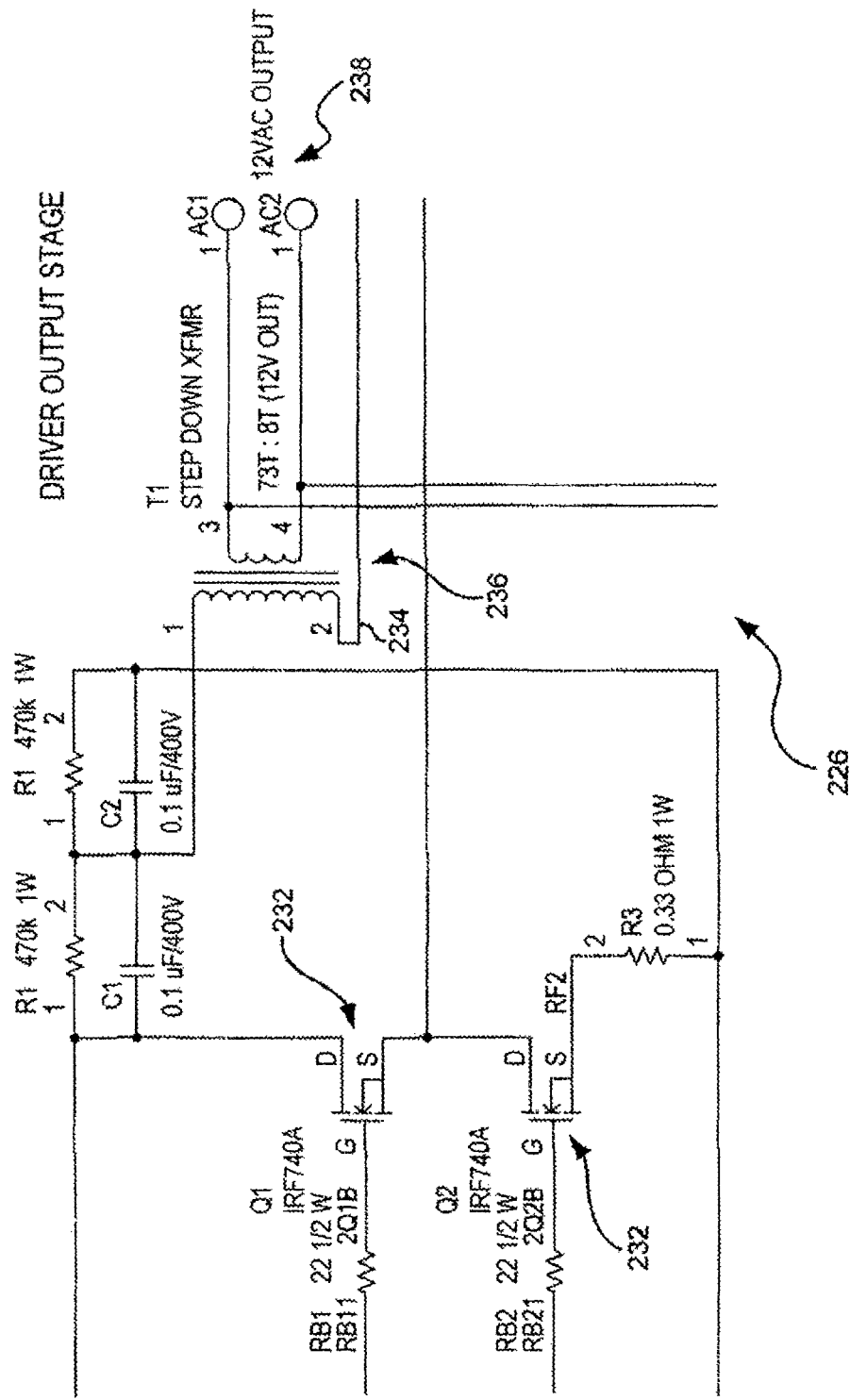
FIG. 35 shows a schematic view of a preferred embodiment of the invention.

FIG. 35 is a schematic diagram of the AC regulator output control stage 230. The AC regulator output control stage 230 varies the resistance between the junction of the drive transistors 232 and the transformer input pin 234 of the driver output 226 as shown in FIG. 26. The AC regulator output control stage 230 is a circuit or component such as but not necessarily a transistor, a voltage dependent resistor or a current dependent resistor circuit having a means of varying its resistance in response to the voltage or current delivered to it.

Figure 36:
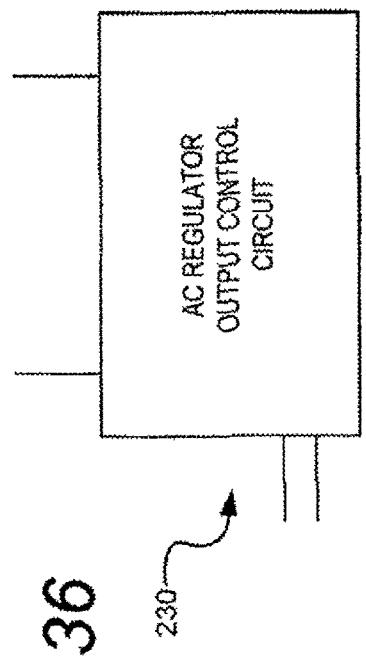
FIG. 36 shows a schematic view of a preferred embodiment of the invention.

FIG. 36 is a schematic diagram of the driver output stage 226. The driver output stage 226 includes drive transistors 232 and the transformer 236 that delivers an AC voltage output 238 to LED circuits at a relatively constant voltage and frequency.

Figure 37:
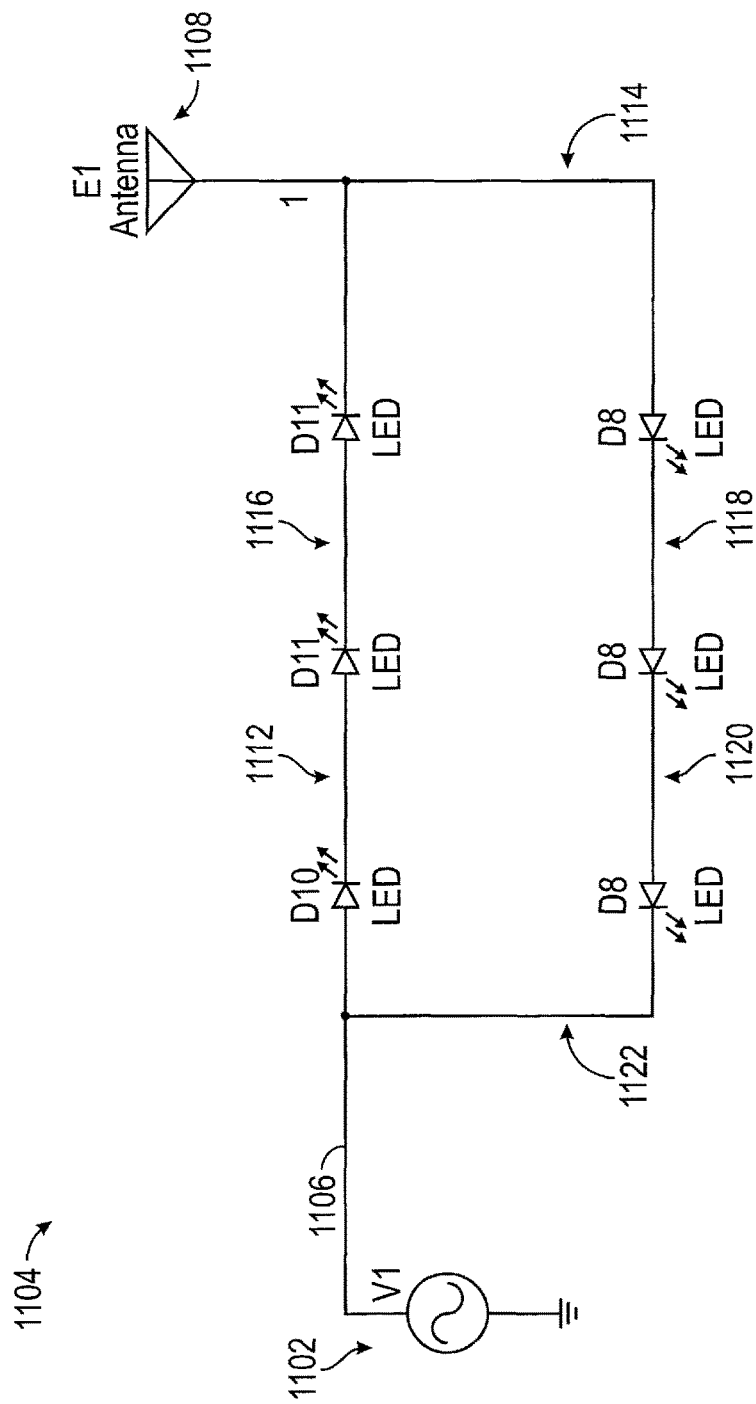
FIG. 37 shows a schematic view of a preferred embodiment of the invention.
Figure 38:
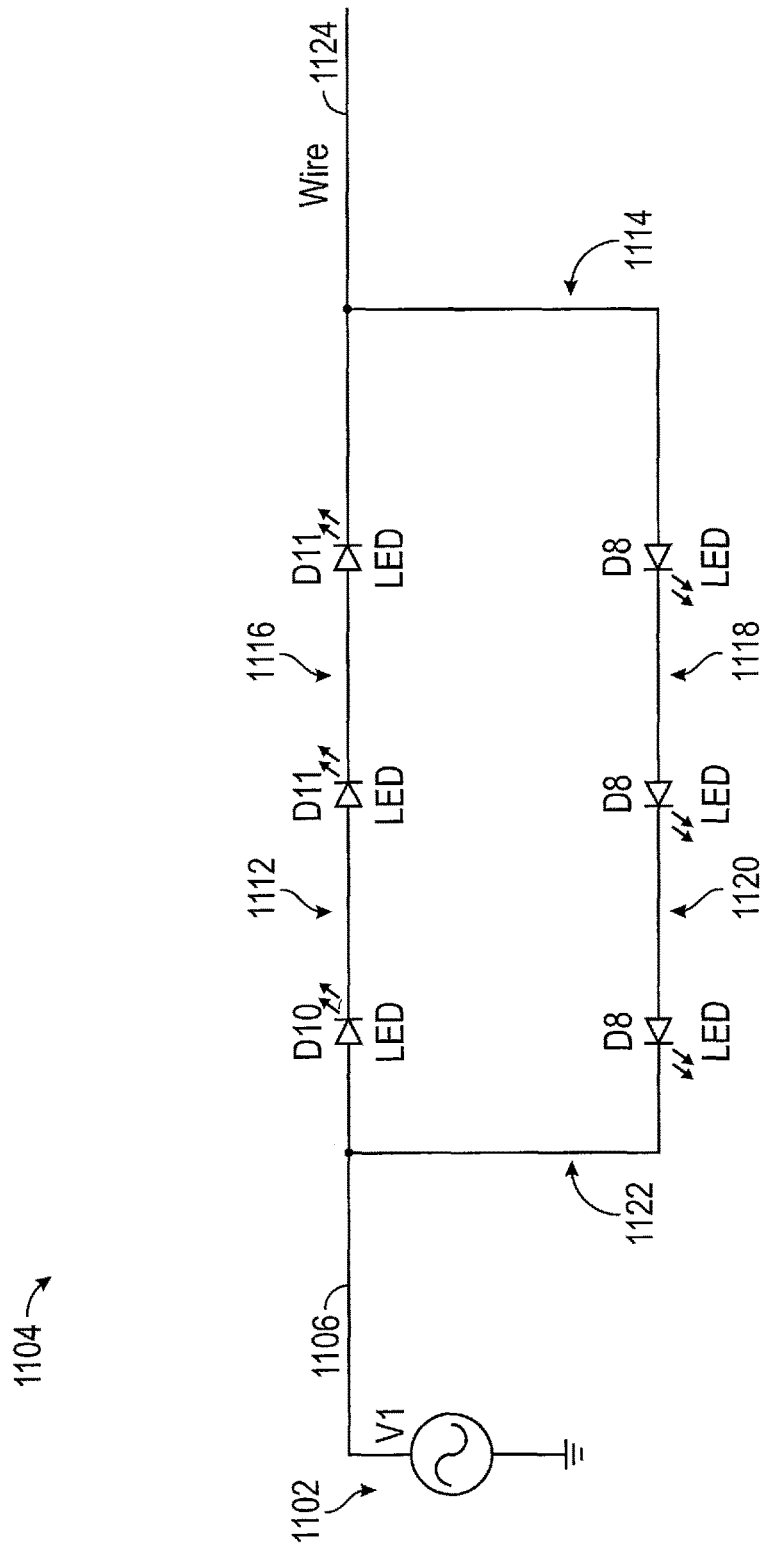
FIG. 38 shows a schematic view of a preferred embodiment of the invention.

FIGS. 37 and 38 discloses a circuit 1104 to illustrate another aspect of the invention. Accordingly, an alternating electric field is provided to a first transmission conductor by a signal generator 1102 and a second transmission conductor is provided by an antenna 1108 (see FIG. 37) or wire 1124 (see FIG. 38) that is connected to a relatively less positive side 1114-1122 within the directional circuit 1110. A difference in DC potential between a relatively more positive side 1112 within the directional circuit, and relatively less positive side 1114-1122 is provided. Another aspect of the invention is sensing proximity with impedance changes within the directional circuits described herein (as it could be with any embodiment disclosed herein) by approaching any of the directional circuits or transmission conductors (also any of which are described herein), for example approaching 1108 (shown in FIG. 37) and/or 1124 (as shown in FIG. 38) with a conductive substance such as a person, including the touch of a person (human touch), or metallic material thereby changing the circulation of current flow within the directional circuit by changes in impedance through the capacitance of the conductive substance.

Figure 39:
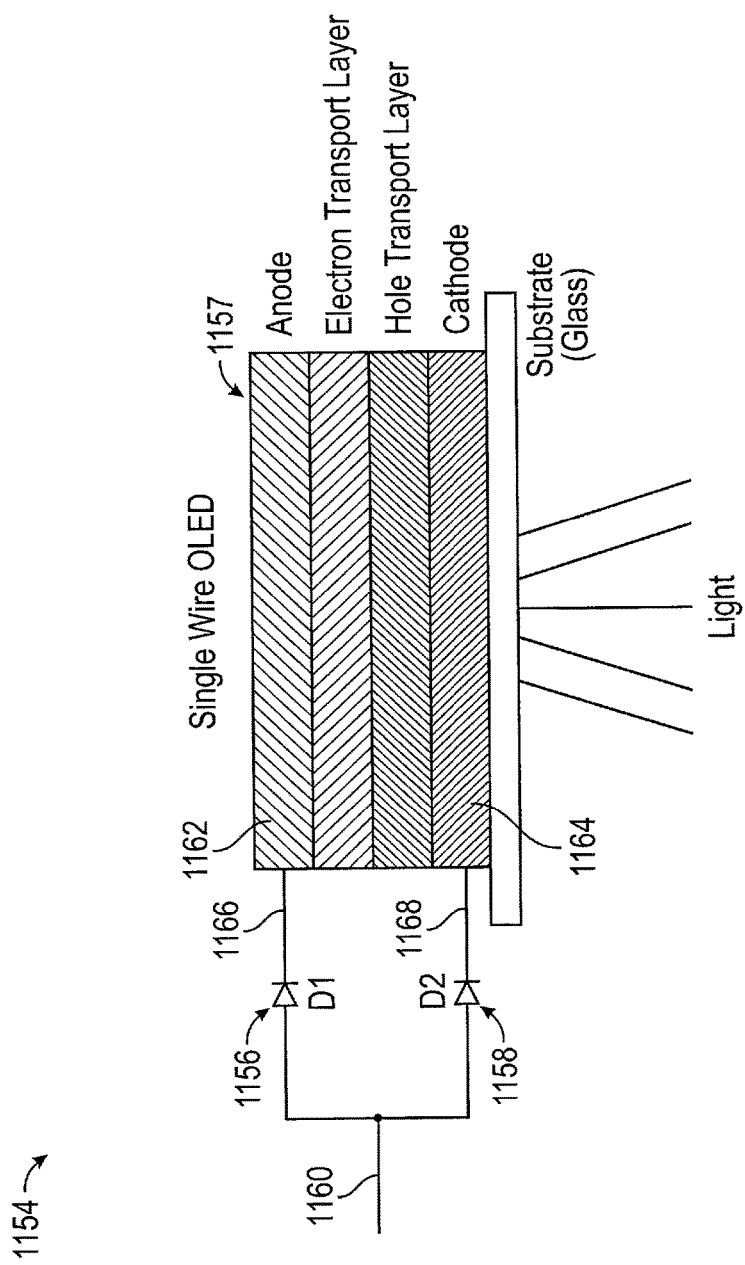
FIG. 39 shows a schematic view of a preferred embodiment of the invention.
Figure 40:
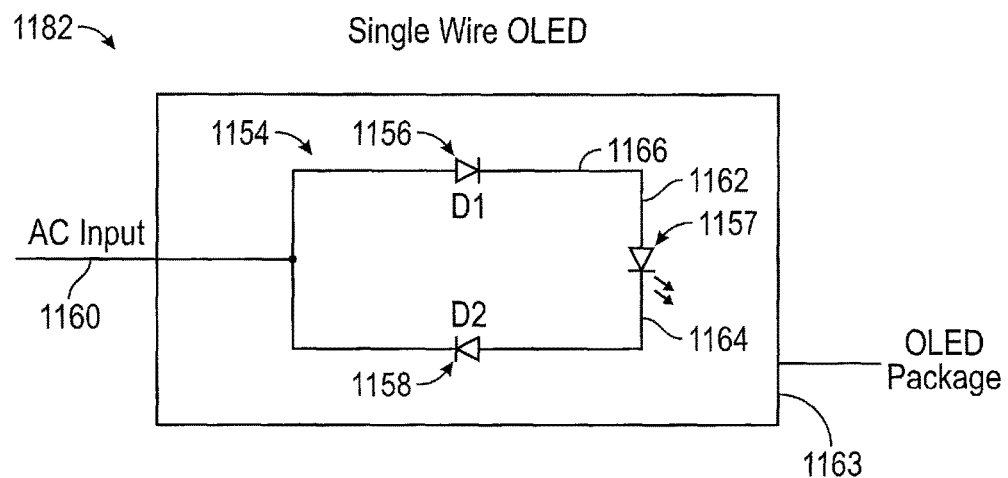
FIG. 40 shows a schematic view of a preferred embodiment of the invention.
Figure 41:
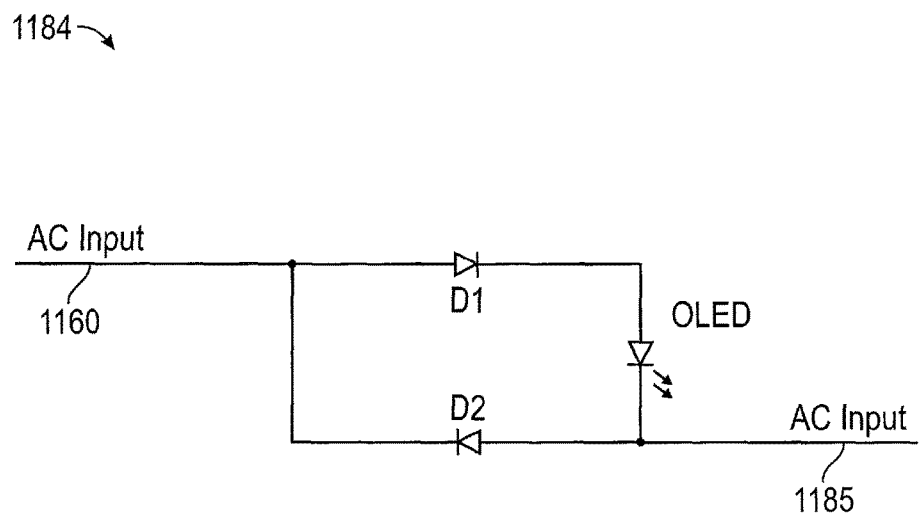
FIG. 41 shows a schematic view of a preferred embodiment of the invention.

FIGS. 39, and 40-41 disclose another embodiment of the invention having a directional organic light emitting diode ("OLEO") circuit 1154 that includes a first diode D1 1156, a second diode D2 1158, and an OLED 1157. The first diode D1 1156 has an anode and the second diode D2 1158 has a cathode, which are commonly connected to a input transmission conductor 1160. The cathode of diode D1 1156 is connected to the relatively more positive side 1162 anode of an OLED 1157 while the anode of diode D2 11 is connected to the relatively less positive side cathode 1164 of the OLED 1157 to form the loop circuit 1154 among the diodes D1, D2 and the OLED 1157. The directional OLEO circuit 154 is a loop circuit which includes one or more circuit elements (e.g. diodes or OLEDs 1156, 1157 and 1158) causing the loop circuit to be asymmetric to current flow. Circuit element 1157 is an OLED. The directional OLEO circuit 1154 does not have a continuous conductive path to earth ground, or battery ground. The directional OLEO circuit 1154 develops a DC potential in response to a alternating electric field imposed on input 1160. The directional OLEO circuit 1154 is self referencing between a relatively high potential output and a relatively lower potential output. The directional OLEO circuit 1154 has a resistance, inductance and capacitance that is responsive to the voltage and frequency of the alternating electric field. The directional OLEO circuit 1154 has transmission conductors 1166,1168 connected to the directional OLEO circuit 1154.

FIG. 40 discloses a circuit 1182 with the same embodiment of the invention shown in FIG. 39 (see FIG. 39) encasing the directional OLEO circuit 1154 within a package 1163.

FIG. 41 discloses a circuit 1184 with the same embodiment of the invention shown in FIG. 39 (see FIG. 39) with a second transmission conductor 1185 providing an input within the directional circuit 1184 at a point other than the input of the first transmission conductor input of 1160. The transmission conductors 1160 and 1185 (or any transmission conductors described herein) can act as an antenna and cause the directional OLEO circuit 1184 to react to the proximity of conductive substances near the transmission conductors 1160 and 1185. In preferred embodiments, the circuits disclosed in FIGS. 39-41 and 43 below may be connected to ground through capacitance at a point within the directional circuit such as transmission conductor 1185 (e.g. FIG. 41). This ground connection seems to provide increased circulation current, as it is noted that the OLEDs get brighter for a given alternating electromagnetic source.

Figure 42:
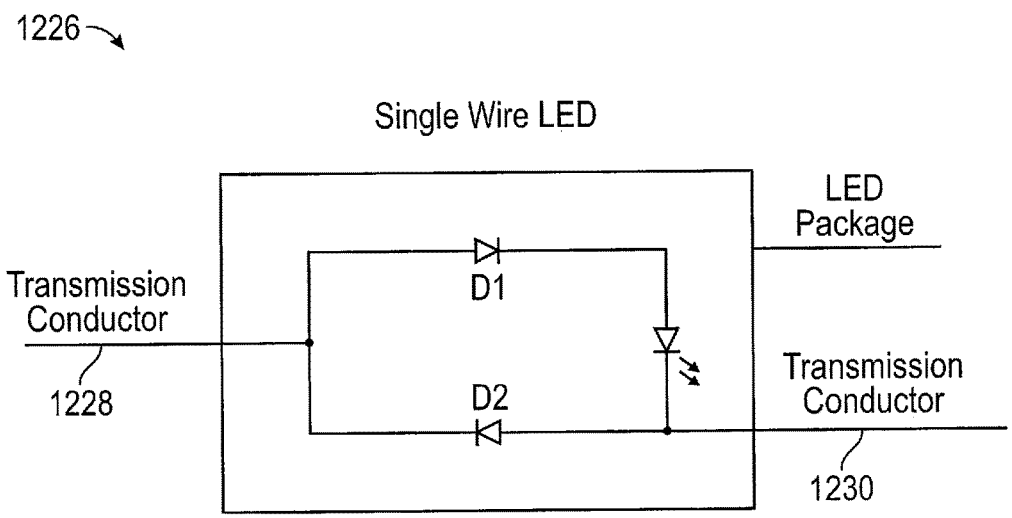
FIG. 42 shows a schematic view of a preferred embodiment of the invention.

FIG. 42 discloses a circuit 1226 identical to circuit 1210 but that the circuit has a first transmission conductor 1228 and a second transmission conductor 1230. Each transmission conductor 1228,230 can be driven with an alternating electric field and can cause the circuit 1226 to react to the proximity of a conductive substance that approaches the transmission conductors 1228 and 1230 with only one or both conductors being driven.

Figure 43:
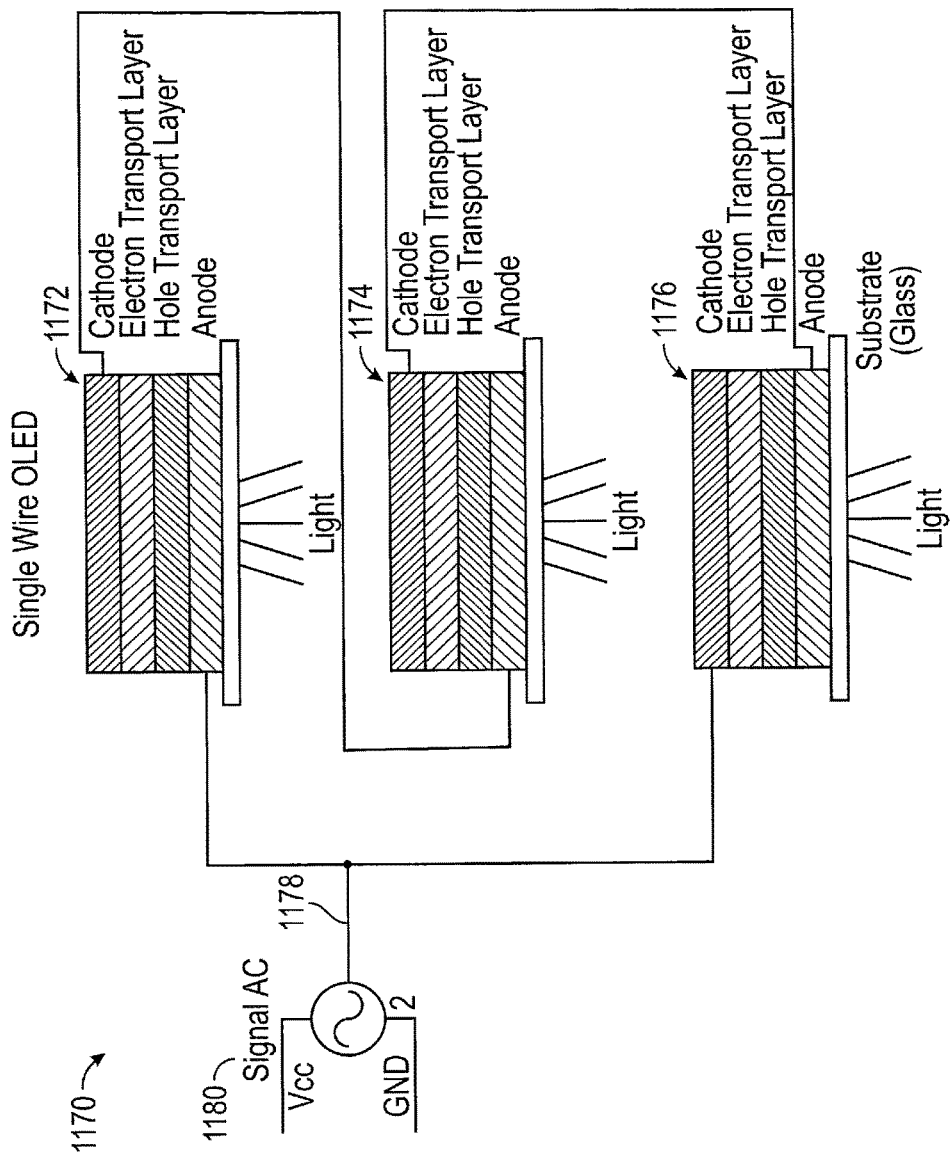
FIG. 43 shows a schematic view of a preferred embodiment of the invention.

FIG. 43 discloses another embodiment of the invention having a directional organic light emitting diode ("OLEO") circuit 1170 that includes a first OLEO 1172, a second OLEO 1174, and a third OLEO 1176. The first OLEO 1172 has an anode and the third OLEO 1176 has a cathode, which are commonly connected to an input transmission conductor 1178 having AC signal source from a signal generator 1180. The cathode of the first OLEO 1172 is connected to the anode of the second OLEO 1174 while the cathode of the second OLEO 1174 is connected to the anode of the third OLEO 1176 to form the loop circuit 1170 among the OLEDs 1, 2 and 3 (1172-1176). The directional OLEO circuit 1170 can be designed with more than 3 OLEDs.

Figure 44:
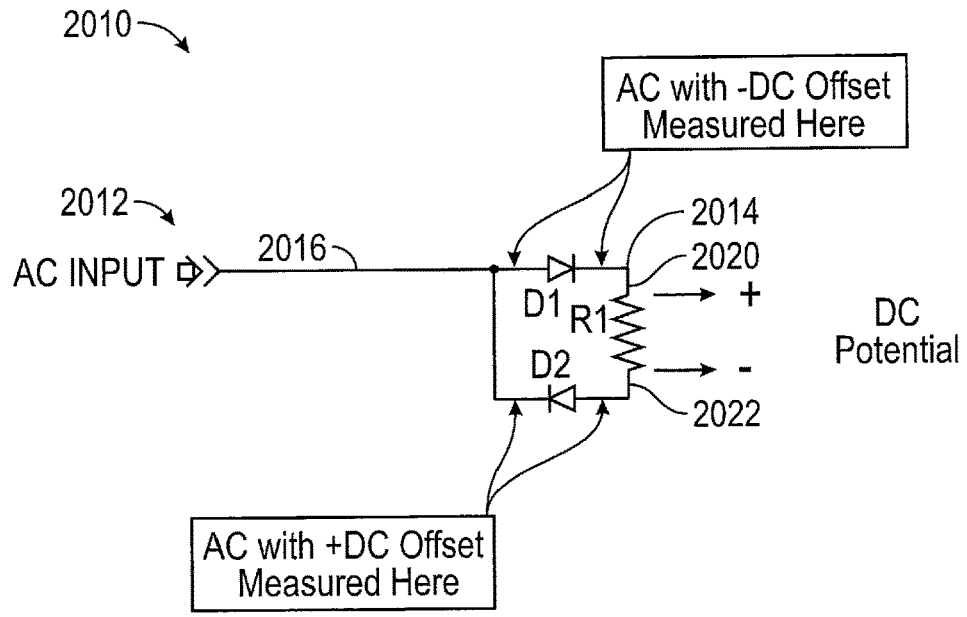
FIG. 44 shows a schematic view of a preferred embodiment of the invention.

FIG. 44 discloses a preferred circuit 2010 according to the invention. The circuit 2010 includes a first source for providing an alternating electric field. The source may be 120V or 240V line power, RF energy or the output of a standard AC signal generator such as generator 2012 of FIG. 44. This generator 2012 may produce its signal with reference to ground as indicated in FIG. 44. Circuit 2010 also discloses a directional circuit 2014 connected to the generator 2012 by a transmission conductor 2016. According to the invention the conductor 2016 may be any form of conventional conductive path whether twisted wire bundles, single wires, etc. The point is that the transmission conductor 2016 provides a single transmission path to the directional circuit 2014. Important to the invention is the fact that there is no conductive return path provided back from the directional circuit 2016 to the generator 2012.

In the broad sense, the directional circuit 2014 is a loop circuit which includes one or more circuit elements causing the loop circuit to be asymmetric to current flow. Again it is important that the directional circuit 2014 has no continuous conductive path to earth ground, or a battery ground. As such, and as disclosed in FIG. 44 the directional circuit 2014 develops a DC potential across a load, such as resistor R1 in response to the alternating electric field. This DC potential is not referenced to ground but merely to the potential differences created by the circulation of current (see FIG. 45) in the loop across the load (resistor R1 of FIG. 44). Accordingly, the DC potential is self referencing. As far as the resistor R1 is concerned, circuit 2010 presents it with a relatively higher DC potential output at 2020 and a relatively lower potential output at 2022.

Figure 45:
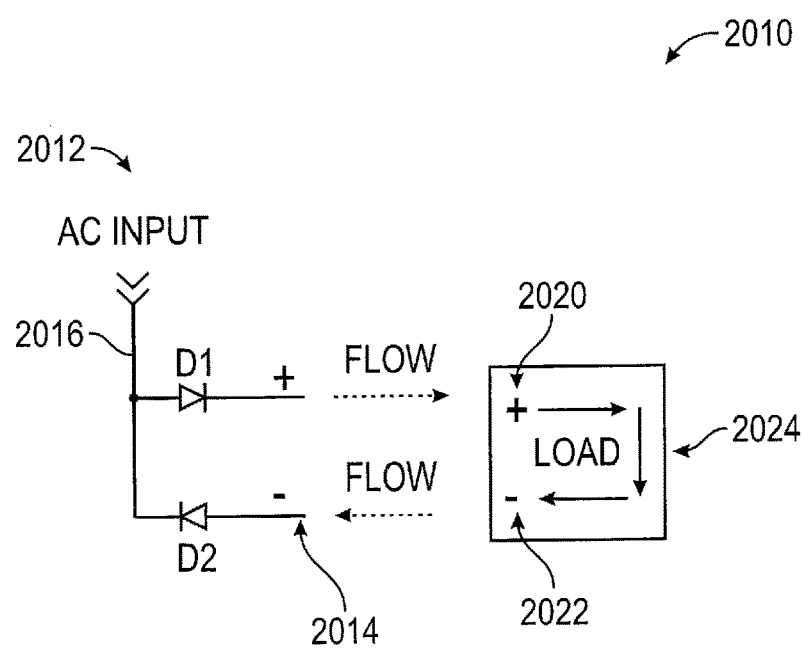
FIG. 45 shows a schematic view of a preferred embodiment of the invention.

FIG. 45 discloses circuit 2010 with the load represented as a generic load 2024 (rather than resistor R1) to show the circulation path of current flow (indicated by the arrows) in any generic load circuit utilizing the DC potential of circuit 2010.

FIGS. 44 and 45 disclose that the loads connected to the directional circuit 2014 do not have a continuous conductive path to earth ground or a battery ground. They also disclose that the directional circuit 2014 has circuit elements causing the directional circuit to be asymmetric to current flow. In the preferred embodiment disclosed, these circuit elements are diodes D1 and D2. However, it is contemplated that numerous other circuit elements could provide the same functionality, in particular, semiconductors with "pn" junctions; electrets, plasma, organic; or combinations thereof.

Figure 46:
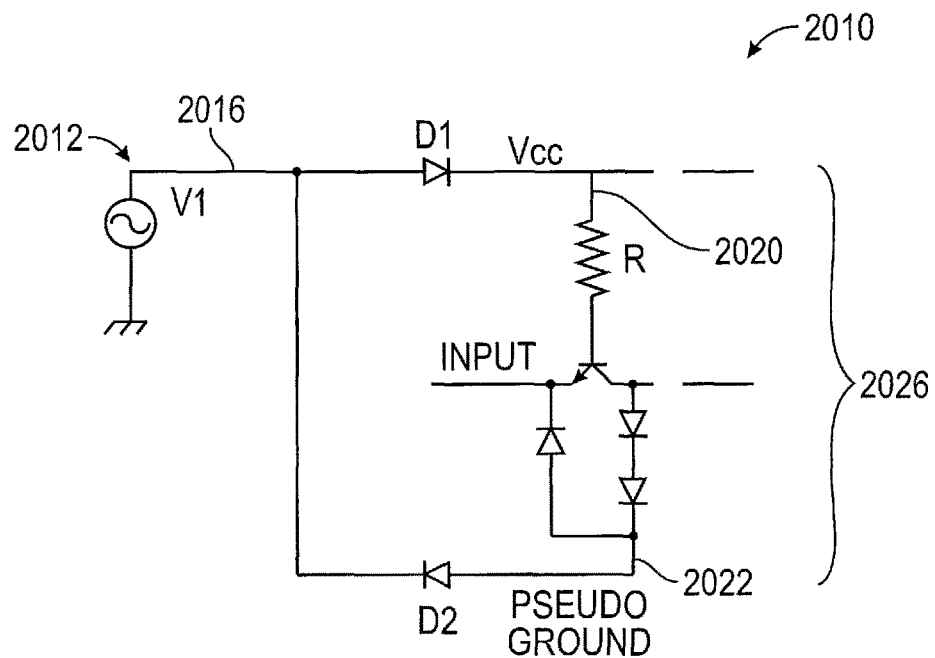
FIG. 46 shows a schematic view of a preferred embodiment of the invention.

The circuit 2010 is preferably used for delivering power and sensing proximity. The circuit 2010 is also preferably useful in TTL logic applications as disclosed in FIG. 46 showing a standard TTL logic output circuit 2026 powered by circuit 2010. In that application, the DC voltages necessary range from 0V to +/−5V.

FIGS. 44-46 each disclose that directional circuit 2014 includes first and second diodes D1 and D2, with D1 having an anode and diode D2 having a cathode which are commonly connected to the transmission conductor 2016. the cathode of the first diode D1 is connected to the relatively more positive side of the load 2020 while the anode of the second diode is connected to the relatively less positive side load 2022 to form the directional loop circuit among the diodes and the load.

Figure 47:
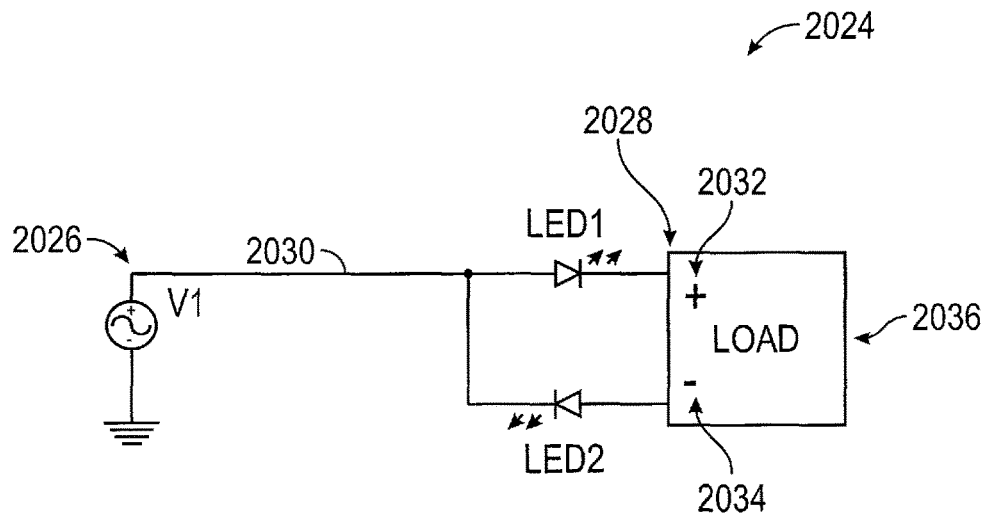
FIG. 47 shows a schematic view of a preferred embodiment of the invention.

FIG. 47 discloses a circuit 2024 according to the invention having a standard AC signal generator 2026 and a directional circuit 2028 includes first and second light emitting diodes (LEDs), the first LED 1 has an anode and the second LED 2 has a cathode, which are commonly connected to the conductor 2030 from the generator 2026. The cathode of LED 1 is connected to the relatively more positive voltage side 2032 of the load 2036 while the anode of LED 2 is connected to the relatively less positive side 2034 of the load 2036 to form the loop circuit 2028 among the LEDs 1 and 2. In this embodiment the load is configured to optimize the lumen produced by the directional circuit, for example the LEDs 1, 2 used to deliver power to the load 2036 which can be a third LED as shown in FIG. 48.

Figure 48:
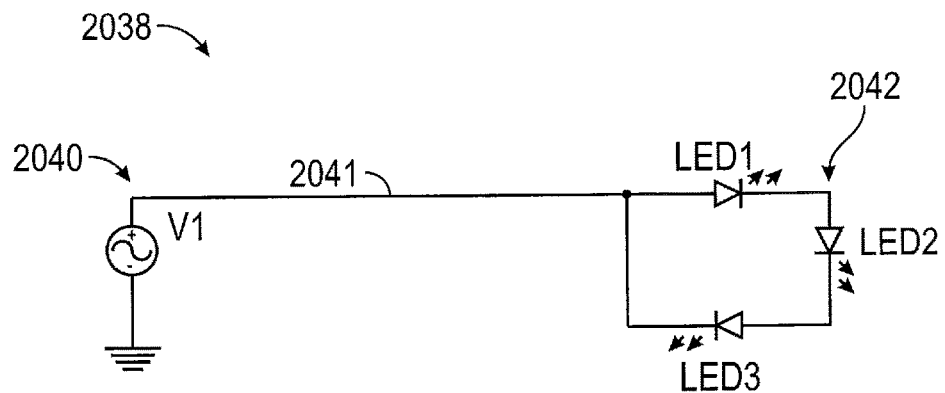
FIG. 48 shows a schematic view of a preferred embodiment of the invention.
Figure 49:
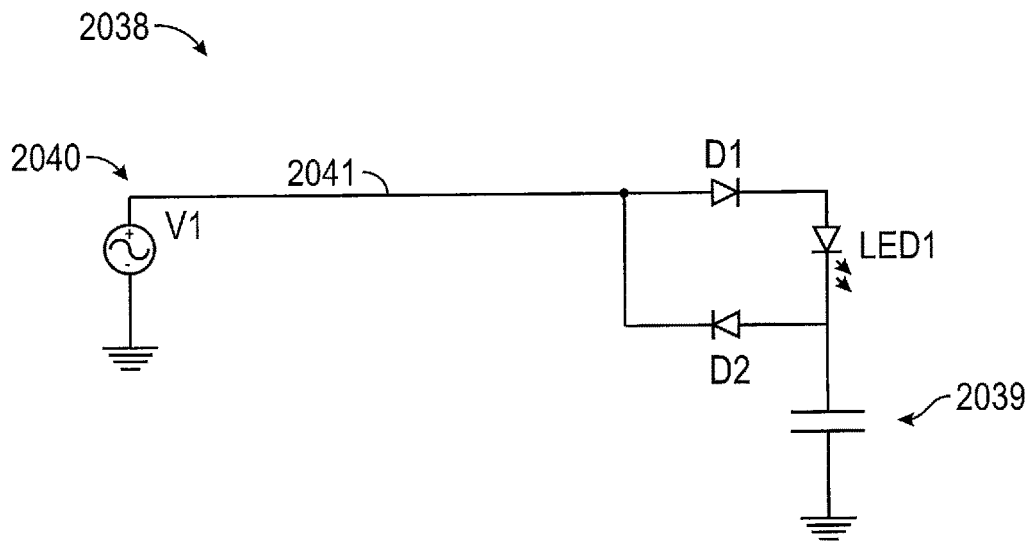
FIG. 49 shows a schematic view of a preferred embodiment of the invention.

FIG. 48 discloses a circuit 2038 according to the invention. In this embodiment, a generator 2040 produces an alternating electric field on transmission conductor 2040. The conductor 2041 is connected to a directional circuit 2042 having circuit elements causing an asymmetrical response to the alternating field and current flow. In particular, circuit 2042 includes three LEDs 1, 2, 3, configured to provide circulation according to the direction of the arrows (see FIG. 48). In this embodiment, all three LEDs 1-3 provide light as an output that can be considered as a load. This shows that relative nature of the positioning of elements in the various directional circuits disclosed herein according to the invention. If light is desired, then each of the diodes may be considered both loads and circuit elements which cause asymmetrical current flow. For example, FIG. 49 discloses the same circuit 2038 with only the substitution of LEDs 1 and 3 by diodes D1 and D2. In this circuit, optimization of the light emitted by LED 2 is of paramount concern, whereas the diodes 1, 2 provide directionality and a DC offset to the AC signal source as will be disclosed in more detail below. In preferred embodiments, the directional circuits, including directional circuit 2014, disclosed herein throughout this invention may be connected to ground through capacitance 2039 at a point within the directional circuit other than the AC signal input point 40 as shown in FIG. 49. This ground connection seems to provide increased circulation current, as it is noted that the LEDs get brighter for a given alternating electromagnetic source. The capacitor 2039 may alternatively be placed on the other side of the AC line 2041. The capacitor is used to drop the voltage from the AC source.

Figure 50:
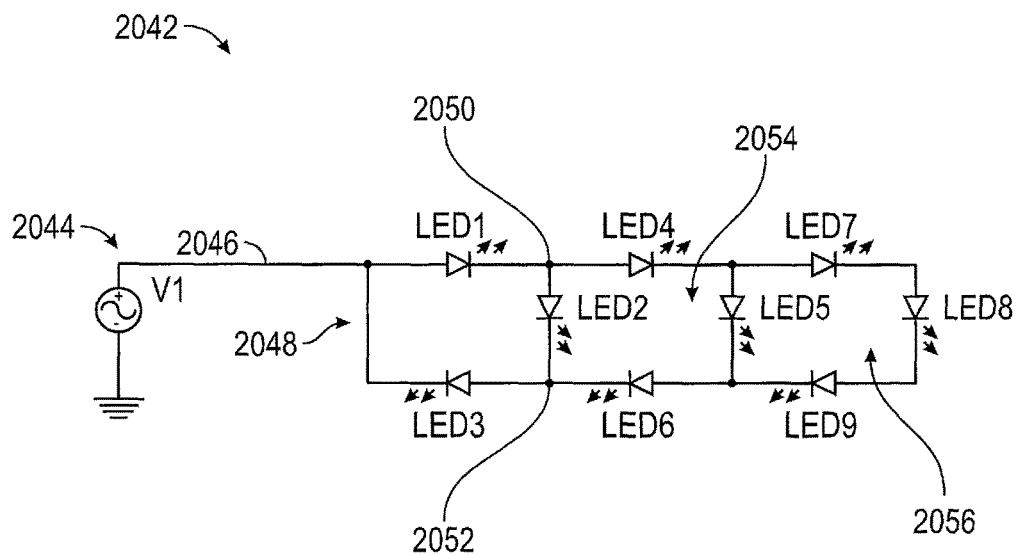
FIG. 50 shows a schematic view of a preferred embodiment of the invention.

FIG. 50 discloses a circuit 2042 having an AC signal generator 2044 inducing an alternating electric field onto transmission conductor 2046 which is connected to a first directional circuit 2048 having LEDs 1-3. LED 2 acting as a load to circuit 2048, provides the relatively high DC potential at point 2050 and a relatively lower DC potential at point 2052 to another directional circuit 2054 comprised of LEDs 4-6. This is repeated for another directional circuit 2056 and LEDs 7-9. Again, the circuit components LEDs 1-9 provide both directionality and useful work as a load in the form of producing light. According to another aspect of the invention, the circuit 2042 discloses the multiplexing possibilities of the directional circuits 2048, 2052, 2056. According to another aspect of the invention, the circuit 2042 discloses a parallel LED directional circuit.

Figure 51:
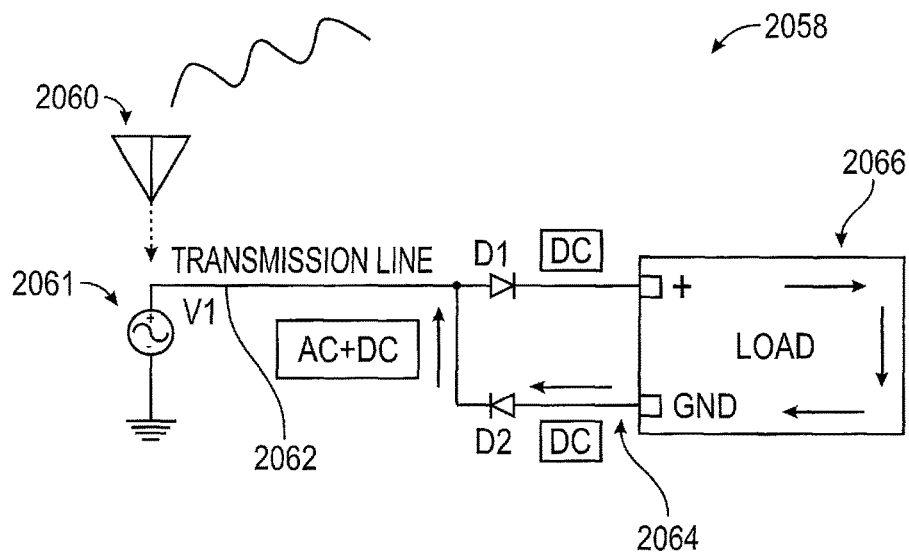
FIG. 51 shows a schematic view of a preferred embodiment of the invention.

FIG. 51 discloses a circuit 2058 to illustrate another aspect of the invention, in particular the transmission of information or data as one may use the terms. Accordingly, the alternating electric field is provided (as it could be with any embodiment disclosed herein) by either an antenna 2060 or a signal generator 2061. The alternating signal source is imposed on transmission conductor 2062. A directional circuit 2064 is comprised of a load 2066 and two diodes D1 and D2. The circuit 2058 discloses the directional DC current flow as well as an AC plus DC current flow and potential indicated by "AC+DC" in FIG. 51. This DC plus AC component is important to the transmission of information or data signals from the generators 2060, 2061.

Figure 52:
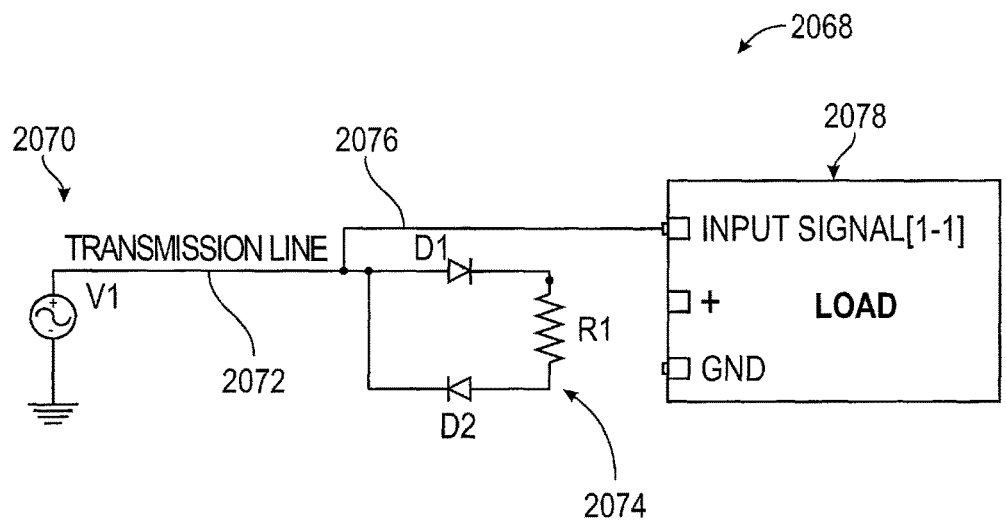
FIG. 52 shows a schematic view of a preferred embodiment of the invention.

In particular, FIG. 52 discloses a circuit 2068 having a signal generator 2070, a transmission conductor 2072, and a directional circuit 2074. The directional circuit has asymmetrical diode elements D1 and D2 and a load R1. In this and the other embodiment disclosed herein (see FIG. 51), the directional circuit 2074 is constructed to permit a DC voltage level to accrue on the transmission conductor 2072 along with the AC signal to provide an offset to the signal. This offset is preferential to the signal as the signal is ungrounded. It is believed that this may prevent noise in the system to be added to the line 2072 as a second alternating field but with reference to ground. Accordingly the noise adds to the DC level but not to the signal level in the same proportions.

Also as disclosed in FIG. 52, an output 2076 is provided which will transmit the AC signals from transmission line 2072 to an information or data signal receiver 2078 which will detect the signal riding the DC level. The DC level can easily be distinguished and handled by such a receiver as is conventional. It should be understood that the signal receiver 2078 may be of any conventional type of TTL logic device, modem, or telecommunications receiver and is believed to operate best with the preferred systems of the invention when it is not connected to earth ground or a battery ground, or a current sink or charge collector (as is the case for the working loads disclosed through out this disclosure).

Figure 53:
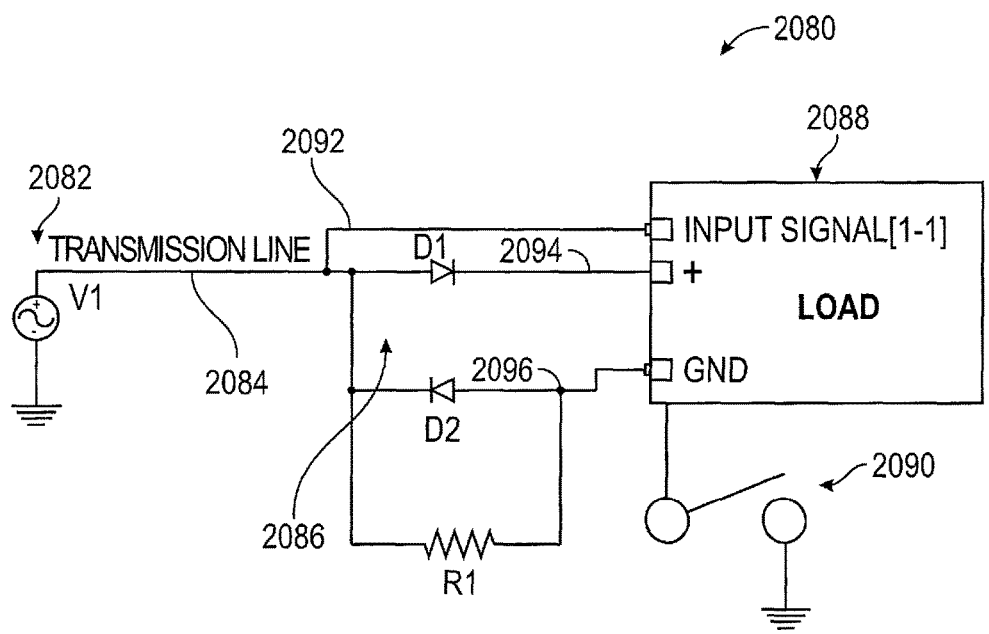
FIG. 53 shows a schematic view of a preferred embodiment of the invention.

According to another embodiment, FIG. 53 discloses another information or data communication circuit 2080. The circuit 2080 includes a signal generator 2082, a transmission conductor 2084, a directional circuit 2086, a data receiver 2088, and a ground switch 2090. In this embodiment, the directional circuit 2086 provides both the DC power for the receiver 2088, and a data signal through output 2092 connected between the receiver input and the common connection between the conductor 2084 and directional circuit input to anode of diode D1 and cathode D2. In the meantime, the receiver is powered on the DC potential difference between D1 the relatively more positive side 2094 and D2 the relatively less positive side 2096 of the directional circuit. In this embodiment, resistor R1 is provided according to another aspect of the invention to regulate or select as desired the level of DC offset the AC data signal will have at line 2092.

According to another aspect of the invention, the ground switch 2090 is provided to provide a non-continuous connection to a circuit, such as the ground circuit disclosed in FIG. 53, to dissipate excessive accumulations of charge or voltage potentials in the circuit 2080. It is contemplated that the switch 2090 be actuated based upon a timing (such as a pre-selected clock pulse) criteria, or by a sensor (not shown) of an undesirable DC level developing in the circuit 2080. Once engaged, the circuit 2090 would dissipate the excess energy to a ground, ground, plane, capacitor, battery ground, or the like.

Figure 54:
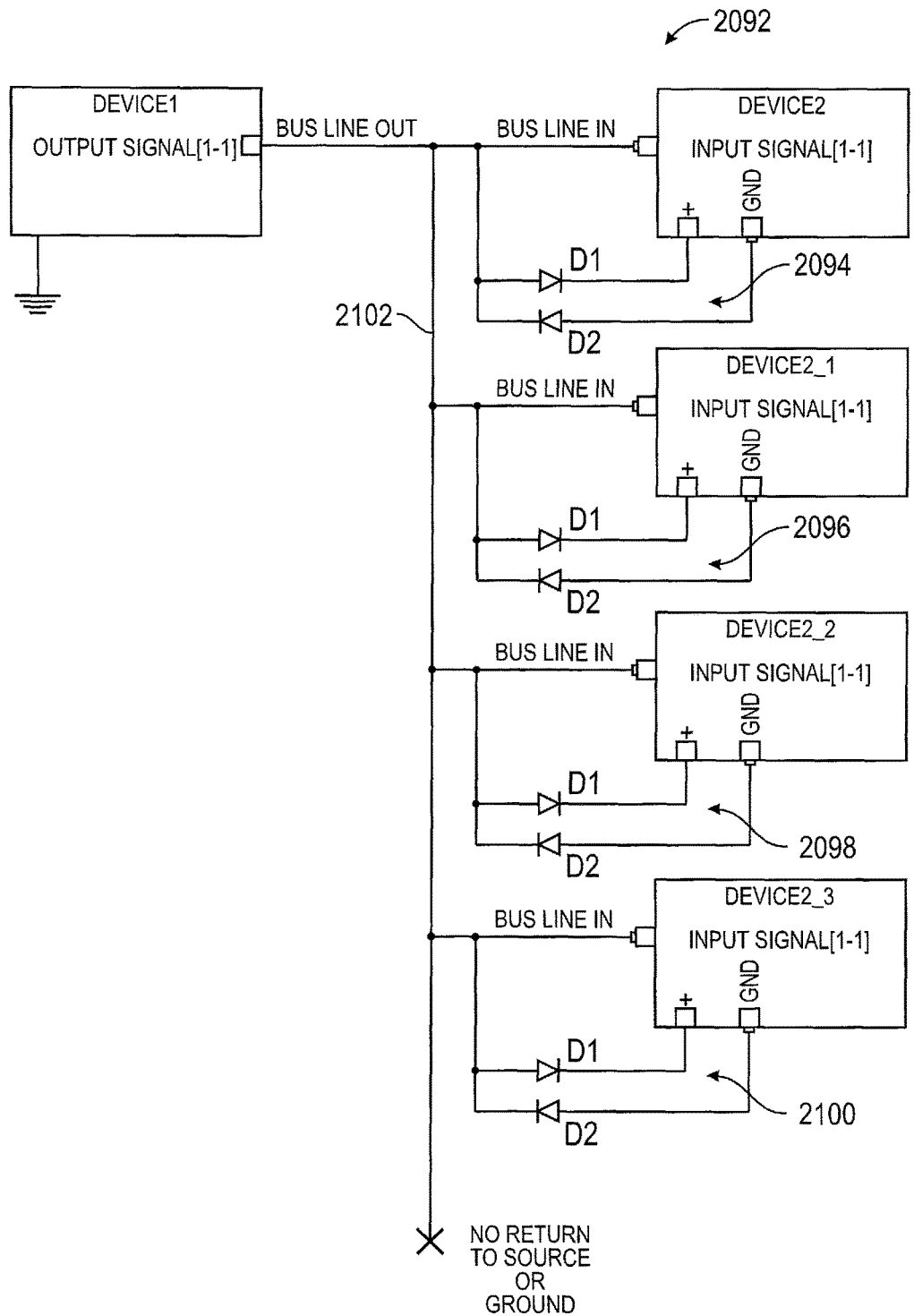
FIG. 54 shows a schematic view of a preferred embodiment of the invention.

FIG. 54 discloses a circuit 2092 wherein directional circuits 2094-2100 are connected through a common bus conductor 2102 to provide DC power and signals from generator 2104 as described previously herein.

Figure 55:
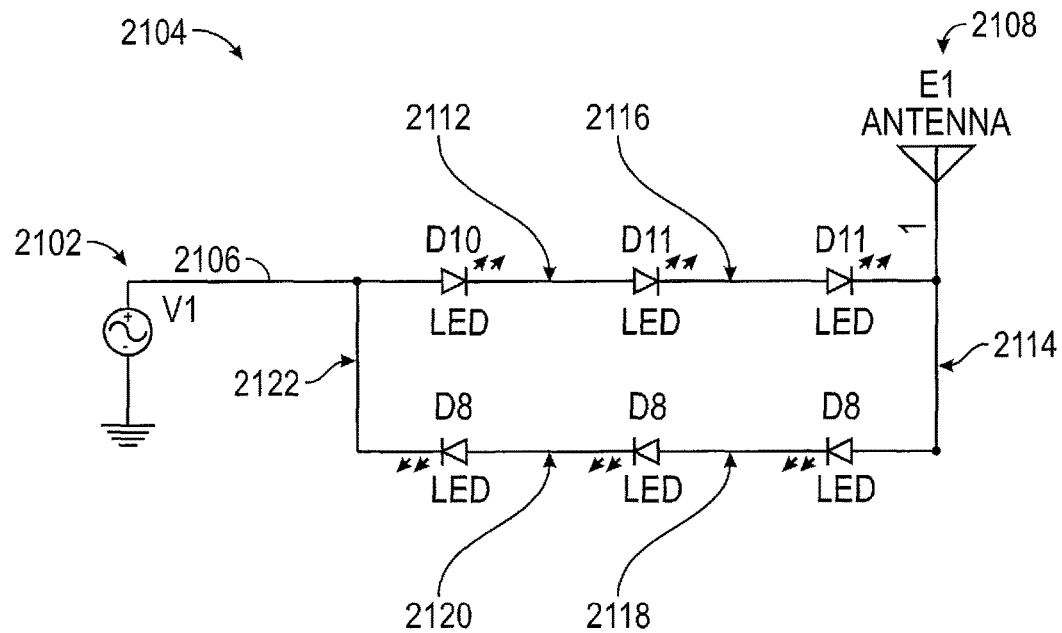
FIG. 55 shows a schematic view of a preferred embodiment of the invention.
Figure 56:
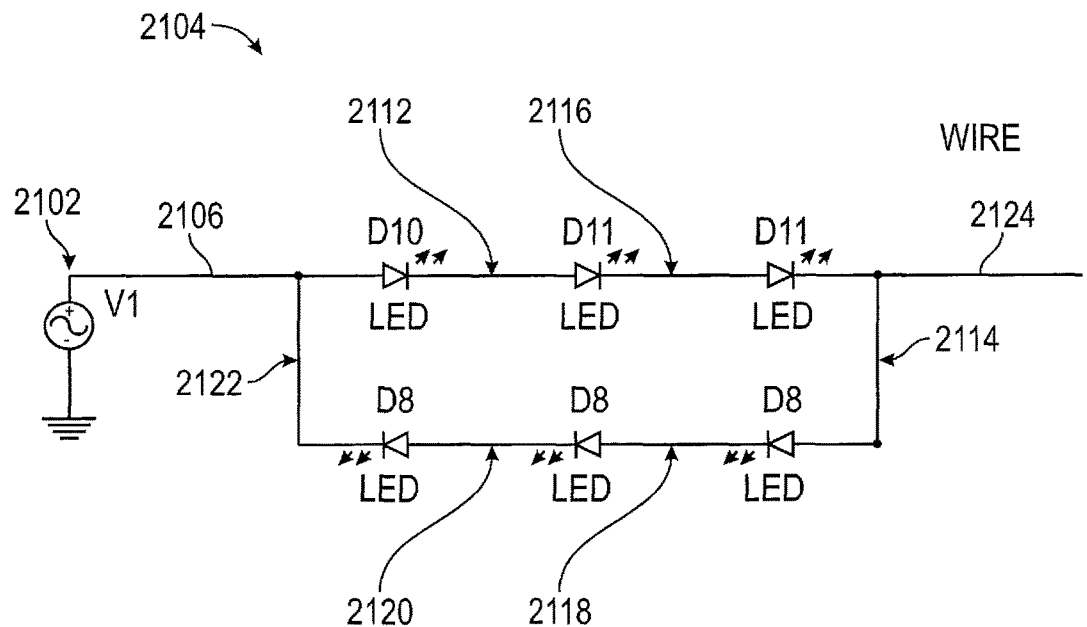
FIG. 56 shows a schematic view of a preferred embodiment of the invention.

FIGS. 55 and 56 disclose a circuit 2104 to illustrate another aspect of the invention. Accordingly, an alternating electric field is provided to a first transmission conductor by a signal generator 2102 and a second transmission conductor is provided by an antenna 2108 (see FIG. 55) or wire 2124 (see FIG. 56) that is connected to a relatively less positive side 2114-2122 within the directional circuit 2110. A difference in DC potential between a relatively more positive side 2112 within the directional circuit, and relatively less positive side 2114-2122 is provided. Another aspect of the invention is sensing proximity with impedance changes within the directional circuits described herein (as it could be with any embodiment disclosed herein) by approaching any of the directional circuits or transmission conductors (also any of which are described herein), for example approaching 2108 (shown in FIG. 55) and/or 2124 (as shown in FIG. 56) with a conductive substance such as a person, including the touch of a person (human touch), or metallic material thereby changing the circulation of current flow within the directional circuit by changes in impedance through the capacitance of the conductive substance.

Figure 57:
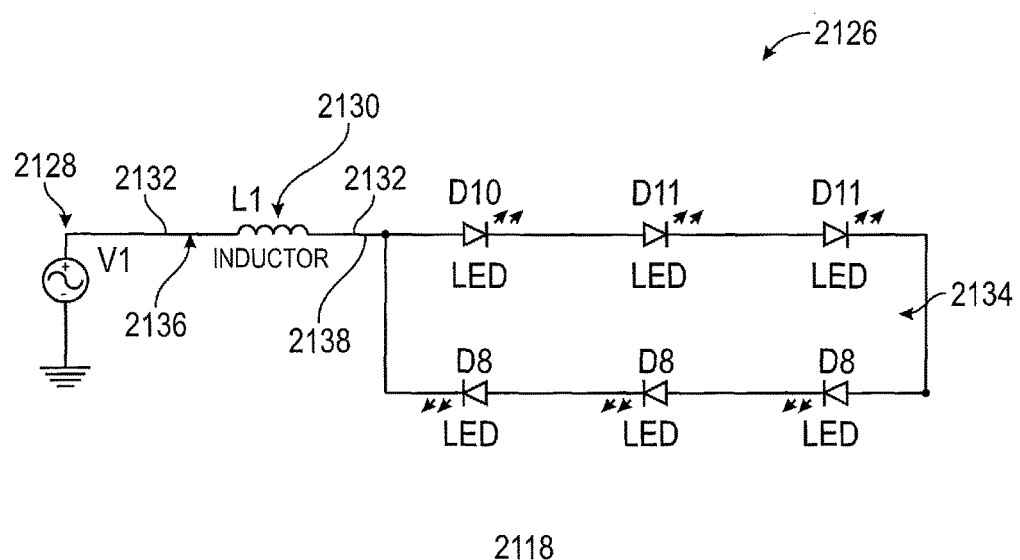
FIG. 57 shows a schematic view of a preferred embodiment of the invention.

FIG. 57 discloses a circuit 2126 to illustrate another aspect of the invention. Accordingly, an alternating electric field is provided to a transmission conductor 2132 by a signal generator 2128 that provides a first voltage level output equal to that provided by the signal generator 2128. A lump inductance 2130 is provided in series of the transmission conductor 2132 between the signal generator 2128 and directional circuit 2134. The lump inductance 2130 provides an increased voltage level from the relatively lower voltage on the transmission conductor 2132 at the point 2136 between the signal generator 2128 and lump inductance 2136 and a relatively higher voltage level on the transmission conductor 2132 at the point 2138 between the lump inductance 2130 and the directional circuit 2134 thereby providing an increase in current flow within the directional circuit 2134 or electromagnetic field energy radiating from the circuit 2126. The amount of current flow within the directional circuits described herein and electromagnetic field energy external of the directional circuits described herein is dependent on the frequency of an AC signal provided to the transmission conductor 2132 (or any of which are described herein). In preferred embodiments, the circuits disclosed in FIGS. 44-57 may be connected to ground through capacitance. This ground connection seems to provide increased circulation current, as it is noted that the LEDs get brighter for a given alternating electromagnetic source.

Figure 58:
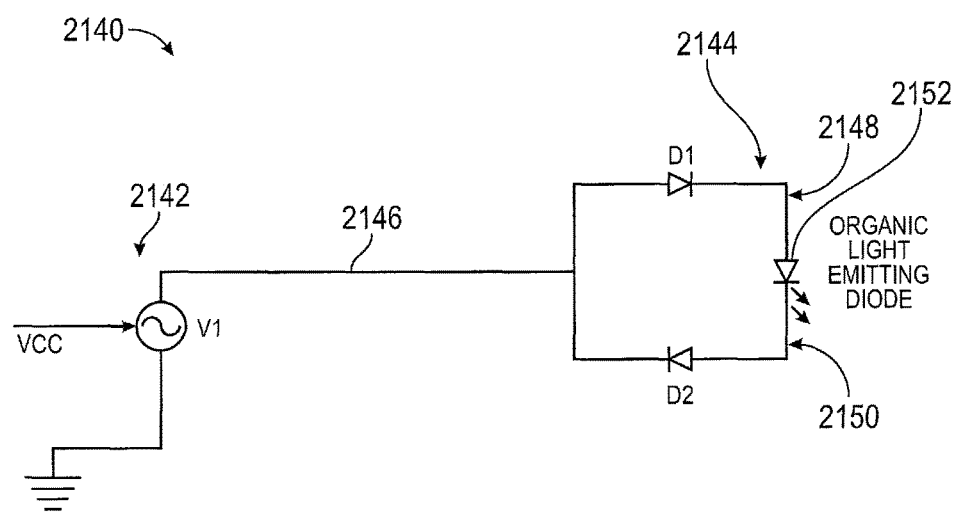
FIG. 58 shows a schematic view of a preferred embodiment of the invention.

FIG. 58 discloses a circuit 2140 according to the invention having a standard AC signal generator 2142 and a directional circuit 2144 that includes first and second diodes D1, D2, the first diode D1 has an anode and the second diode D2 has a cathode, which are commonly connected to the transmission conductor 2146 from the generator 2142. The cathode of diode D1 is connected to the relatively more positive side 2148 of an organic light emitting diode (OLED) 2152 while the anode of diode D2 is connected to the relatively less positive side 150 of the OLED 2152 to form the loop circuit 2144 among the diodes D1, D2 and the OLED 2152.

Figure 59:
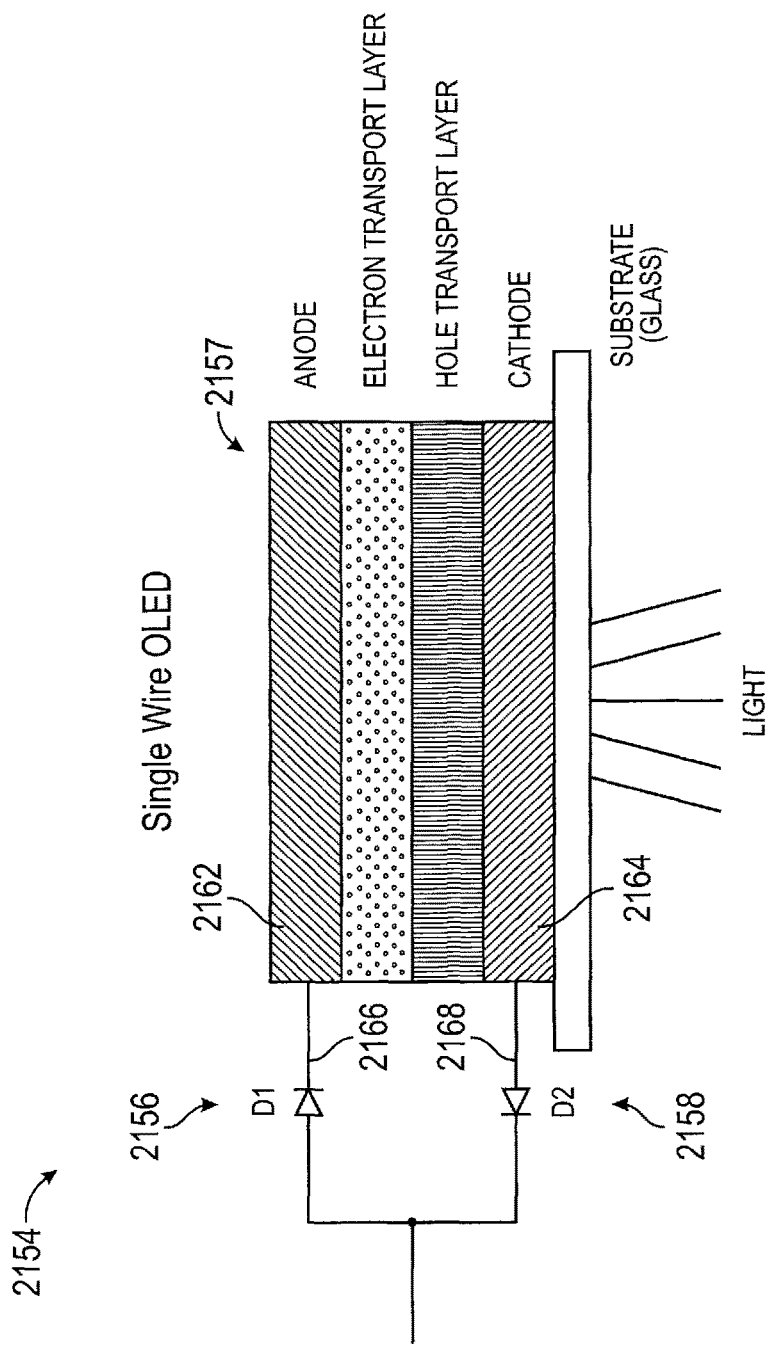
FIG. 59 shows a schematic view of a preferred embodiment of the invention.
Figure 61:
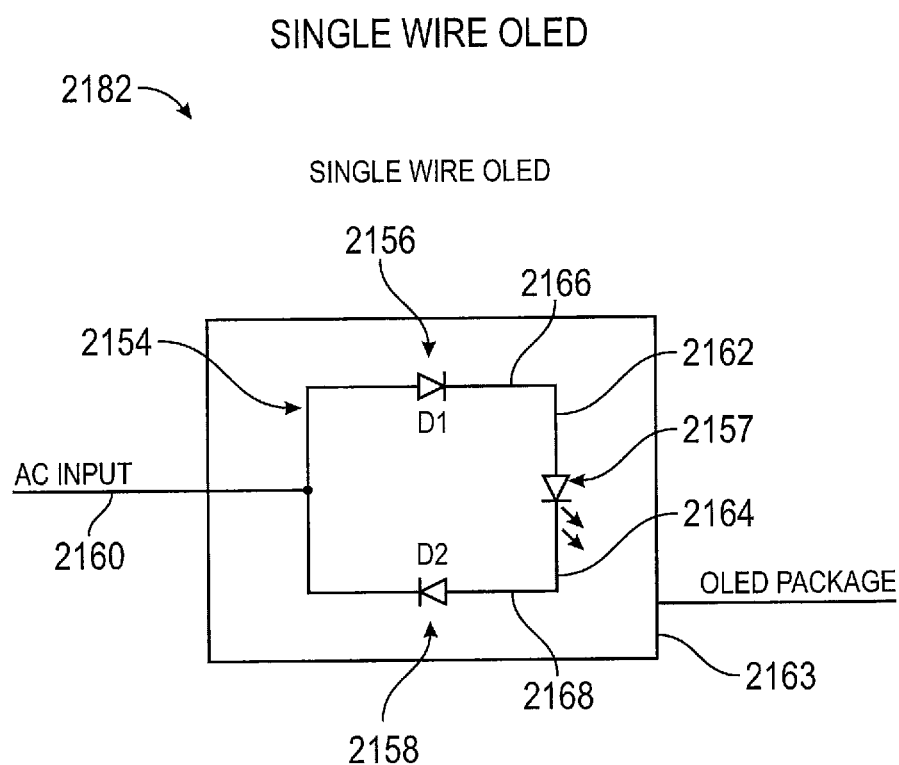
FIG. 61 shows a schematic view of a preferred embodiment of the invention.
Figure 62:
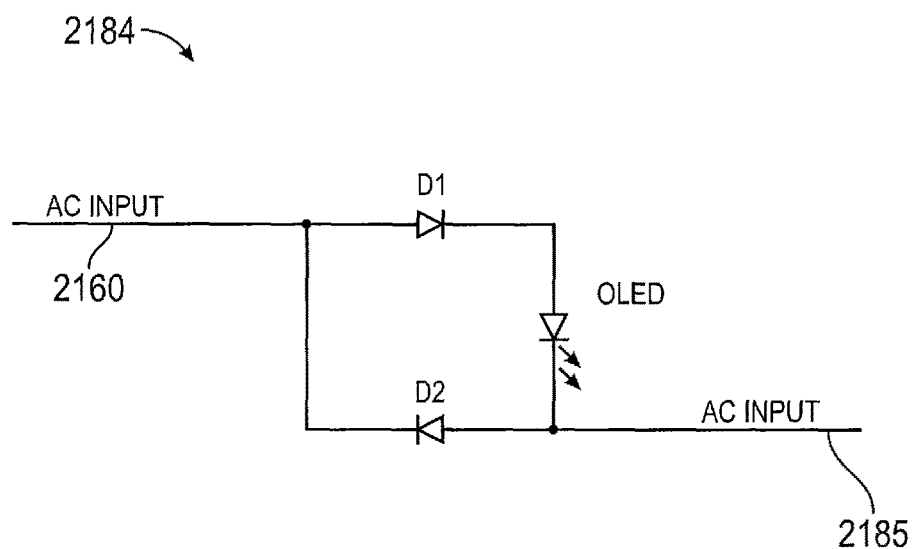
FIG. 62 shows a schematic view of a preferred embodiment of the invention.

FIGS. 59, and 61-62 disclose another embodiment of the invention having a directional organic light emitting diode ("OLED") circuit 2154 that includes a first diode D1 2156, a second diode D2 2158, and an OLED 2157. The first diode D12156 has an anode and the second diode D2 2158 has a cathode, which are commonly connected to an input transmission conductor 2160. The cathode of diode D1 2156 is connected to the relatively more positive side 2162 anode of an OLED 2157 while the anode of diode D2 2158 is connected to the relatively less positive side cathode 2164 of the OLED 2157 to form the loop circuit 2154 among the diodes D1, D2 and the OLED 2157. The directional OLED circuit 2154 is a loop circuit which includes one or more circuit elements (e.g. diodes or OLEDs 2156, 2157 and 2158) causing the loop circuit to be asymmetric to current flow. Circuit element 2157 is an OLED. The directional OLED circuit 2154 does not have a continuous conductive path to earth ground, or battery ground. The directional OLED circuit 2154 develops a DC potential in response to an alternating electric field imposed on input 2160. The directional OLED circuit 2154 is selfreferencing between a relatively high potential output and a relatively lower potential output. The directional OLED circuit 2154 has a resistance, inductance and capacitance that is responsive to the voltage and frequency of the alternating electric field. The directional OLED circuit 2154 has transmission conductors 2166, 2168 connected to the directional OLED circuit 2154.

Figure 60:
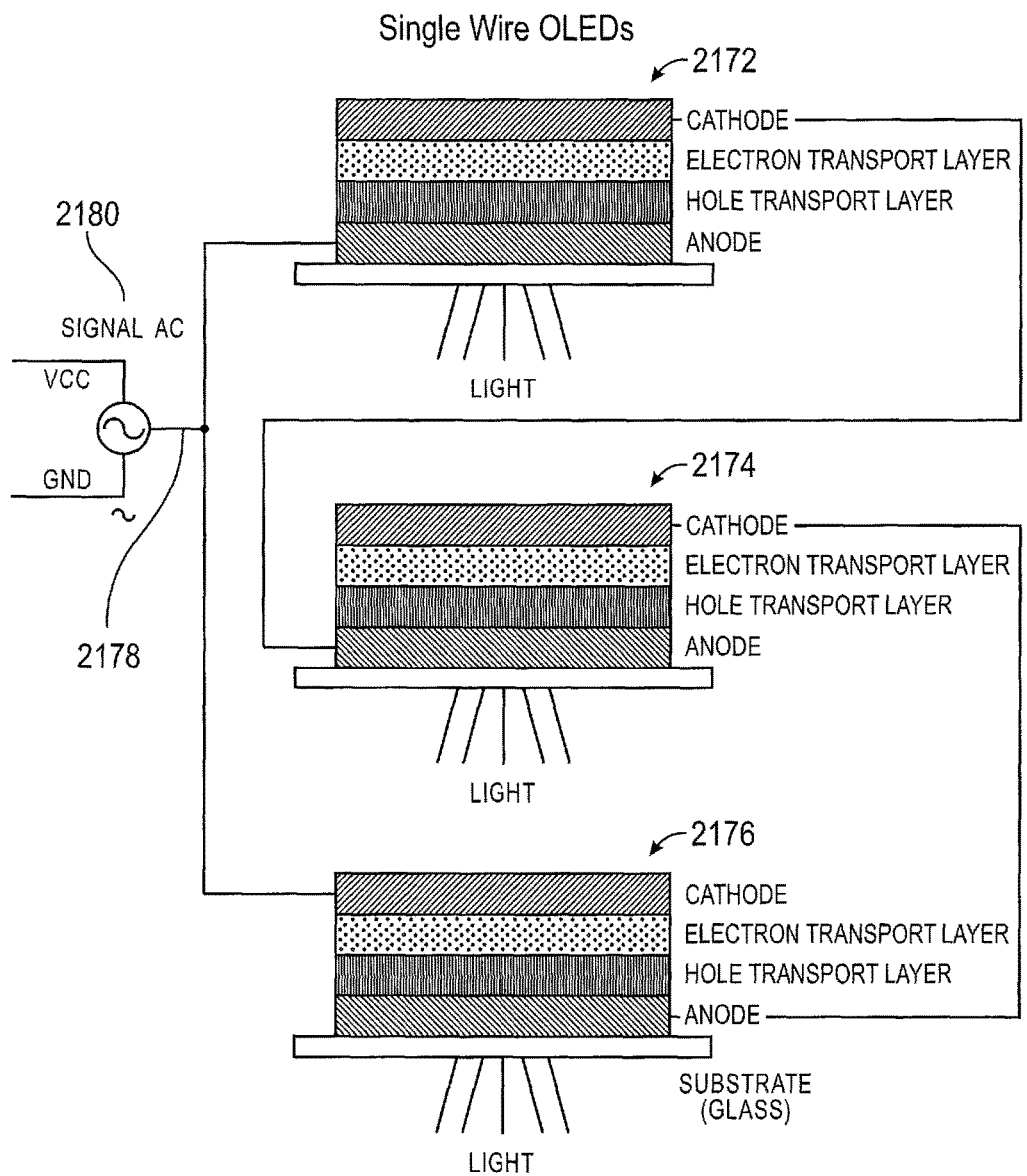
FIG. 60 shows a schematic view of a preferred embodiment of the invention.

FIG. 60 discloses another embodiment of the invention having a directional organic light emitting diode ("OLED") circuit 2170 that includes a first OLED 2172, a second OLED 2174, and a third OLED 2176. The first OLED 2172 has an anode and the third OLED 2176 has a cathode, which are commonly connected to an input transmission conductor 2178 having AC signal source from a signal generator 2180. The cathode of the first OLED 2172 is connected to the anode of the second OLED 2174 while the cathode of the second OLED 2174 is connected to the anode of the third OLED 2176 to form the loop circuit 2170 among the OLEDs 1, 2 and 3 (2172-2176). The directional OLED circuit 2170 can be designed with more than 3 OLEDs.

FIG. 61 discloses a circuit 2182 with the same embodiment of the invention shown in FIG. 59 (see FIG. 59) encasing the directional OLED circuit 2154 within a package 2163.

FIG. 62 discloses a circuit 2184 with the same embodiment of the invention shown in FIG. 59 (see FIG. 59) with a second transmission conductor 2185 providing an input within the directional circuit 2184 at a point other than the input of the first transmission conductor input of 2160. The transmission conductors 2160 and 2185 (or any transmission conductors described herein) can act as an antenna and cause the directional OLED circuit 2184 to react to the proximity of conductive substances near the transmission conductors 2160 and 2185. In preferred embodiments, the circuits disclosed in FIGS. 59-66 may be connected to ground through capacitance at a point within the directional circuit such as transmission conductor 2185 (e.g. FIG. 62). This ground connection seems to provide increased circulation current, as it is noted that the OLEDs get brighter for a given alternating electromagnetic source.

Figure 63:
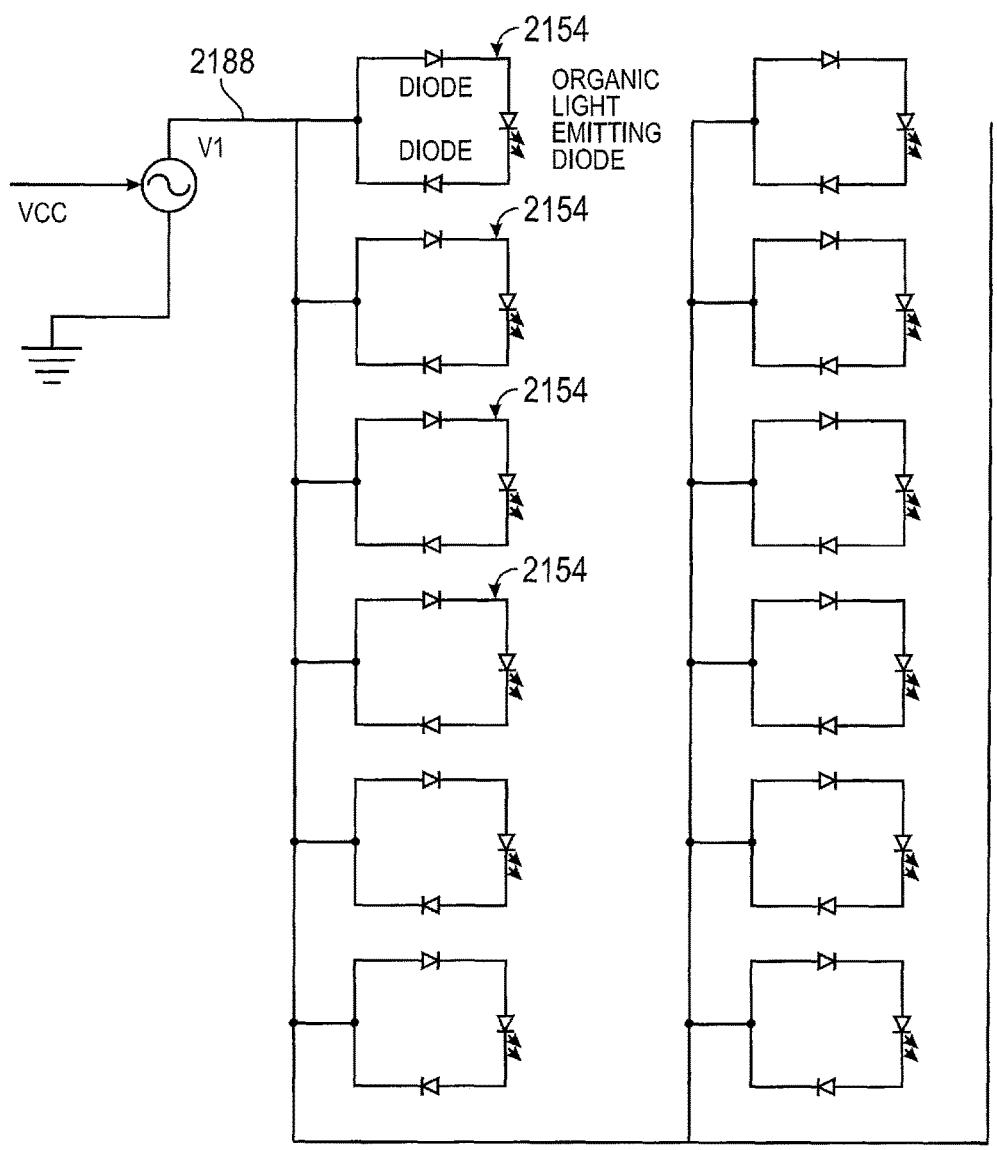
FIG. 63 shows a schematic view of a preferred embodiment of the invention.

FIG. 63 discloses a matrix circuit 2186 comprised of twelve circuits 2154 (e.g. FIG. 61). The circuits in the matrix 2186 are connected commonly to a transmission conductor 2188.

Figure 64:
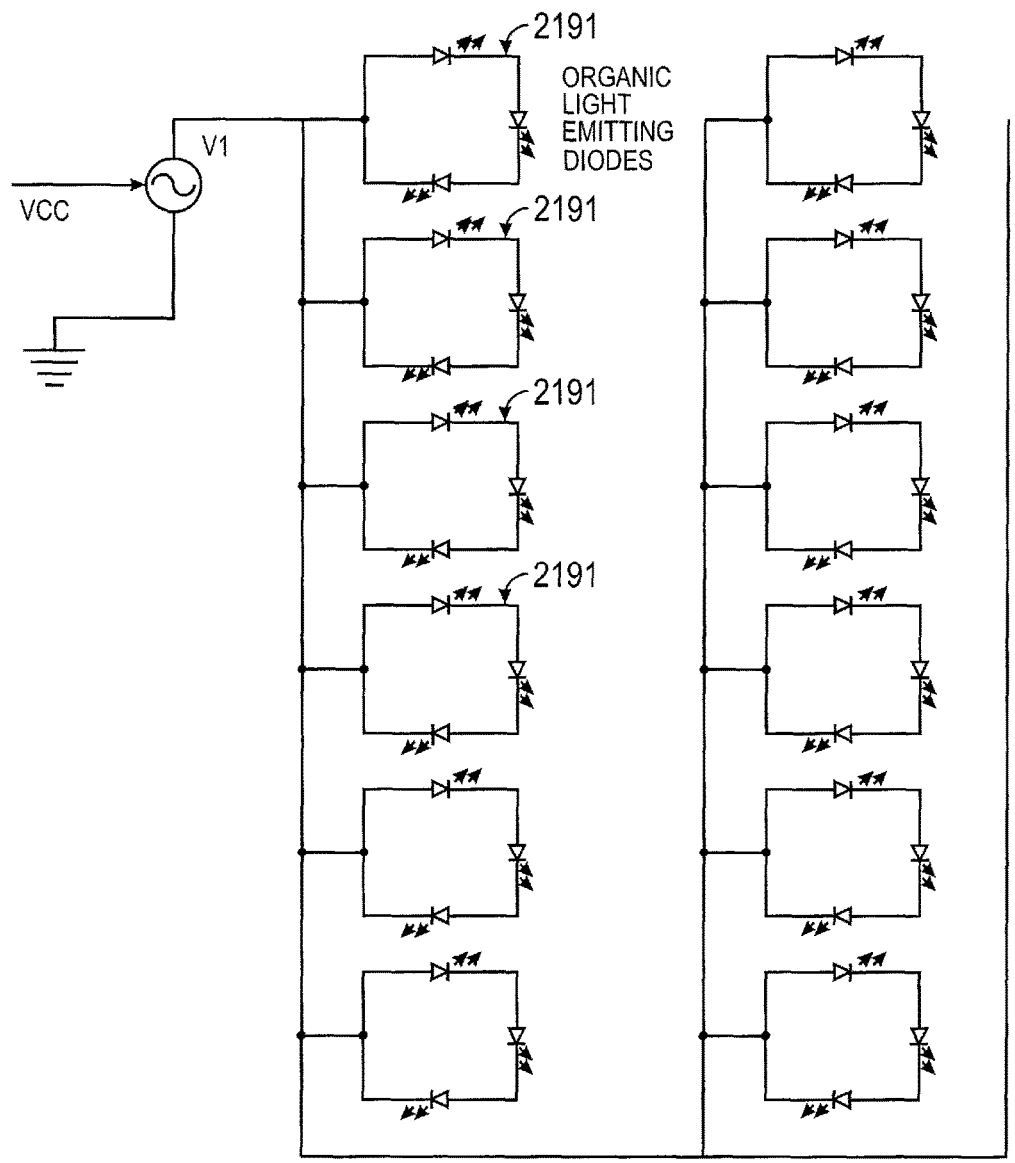
FIG. 64 shows a schematic view of a preferred embodiment of the invention.

FIG. 64 discloses a matrix circuit 2190 identical to matrix circuit 2186 but that the circuits 2191 employ only LEDs or optionally OLEDs.

Figure 65:
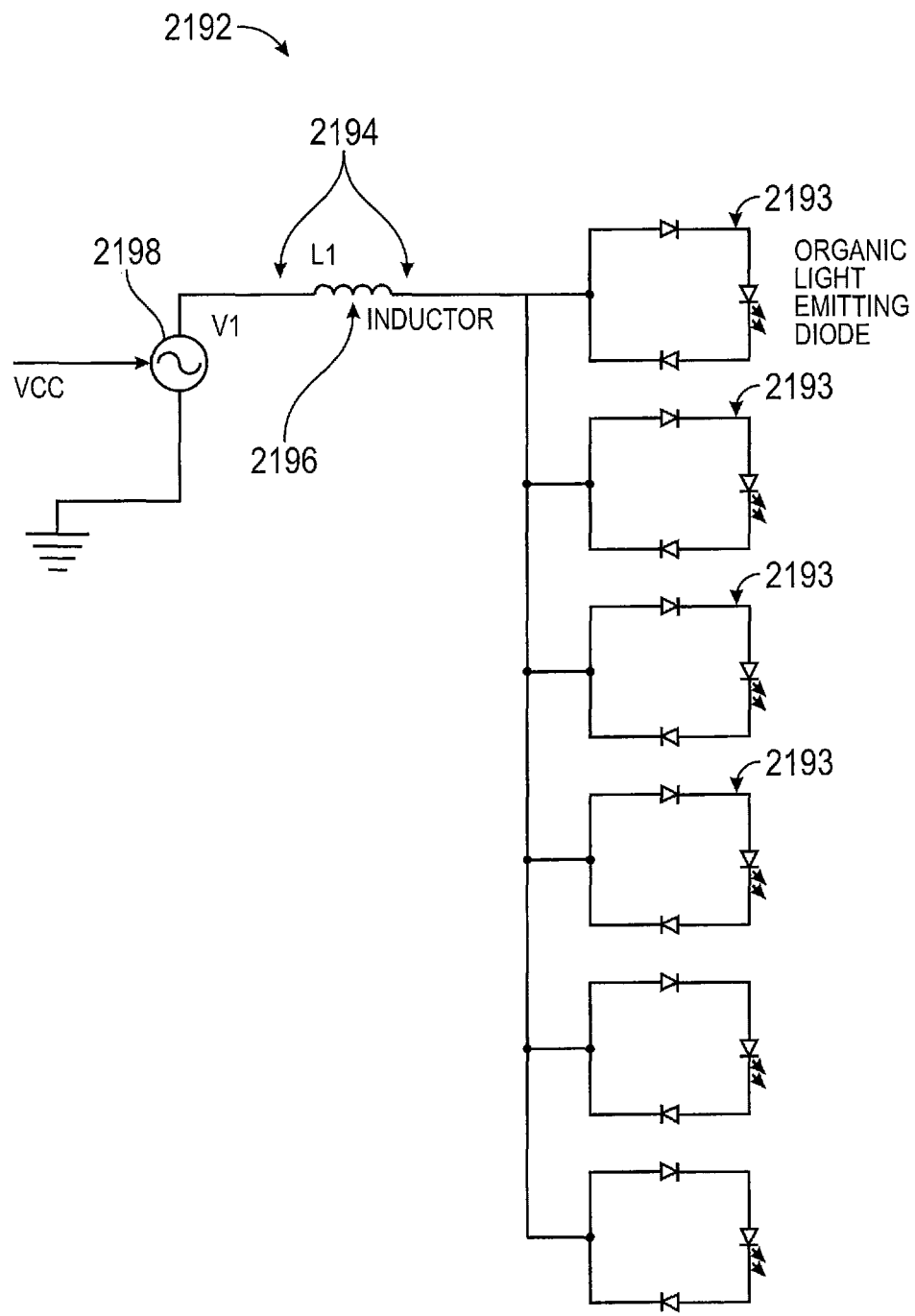
FIG. 65 shows a schematic view of a preferred embodiment of the invention.

FIG. 65 discloses a matrix circuit 2192 identical to matrix circuit 2186 but that the circuits 2193 in the matrix 2192 are connected commonly to one end of a lump inductance 2196 placed in series of the transmission conductor 2194 between the signal generator 2198 and the matrix circuit.

Figure 66:
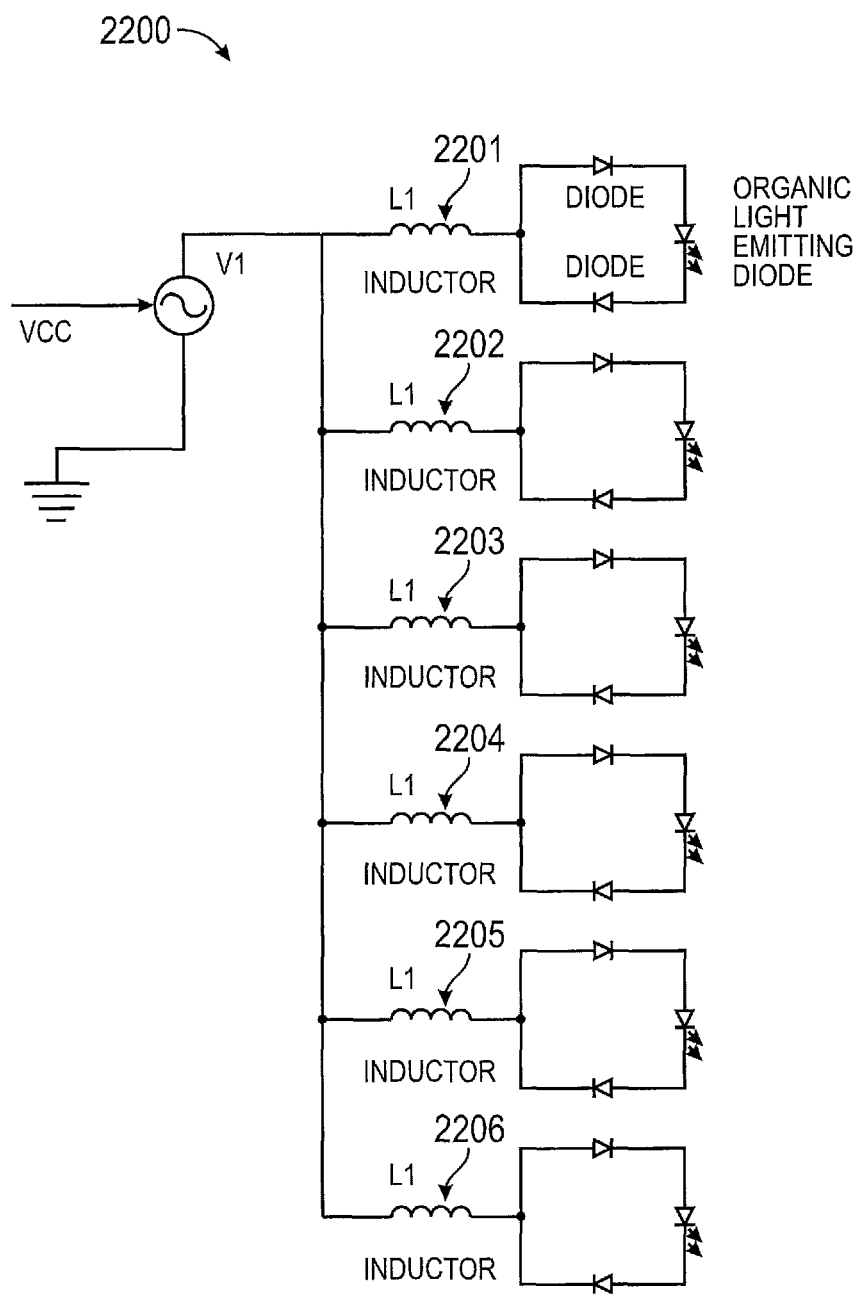
FIG. 66 shows a schematic view of a preferred embodiment of the invention.

FIG. 66 discloses a matrix circuit 2200 identical to matrix circuit 2192 but that the circuits in the matrix 2200 are connected to individual lump inductances 2201-2206 which can be of equal or different values.

Figure 67:
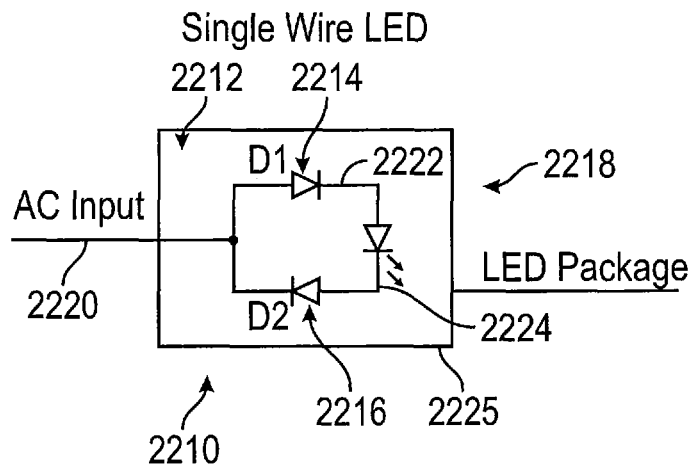
FIG. 67 shows a schematic view of a preferred embodiment of the invention.

FIG. 67 discloses a circuit 2210 having a directional light emitting diode ("LED") circuit 212 that includes a first diode D1 2214, a second diode D2 2216, and an LED 2218. The first diode D1 2214 has an anode and the second diode 2216 has a cathode, which are commonly connected to an input transmission conductor 2220. The cathode of diode D1 2214 is connected to the relatively more positive side 2222 anode of an LED 2218 while the anode of diode D2 2216 is connected to the relatively less positive side cathode 2224 of the LED 2218 to form the loop circuit 2212 among the diodes D1, D2, and the LED 2218. The directional LED circuit 2212 is a loop circuit which includes one or more circuit elements (e.g. diodes or LEDs 214, 2216 and 2218) causing the loop circuit to be asymmetric to current flow. The directional LED circuit 2212 is encased in a package 2225 and has no continuous conductive path to earth ground, or battery ground. The directional LED circuit 2212 develops a DC potential in response to an alternating electric field imposed on input 2220. The directional LED circuit 2212 is self referencing between a relatively high potential output and a relatively lower potential output. The directional LED circuit 2212 has a resistance, inductance and capacitance that is responsive to the voltage and frequency of the alternating electric field.

Figure 68:
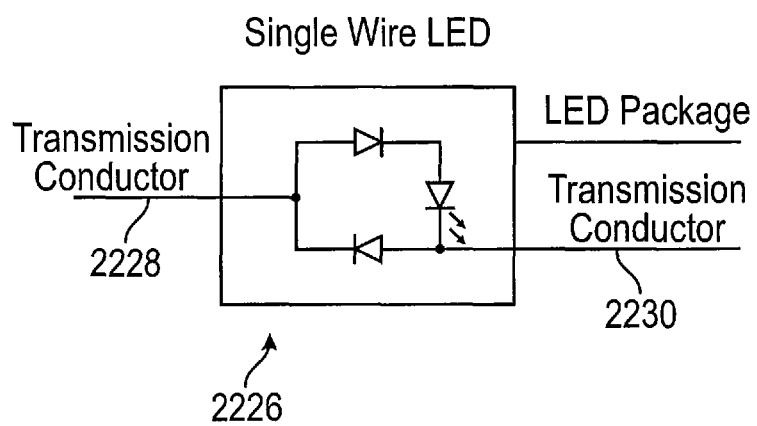
FIG. 68 shows a schematic view of a preferred embodiment of the invention.

FIG. 68 discloses a circuit 2226 identical to circuit 2210 but that the circuit has a first transmission conductor 2228 and a second transmission conductor 2230. Each transmission conductor 2228,2230 can be driven with an alternating electric field and can cause the circuit 2226 to react to the proximity of a conductive substance that approaches the transmission conductors 2228 and 2230 with only one or both conductors being driven.

FIG. 69 discloses a matrix circuit 2232 comprised of four circuits 2212 (e.g. FIG. 67). The circuits in the matrix 2232 are connected commonly to the input 2236.

FIG. 70 discloses a circuit 2240 identical to circuit 2210 but that the circuit has a more than one LEDs 2218 forming a directional circuit within a single package 2225.

Figure 71:
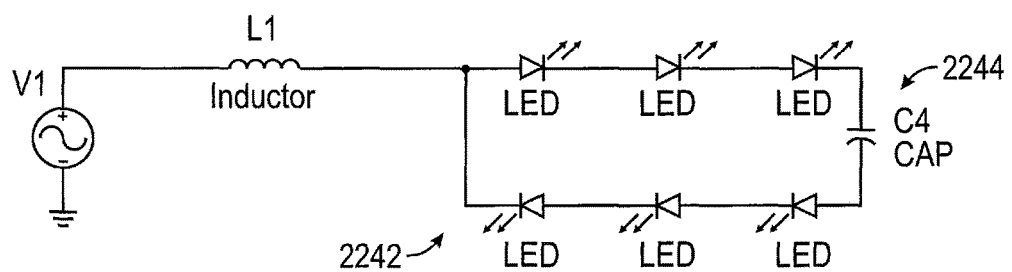
FIG. 71 shows a schematic view of a preferred embodiment of the invention.

FIG. 71 discloses a circuit 2242 identical to circuit 126 (e.g. FIG. 57) but that the circuit has a capacitance added in series within the directional circuit thereby adding to the inherent capacitance of the directional circuit. Another aspect of the invention is to have the added capacitance 2244 adjustable so that the directional circuit 2242 is tuned to resonance by adjusting the capacitance 2244.

Figure 72:
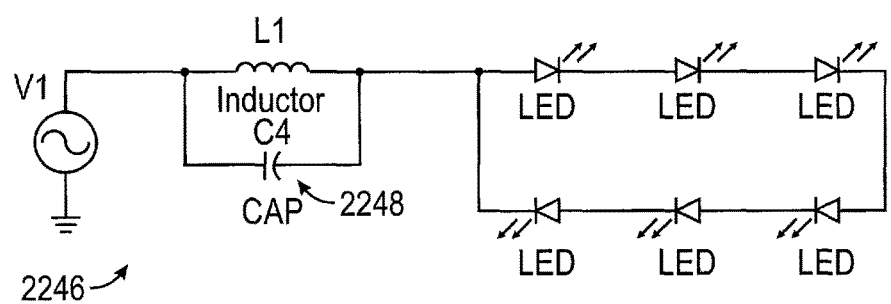
FIG. 72 shows a schematic view of a preferred embodiment of the invention.

FIG. 72 discloses a circuit 2246 identical to circuit 2126 (e.g. FIG. 57) but that the circuit has a capacitance 2248 added in parallel to the inductor 2130 thereby adding to the inherent capacitance of the transmission conductor and inductor 2130. Another aspect of the invention is to have the added capacitance 2248 adjustable so that the directional circuit 2242 is tuned to resonance by adjusting the capacitance 2244.

Figure 73:
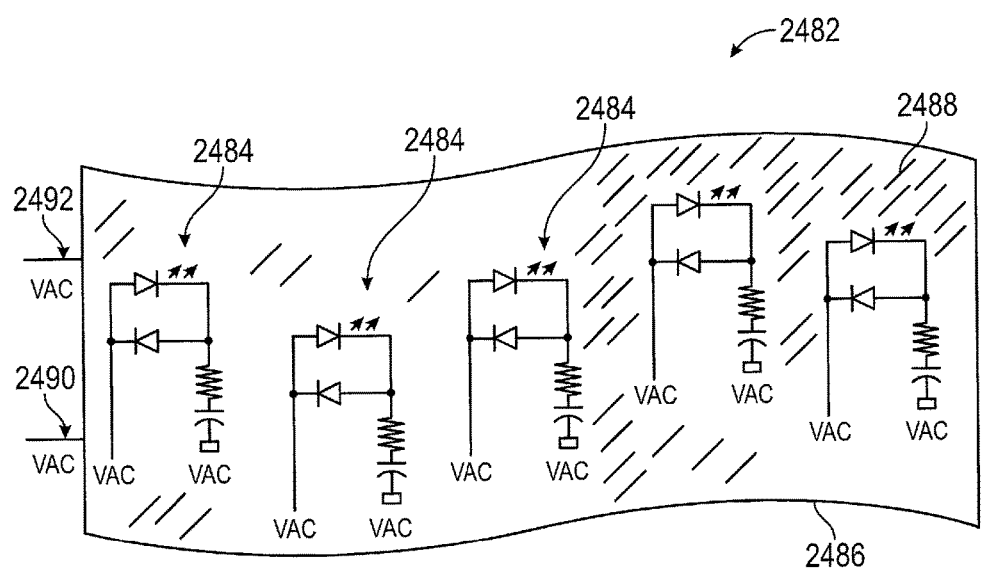
FIG. 73 shows a schematic view of a preferred embodiment of the invention.

FIG. 73 shows a device 2482 comprising individual light emitting diode circuits 2484 on a flexible printed circuit board having a mirror like reflective material or coating 2488 designed into or on the flexible printed circuit board in an area at least near the light emitting diodes for providing more efficient light output from the circuit board areas surrounding the light emitting diodes by having the flexible printed circuit board reflect light rather than absorb it. Power connection points 2490 and 2492 are provided to the board.

Figure 74:
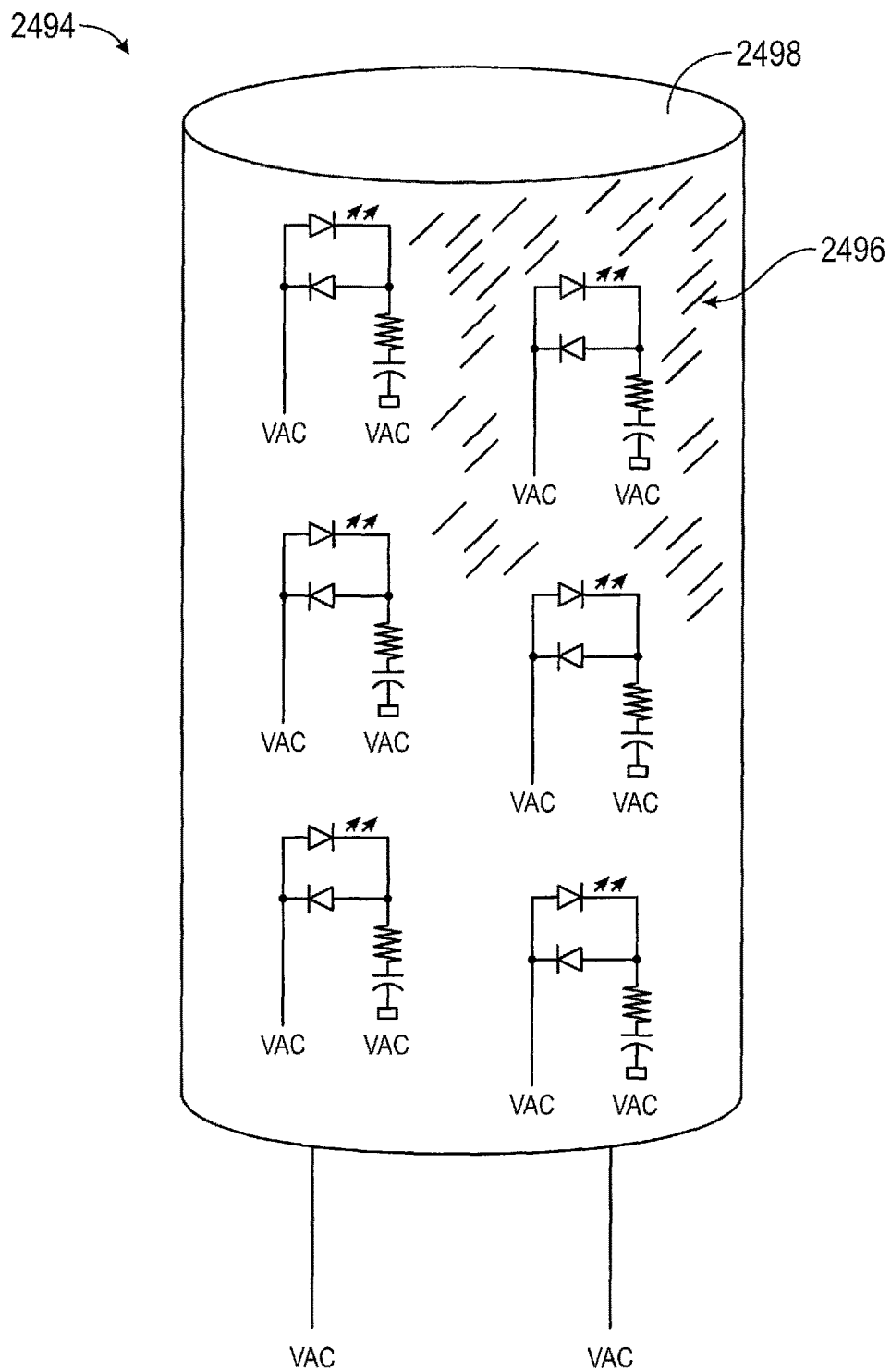
FIG. 74 shows a schematic view of a preferred embodiment of the invention.

FIG. 74 shows a device 2494 comprising a device 2496 identical to the device shown in FIG. 73 adhered to a device 2498 having a cylindrical shape for providing improved uniformity and increased angle of light output from device 2496.

A circuit includes a first source for providing an alternating electric field, a directional circuit is connected to the first source for providing an alternating electric field by a transmission conductor there being no conductive DC path is provided back from the directional circuit to the first source for providing an alternating electric field. The directional circuit being a loop circuit which includes one or more circuit elements causing the loop circuit to be asymmetric to current flow; the directional circuit having no continuous conductive path to earth ground, or battery ground, the directional circuit thereby developing a DC potential in response to the alternating electric field which is self referencing between a relatively high potential output and a relatively lower potential output. One or more loads connected to the directional circuit, the one or more loads also not having a continuous conductive path to earth ground or a battery ground. The load is not provided with a continuous connection to earth ground, or battery ground. The load may be provided with a capacitive connection to earth ground, or battery ground. The DC current flow within the directional circuit is adjustable by tuning the directional circuit to different frequencies of an alternating electric field thereby causing the directional circuit to reach a resonant state. The current flow increases within the directional circuit and the electromagnetic field is concentrated within the directional circuit when the directional circuit is tuned to a resonant frequency. The directional circuit being tuned out of its resonant frequency and providing a larger electromagnetic field surrounding the exterior of the directional circuit enables the directional circuit to be responsive to the proximity of objects having a capacitance that enter the electromagnetic field. The directional circuit is tuned towards resonance as conductive objects enter the electromagnetic field of the directional circuit.

The above-described embodiments of the present invention are intended to be examples only. Alterations, modifications and variations may be effected to the particular embodiments by those of ordinary skill in the art without departing from the scope of the invention, which is defined by the claims appended hereto.

What is claimed is:

1. An apparatus comprising:
   an LED circuit comprising at least one LED;
   a data receiver, wherein the data receiver is configured to receive data from an antenna;
   an adjustable capacitor coupled to the antenna, wherein the adjustable capacitor is configured to tune the antenna; and
   a transmission conductor configured to wirelessly receive an alternating electromagnetic field that is used to provide power to charge the apparatus;
   wherein the apparatus is portable.

2. The apparatus of claim 1, wherein the apparatus is configured for use in telecommunications.

3. An apparatus comprising:
   an LED circuit comprising a plurality of LEDs;
   a data receiver, wherein the data receiver is configured to receive data from an antenna;
   a circuit configured to detect touch via capacitive sensing, the touch being of a person; and
   a lens doped with particles configured to receive and transmit light from the plurality of LEDs;
   wherein the apparatus is portable.

4. The apparatus of claim 3, wherein the particles change a color of the light from the plurality of LEDs.

5. The apparatus of claim 3, wherein the apparatus is configured for use in telecommunications.

6. The apparatus of claim 5, wherein the apparatus is a signal output device.

7. An apparatus comprising:
   an LED circuit comprising a plurality of LEDs;
   a data receiver, wherein the data receiver is configured to receive data from an antenna;
   a first circuit comprising at least one diode coupled to the antenna;
   a second circuit configured to detect touch via capacitive sensing, the touch being of a person; and
   a lens doped with particles configured to receive and transmit light from the plurality of LEDs; and
   wherein the apparatus is portable.

8. The apparatus of claim 7 further comprising:
   an adjustable capacitor coupled to the antenna, wherein the adjustable capacitor is configured to tune the antenna.

9. An apparatus comprising:
   an LED circuit comprising at least one LED;
   a data receiver, wherein the data receiver is configured to receive data from an antenna;
   a first transmission conductor configured to wirelessly receive an alternating electromagnetic field that is used to provide power to charge the apparatus;
   a second transmission conductor configured to receive the power from a power source that comprises a transformer, wherein the power source is configured to receive a first AC voltage from an AC mains and to output a relatively constant DC voltage; and a circuit configured to sense whether the power is provided by the first transmission conductor or the power source; and wherein the apparatus is portable.

10. The apparatus of claim 9, wherein the circuit is further configured to switch between the first transmission conductor and the power source.

11. An apparatus comprising:

an LED circuit having at least one LED;

a battery;

a data receiver, wherein the data receiver is configured to receive data signals from an antenna;

a first circuit, wherein the first circuit is configured to receive DC power and data signals from a transmission conductor; and a second circuit, wherein the second circuit has at least one transmission conductor and an inductor, and wherein the second circuit is configured to receive power wirelessly; and wherein the apparatus is portable.

12. The apparatus of claim 11 wherein the second circuit further comprises:

a capacitor coupled to the inductor.

13. The apparatus of claim 12, wherein the inductor and the capacitor are configured to tune the second circuit.

14. The apparatus of claim 11, wherein the at least one LED includes at least one organic light emitting diode.

15. The apparatus of claim 11 further comprising:

a switch.

16. The apparatus of claim 15, wherein the switch is a three-way switch.

* * * * *